(12) United States Patent
Yu et al.

(10) Patent No.: US 12,495,578 B2
(45) Date of Patent: Dec. 9, 2025

(54) SEMICONDUCTOR DEVICES INCLUDING SOURCE/DRAIN LAYERS AND METHODS OF MANUFACTURING THE SAME

(71) Applicant: SAMSUNG ELECTRONICS CO., LTD., Suwon-si (KR)

(72) Inventors: Haejun Yu, Osan-si (KR); Kyungin Choi, Seoul (KR); Sungmin Kim, Incheon (KR); Seunghun Lee, Hwaseong-si (KR); Jinbum Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 681 days.

(21) Appl. No.: 17/656,023

(22) Filed: Mar. 23, 2022

(65) Prior Publication Data

US 2023/0006052 A1   Jan. 5, 2023

(30) Foreign Application Priority Data

Jun. 30, 2021 (KR) .................. 10-2021-0085552

(51) Int. Cl.
*H10D 30/67* (2025.01)
*H10D 62/10* (2025.01)
(Continued)

(52) U.S. Cl.
CPC ..... *H10D 30/6735* (2025.01); *H10D 30/6757* (2025.01); *H10D 62/118* (2025.01); *H10D 64/258* (2025.01); *H10D 84/85* (2025.01)

(58) Field of Classification Search
CPC ............ H01L 29/42392; H01L 27/092; H01L 29/41775; H01L 29/78696; H01L 29/6653;
(Continued)

(56) References Cited

U.S. PATENT DOCUMENTS 10,319,721 B2   6/2019   Seo
10,490,650 B2   11/2019  Lin et al.
(Continued)

FOREIGN PATENT DOCUMENTS

KR   10-2020-0000784 A   1/2020

OTHER PUBLICATIONS

Korean Office Action dated May 31, 2025, in connection with Korean Application No. 10-2021-0085552, with English translation thereof.

*Primary Examiner* — Chad M Dicke
*Assistant Examiner* — Jeremy Daniel Watts
(74) *Attorney, Agent, or Firm* — Wolf, Greenfield & Sacks, P.C.

(57) ABSTRACT

A semiconductor device includes first and second channels, first and second gate structures, first and second source/drain layers, first and second fin spacers, and first and second etch stop patterns. The first channels are disposed vertically on a first region of a substrate. The second channels are disposed vertically on a second region of the substrate. The first gate structure is formed on the first region and covers the first channels. The second gate structure is formed on the second region and covers the second channels. The first and second source/drain layers contact the first and second channels, respectively. The first and second fin spacers contact sidewalls and upper surfaces of the first and second source/drain layers, respectively. The first and second etch stop patterns are formed on the first and second fin spacers, respectively, and do not contact the first and second source/drain layers, respectively.

10 Claims, 62 Drawing Sheets

(51) Int. Cl.
*H10D 64/23* (2025.01)
*H10D 84/85* (2025.01)

(58) Field of Classification Search
CPC .............. H01L 29/165; H01L 29/6656; H01L 21/823814; H01L 29/0673; H01L 29/0847; H01L 29/0843; H01L 29/66545
See application file for complete search history.

(56) References Cited

U.S. PATENT DOCUMENTS

| | | | |
|---|---|---|---|
| 10,825,915 B2 | 11/2020 | Lee et al. | |
| 10,903,315 B2 | 1/2021 | Loubet et al. | |
| 10,923,598 B2 | 2/2021 | Wang et al. | |
| 11,038,018 B2 | 6/2021 | Jeong et al. | |
| 11,107,902 B2 | 8/2021 | Chen et al. | |
| 11,367,722 B2 * | 6/2022 | Lilak | H10D 84/0177 |
| 2015/0069473 A1 * | 3/2015 | Glass | H10D 30/6219 |
| | | | 257/288 |
| 2017/0317213 A1 * | 11/2017 | Park | H01L 21/0217 |
| 2019/0051565 A1 | 2/2019 | Baars et al. | |
| 2020/0111784 A1 | 4/2020 | Lee et al. | |
| 2020/0365690 A1 * | 11/2020 | Jeong | H10D 84/834 |
| 2021/0082925 A1 | 3/2021 | Chang et al. | |
| 2021/0098605 A1 | 4/2021 | Wang et al. | |
| 2024/0332387 A1 * | 10/2024 | Chiang | H10D 84/0188 |

* cited by examiner

SEMICONDUCTOR DEVICES INCLUDING SOURCE/DRAIN LAYERS AND METHODS OF MANUFACTURING THE SAME

CROSS-REFERENCE TO RELATED APPLICATION

This application claims priority under 35 USC § 119 to Korean Patent Application No. 10-2021-0085552, filed on Jun. 30, 2021 in the Korean Intellectual Property Office (KIPO), the contents of which are herein incorporated by reference in their entirety.

TECHNICAL FIELD

The present disclosure relates to semiconductor devices and, more specifically, to semiconductor devices including source/drain layers and methods of manufacturing the same.

DISCUSSION OF THE RELATED ART

As the degree of integration of semiconductor devices increase, the distance between adjacent elements within the semiconductor devices decrease. During the fabrication of semiconductor devices, an etching process may be performed. A spacer structure may be used during the etching process. An increased degree of integration of semiconductor devices may also lead to a more complex spacer structure. When the spacer structure used in performing the etching process has a complex structure including a plurality of layers, the thickness of the spacer structure may increase, and thus the etching process might not be performed well. Accordingly, elements of the semiconductor devices might not have desired shapes and sizes.

SUMMARY

A semiconductor device includes first channels, second channels, a first gate structure, a second gate structure, a first source/drain layer, a second source/drain layer, a first fin spacer, a second fin spacer, a first etch stop pattern, and a second etch stop pattern. The first channels are formed on a first region of a substrate including the first region and a second region. The first channels are spaced apart from each other in a vertical direction substantially perpendicular to an upper surface of the substrate. The second channels are spaced apart from each other in the vertical direction on the second region of the substrate. The first gate structure is formed on the first region of the substrate, and covers at least a portion of a surface of each of the first channels. The second gate structure is formed on the second region of the substrate, and covers at least a portion of a surface of each of the second channels. The first source/drain layer is formed on a portion of the first region of the substrate adjacent to the first gate structure, and contacts the first channels. The second source/drain layer is formed on a portion of the second region of the substrate adjacent to the second gate structure, and contacts the second channels. The first fin spacer contacts a sidewall and an upper surface of the first source/drain layer. The second fin spacer contacts a sidewall and an upper surface of the second source/drain layer. The first etch stop pattern is formed on the first fin spacer, and does not contact the first source/drain layer. The second etch stop pattern is formed on the second fin spacer, and does not contact the second source/drain layer.

A semiconductor device includes first channels, second channels, a first gate structure, a second gate structure, a first source/drain layer, a second source/drain layer, a first fin spacer, a second fin spacer, a first capping layer, a second capping layer, a first etch stop pattern, and a second etch stop pattern. The first channels are formed on a first region of a substrate including the first region and a second region. The first channels are spaced apart from each other in a vertical direction substantially perpendicular to an upper surface of the substrate. The second channels are spaced apart from each other in the vertical direction on the second region of the substrate. The first gate structure is formed on the first region of the substrate, and covers at least a portion of a surface of each of the first channels. The second gate structure is formed on the second region of the substrate, and covers at least a portion of a surface of each of the second channels. The first source/drain layer is formed on a portion of the first region of the substrate adjacent to the first gate structure, and contacts the first channels. The second source/drain layer is formed on a portion of the second region of the substrate adjacent to the second gate structure, and contacts the second channels. The first fin spacer contacts a lower sidewall of the first source/drain layer. The second fin spacer contacts a lower sidewall of the second source/drain layer. The first capping layer contacts an upper sidewall and an upper surface of the first source/drain layer. The second capping layer contacts an upper sidewall and an upper surface of the second source/drain layer. The first etch stop pattern is formed on the first fin spacer and the first capping layer. The second etch stop pattern is formed on the second fin spacer and the second capping layer.

A semiconductor device includes first channels, second channels, a first gate structure, a second gate structure, a first source/drain layer, a second source/drain layer, a first gate spacer, a second gate spacer, a first etch stop pattern, and a second etch stop pattern. The first channels are formed on a first region of a substrate including the first region and a second region. The first channels are spaced apart from each other in a vertical direction substantially perpendicular to an upper surface of the substrate. The second channels are spaced apart from each other in the vertical direction on the second region of the substrate. The first gate structure are formed on the first region of the substrate, and cover at least a portion of a surface of each of the first channels. The second gate structure is formed on the second region of the substrate, and covers at least a portion of a surface of each of the second channels. The first source/drain layer is formed on a portion of the first region of the substrate adjacent to the first gate structure, and contacts the first channels. The second source/drain layer is formed on a portion of the second region of the substrate adjacent to the second gate structure, and contacts the second channels. The first gate spacer covers each of opposite sidewalls of the first gate structure. The second gate spacer covers each of opposite sidewalls of the second gate structure. The first etch stop pattern contacts the first gate spacer and the first source/drain layer. The second etch stop pattern contacts the second gate spacer and the second source/drain layer. A portion of the first gate spacer contacting the first source/drain layer has a lowermost surface that is lower than an uppermost surface of the first source/drain layer, and contacts an upper sidewall of the first source/drain layer. A portion of the second gate spacer contacting the second source/drain layer has a lowermost surface that is lower than an uppermost surface of the second source/drain layer, and contacts an upper sidewall of the second source/drain layer.

A method of manufacturing a semiconductor device includes forming a first stack structure including first sacrificial lines and first semiconductor lines that are alternately and repeatedly stacked on a substrate. A dummy gate structure is formed on the substrate and partially covers the first stack structure. A first gate spacer and a first sacrificial gate spacer are formed on a sidewall of the dummy gate structure. The first stack structure is etched using the dummy gate structure, the first gate spacer and the first sacrificial gate spacer as an etching mask to form a first opening exposing an upper surface of the substrate. A first cleansing process is performed on the first opening. A first source/drain layer is formed on the exposed upper surface of the substrate. The first sacrificial gate spacer is removed. The dummy gate structure and the first sacrificial lines are removed to form second and third openings, respectively. A gate structure is formed in the second and third openings. The first sacrificial gate spacer includes silicon nitride. The first sacrificial gate spacer is not removed during the first cleansing process.

A method of manufacturing a semiconductor device includes forming first and second stack structures on a substrate including first and second regions. The first stack structure includes first sacrificial lines and first semiconductor lines alternately and repeatedly stacked on the first region of the substrate, and the second stack structure includes second sacrificial lines and second semiconductor lines alternately and repeatedly stacked on the second region of the substrate. First and second dummy gate structures are formed on the first and second regions, respectively, of the substrate to partially cover the first and second stack structures, respectively. A first gate spacer and a first sacrificial gate spacer are formed on a sidewall of the first dummy gate structure. The first stack structure is etched using the first dummy gate structure, the first gate spacer and the first sacrificial gate spacer as an etching mask to form a first opening exposing an upper surface of the substrate. A first cleansing process is performed on the first opening. A first source/drain layer is formed on the exposed upper surface of the substrate. The first sacrificial gate spacer is removed. A second gate spacer and a second sacrificial gate spacer are formed on a sidewall of the second dummy gate structure. The second stack structure is etched using the second dummy gate structure, the second gate spacer and the second sacrificial gate spacer as an etching mask to form a second opening exposing an upper surface of the substrate. A second cleansing process is performed on the second opening. A second source/drain layer is formed on the exposed upper surface of the substrate. The second sacrificial gate spacer is removed. The first dummy gate structure and the first sacrificial lines are removed to form second and third openings, respectively. The second dummy gate structure and the second sacrificial lines are removed to form fourth and fifth openings, respectively. A first gate structure is formed in the second and third openings and a second gate structure is formed in the fourth and fifth openings. Each of the first and second sacrificial gate spacers includes silicon nitride. The first and second sacrificial gate spacers are not removed during the first and second cleansing processes, respectively.

A method of manufacturing a semiconductor device includes forming a first stack structure including first sacrificial lines and first semiconductor lines alternately and repeatedly stacked on a substrate. A dummy gate structure is formed on the substrate and partially covers the first stack structure. A first sacrificial gate spacer and a second sacrificial gate spacer are formed on a sidewall of the dummy gate structure. The first stack structure is etched using the dummy gate structure, and the first and second sacrificial gate spacers are used as an etching mask to form a first opening exposing an upper surface of the substrate. A first cleansing process is performed on the first opening, and the second sacrificial gate spacer is removed. A first source/drain layer is formed on the exposed upper surface of the substrate. The first sacrificial gate spacer is removed. A spacer layer is formed on the dummy gate structure and the first source/drain layer. The dummy gate structure and the first sacrificial lines are removed to form second and third openings, respectively. A gate structure is formed in the second and third openings. The first sacrificial gate spacer includes silicon nitride. The first sacrificial gate spacer is not removed during the first cleansing process.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DESCRIPTION OF EMBODIMENTS

A semiconductor device and a method of manufacturing the same in accordance with example embodiments of the present disclosure ill be described more fully hereinafter with reference to the accompanying drawings. As used in this description of the embodiments, two directions substantially parallel to an upper surface of a substrate and crossing each other may be referred to as first and second directions D1 and D2, respectively, and a direction substantially perpendicular to the upper surface of the substrate may be referred to as a third direction D3. In example embodiments of the present disclosure, the first and second directions D1 and D2 may be substantially perpendicular to each other.

Figure 26:
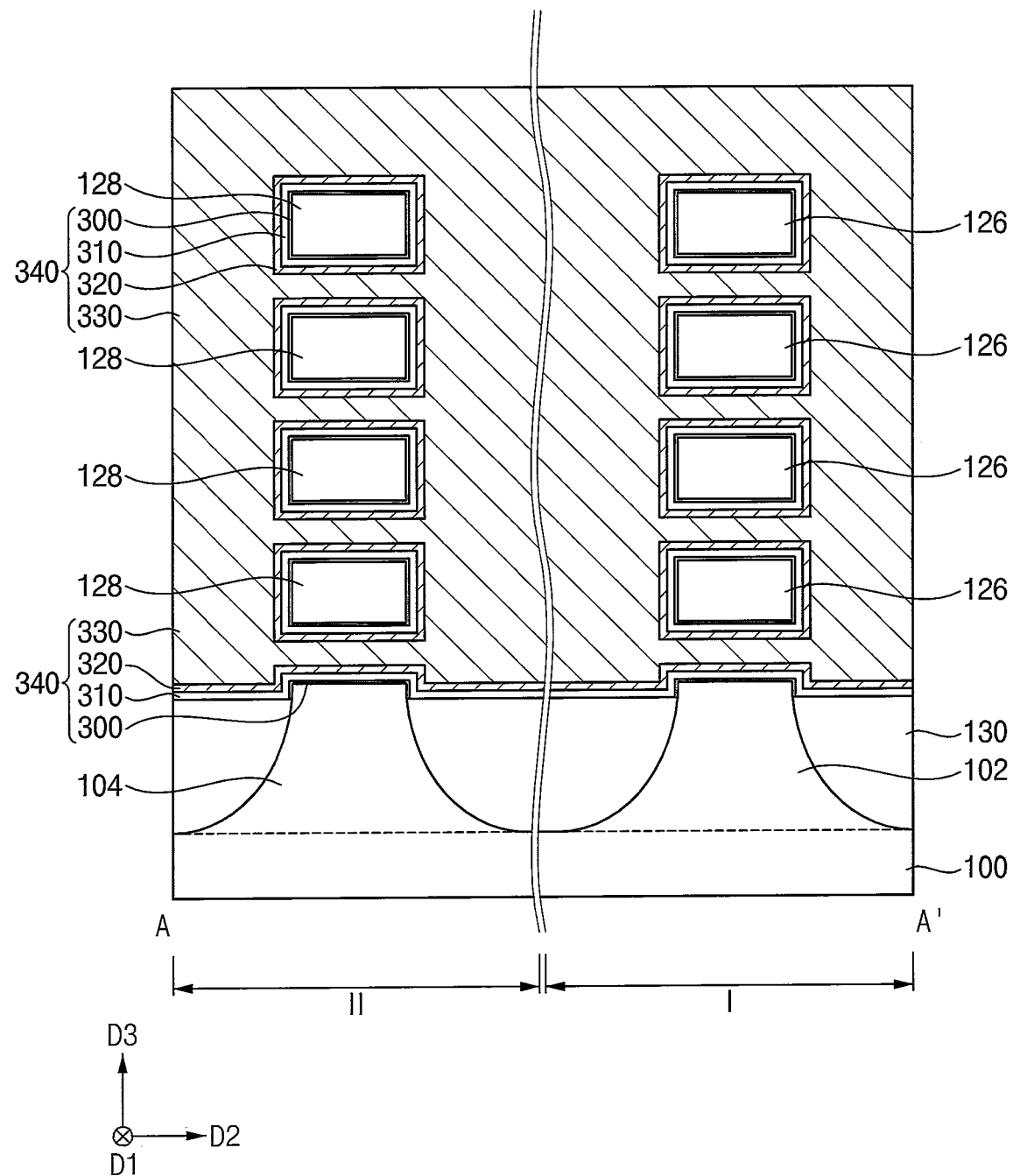
Figure 27:
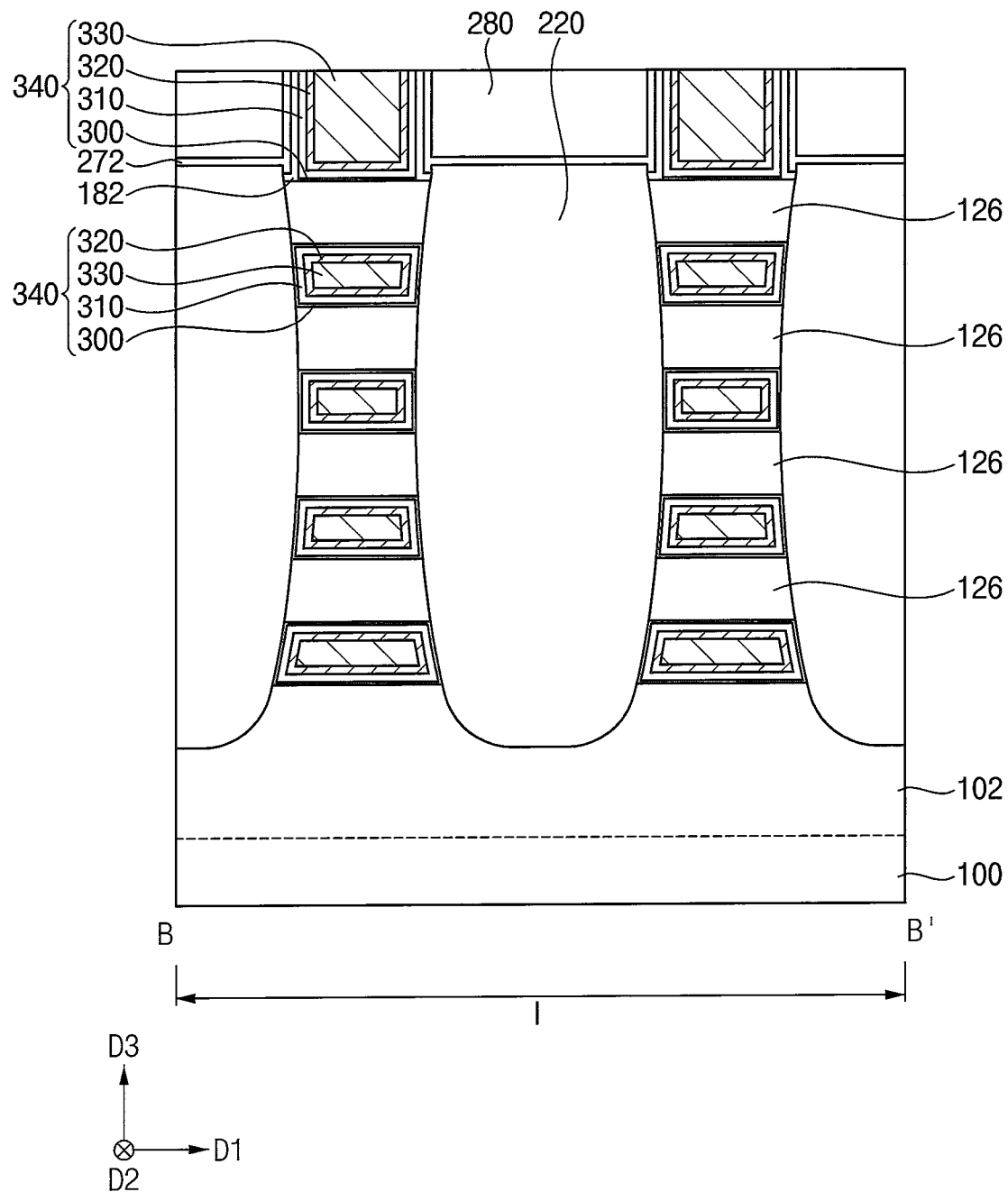
Figure 28:
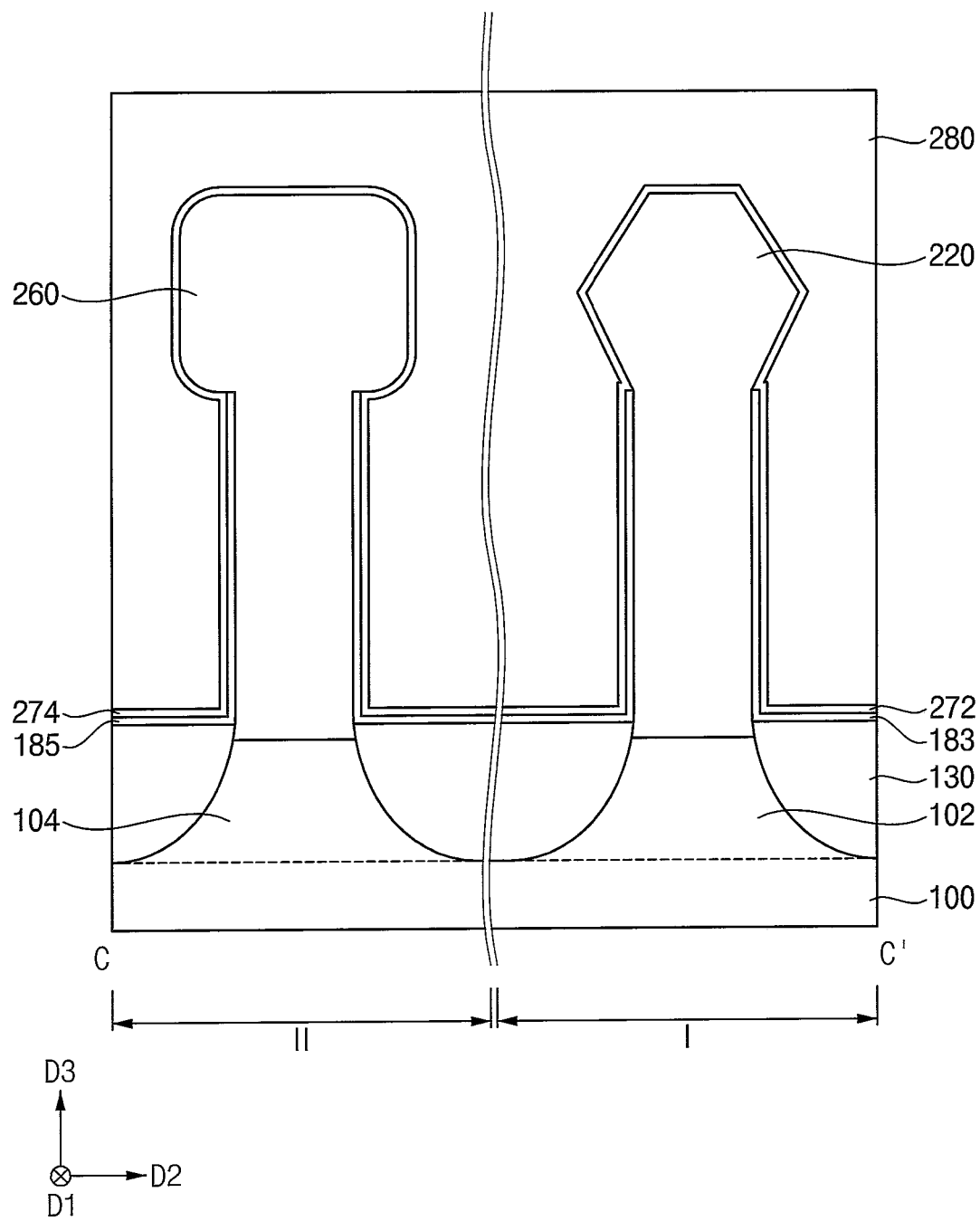
Figure 29:
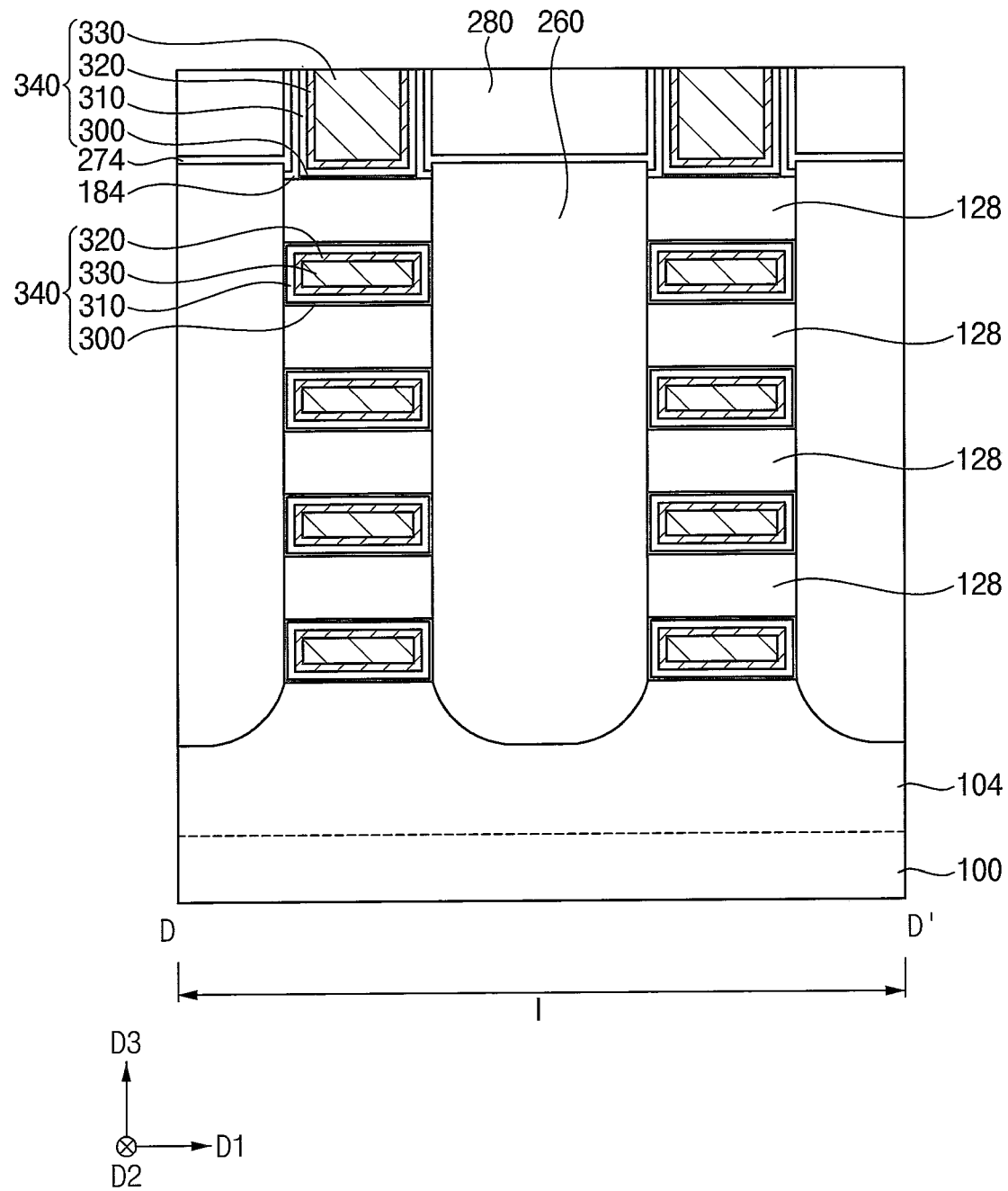

FIGS. 1 to 29 are plan views and cross-sectional views illustrating a method of manufacturing a semiconductor device in accordance with example embodiments of the present disclosure. For example, FIGS. 1, 3, 6, 9, 15, 18 and 25 are the plan views, and FIGS. 2, 4-5, 7-8, 10-14, 16-17, 19-24 and 26-29 are the cross-sectional views. FIGS. 2, 4 and 26 are cross-sectional views taken along lines A-A' of corresponding plan views, respectively, FIGS. 5, 7, 10, 12, 21, 24 and 27 are cross-sectional views taken along lines B-B' of corresponding plan views, respectively, FIGS. 8, 11, 13, 16, 19, 22 and 28 are cross-sectional views taken along lines C-C' of corresponding plan views, respectively, and FIGS. 14, 17, 20, 23 and 29 are cross-sectional views taken along lines D-D' of corresponding plan views, respectively.

Figure 1:
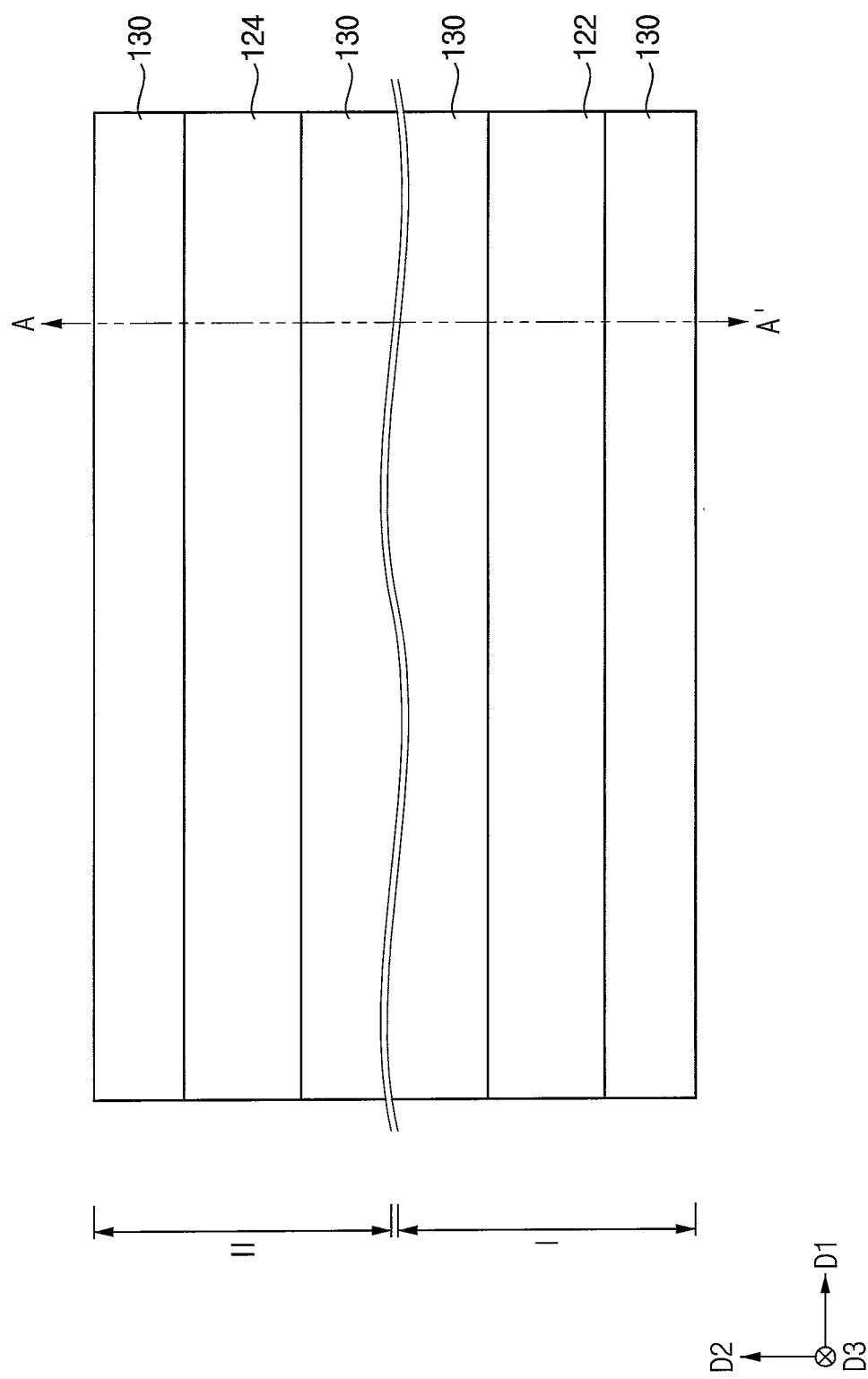
FIGS. 1 to 29 are plan views and cross-sectional views illustrating a method of manufacturing a semiconductor device in accordance with example embodiments of the present disclosure.
Figure 2:
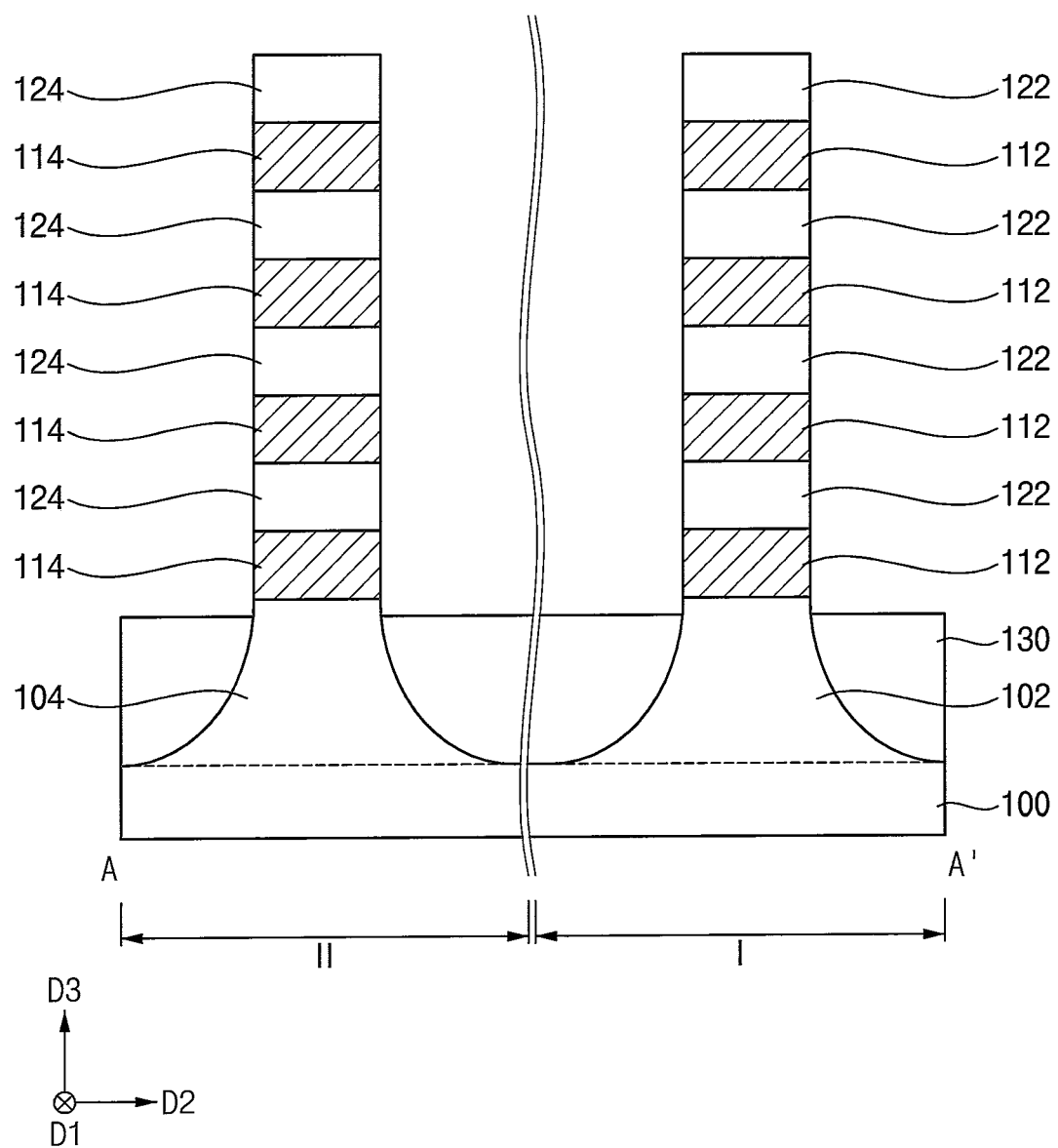

Referring to FIGS. 1 and 2, a sacrificial layer and a semiconductor layer may be alternately and repeatedly stacked on a substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may include a silicon-on-insulator (SOI) substrate or a germanium-on-insulator (GOI) substrate.

The substrate 100 may include first and second regions I and II arranged in the second direction D2. In example embodiments of the present disclosure, the first region I may be a PMOS region in which PMOS transistors are formed, and the second region II may be an NMOS region in which NMOS transistors are formed.

The semiconductor layer may include, e.g., silicon, and the sacrificial layer may include a material having an etching selectivity with respect to the substrate 100 and the semiconductor layer, e.g., silicon-germanium. In FIG. 1, the sacrificial layers are formed at four levels, respectively, and the semiconductor layer are formed at four levels, respectively, however, the inventive concept is not necessarily limited thereto.

A first etching mask extending in the first direction D1 may be formed on an uppermost one of the semiconductor layers, and the semiconductor layers, the sacrificial layers and an upper portion of the substrate 100 may be etched using the first etching mask.

Thus, first and second active patterns 102 and 104, each of which may extend in the first direction D1, may be formed on the first and second regions I and II of the substrate 100, respectively. Additionally, a first stack structure including first sacrificial lines 112 and first semiconductor lines 122, alternately and repeatedly stacked in the third direction D3, may be formed on the first active pattern 102. A second stack structure including second sacrificial lines 114 and second semiconductor lines 124, alternately and repeatedly stacked in the third direction D3, may be formed on the second active pattern 104. Each of the first and second stack structures may protrude from the substrate 100 in the third direction D3, and thus may also be referred to as first and second fin structures, respectively.

In example embodiments of the present disclosure, a plurality of first active patterns 102 may be spaced apart from each other in the second direction D2 on the first region I of the substrate 100, and a plurality of second active patterns 104 may be spaced apart from each other in the second direction D2 on the second region II of the substrate 100. Thus, a plurality of first stack structures may be spaced apart from each other in the second direction D2 on the first region I of the substrate 100, and a plurality of second stack structures may be spaced apart from each other in the second direction D2 on the second region II of the substrate 100.

An isolation pattern 130 may be formed on the substrate 100 to cover sidewalls of the first and second active patterns 102 and 104. The isolation pattern 130 may entirely cover sidewalls of the first and second active patterns 102 and 104, or the isolation pattern 130 might only cover lower portions of the sidewalls of the first and second active patterns 102 and 104. The isolation pattern 130 may include an oxide, e.g., silicon oxide.

Figure 3:
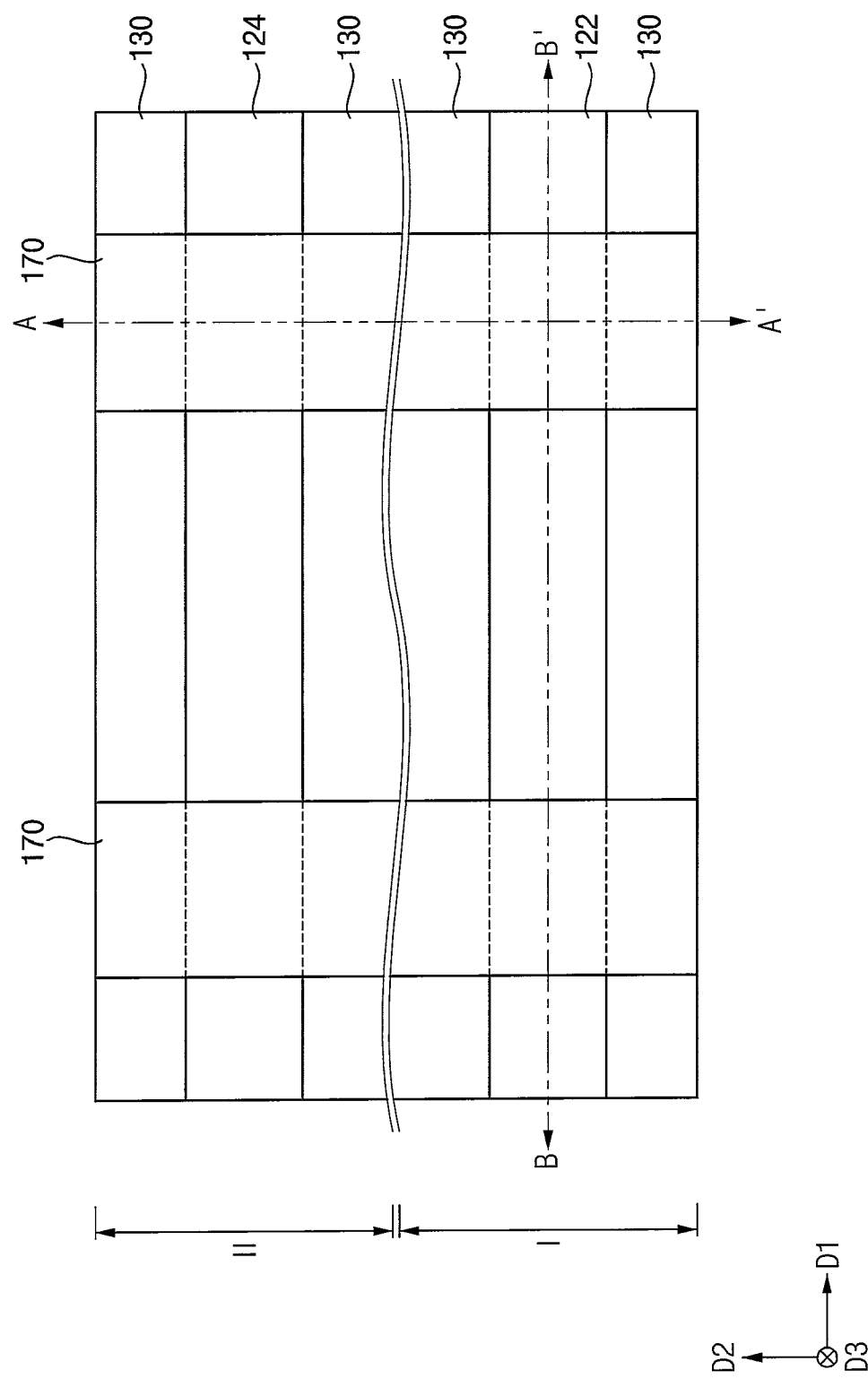
Figure 4:
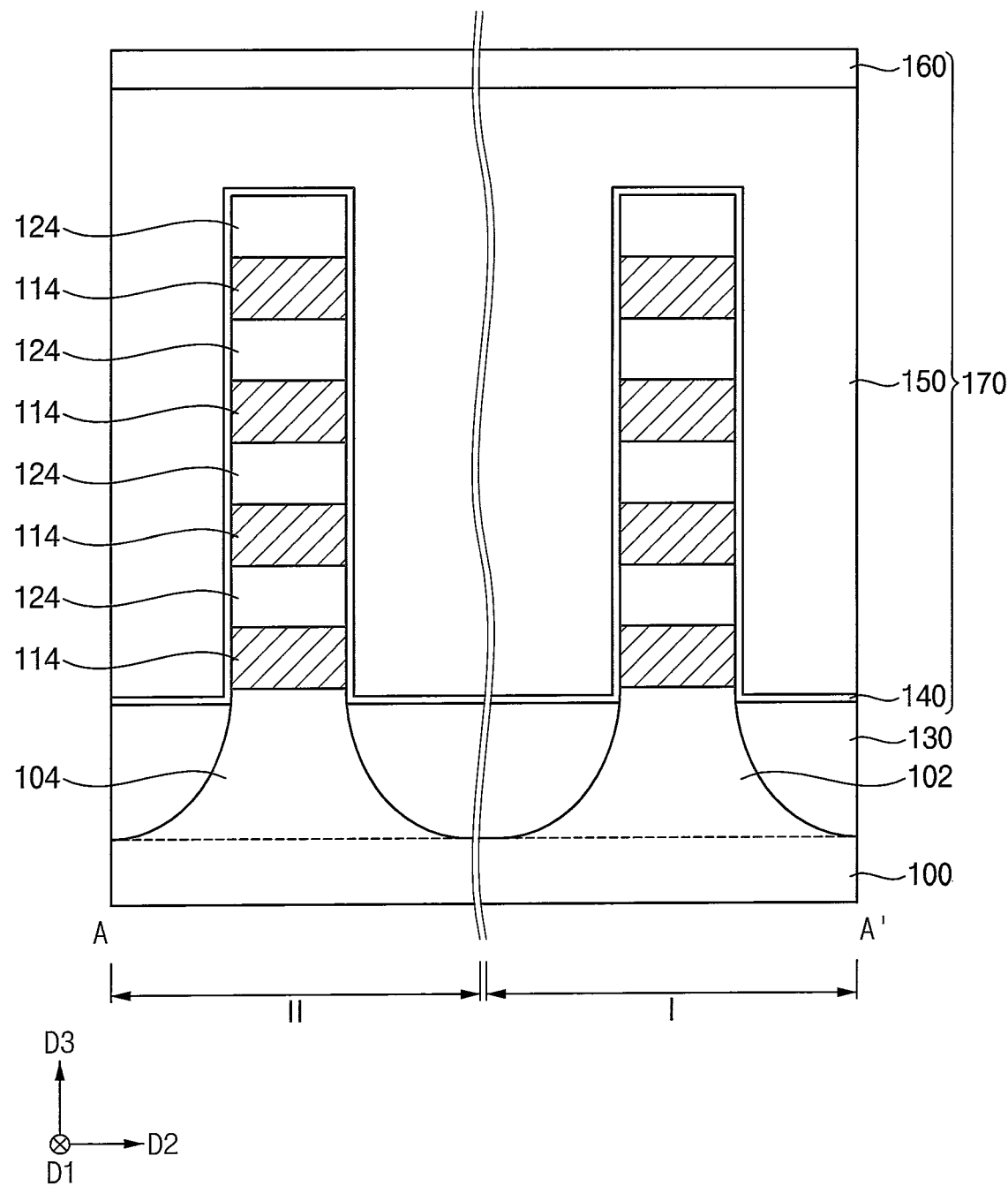
Figure 5:
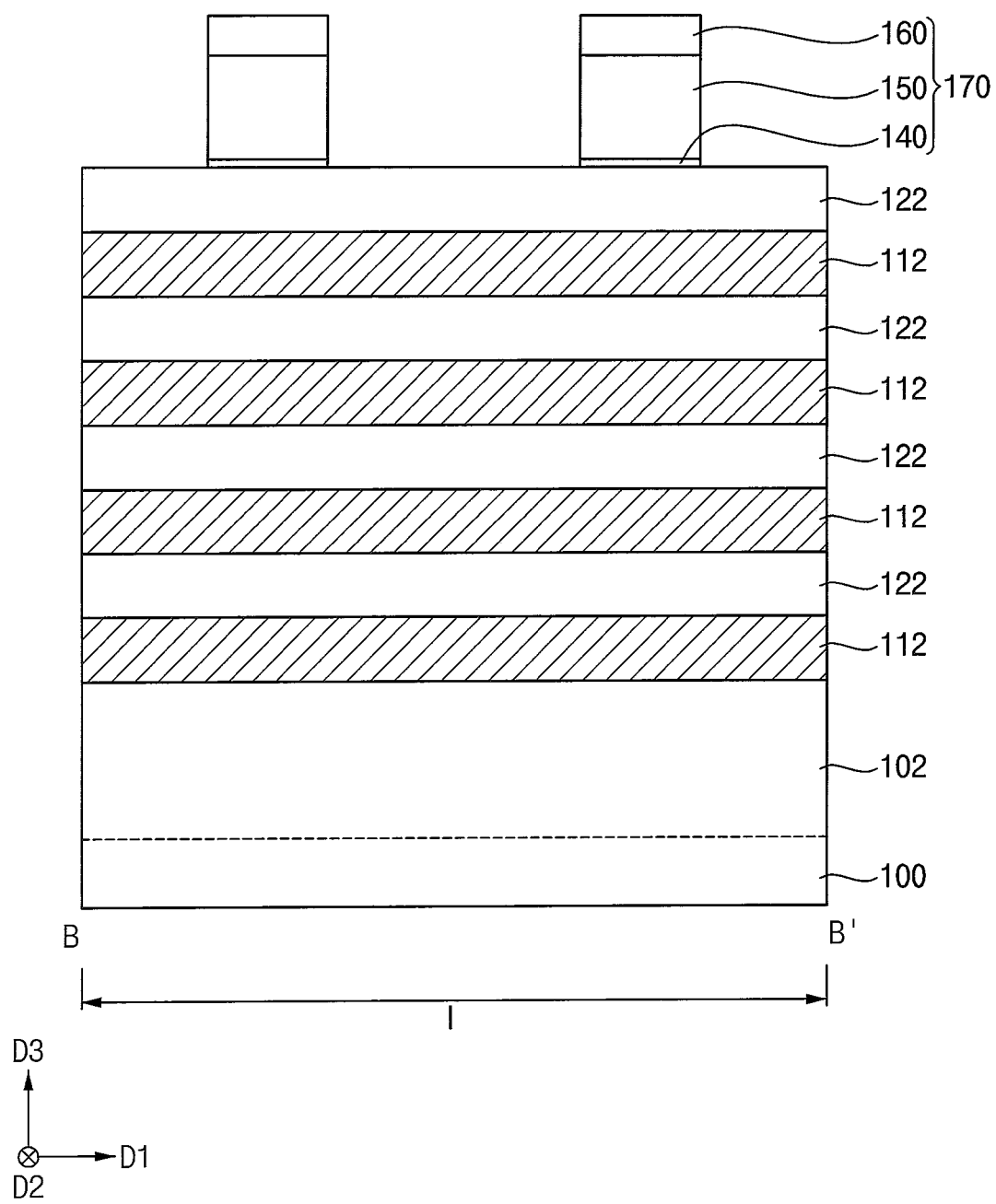

Referring to FIGS. 3 to 5, a dummy gate structure 170 may be formed on the substrate 100 to partially cover the first and second stack structures and the isolation pattern 130.

For example, a dummy gate insulation layer, a dummy gate electrode layer and a dummy gate mask layer may be sequentially formed on the substrate 100 having the first and second stack structures and the isolation pattern 130 thereon, a second etching mask extending in the second direction D2 may be formed on the dummy gate mask layer, and the dummy gate mask layer may be etched using the second etching mask to form a dummy gate mask 160.

The dummy gate electrode layer and the dummy gate insulation layer may be etched using the dummy gate mask 160 as an etching mask to form a dummy gate electrode 150 and a dummy gate insulation pattern 140, respectively, on the first and second regions I and II of the substrate 100.

The dummy gate insulation pattern 140, the dummy gate electrode 150 and the dummy gate mask 160 sequentially stacked in the third direction D3 on the first and second active patterns 102 and 104 and a portion of the isolation pattern 130 adjacent thereto may form a dummy gate structure 170. In example embodiments of the present disclosure, the dummy gate structure 170 may extend in the second direction D2 on the first and second stack structures and the isolation pattern 130, and may cover an upper surface and opposite sidewalls in the second direction D2 of each of the first and second stack structures.

In example embodiments of the present disclosure, a plurality of dummy gate structures may be spaced apart from each other in the first direction D1. In FIGS. 3 and 5, two dummy gate structures 170 are spaced apart from each other in the first direction D1, however, the inventive concept is not necessarily limited thereto. Additionally, in FIGS. 3 and 4, the dummy gate structure 170 continuously extends in the second direction D2 on the first and second regions I and II of the substrate 100, however, the inventive concept is not necessarily limited thereto, and the dummy gate structure 170 may be divided into two parts on the first and second regions I and II, respectively, of the substrate 100, which may be referred to as first and second dummy gate structures, respectively.

Figure 6:
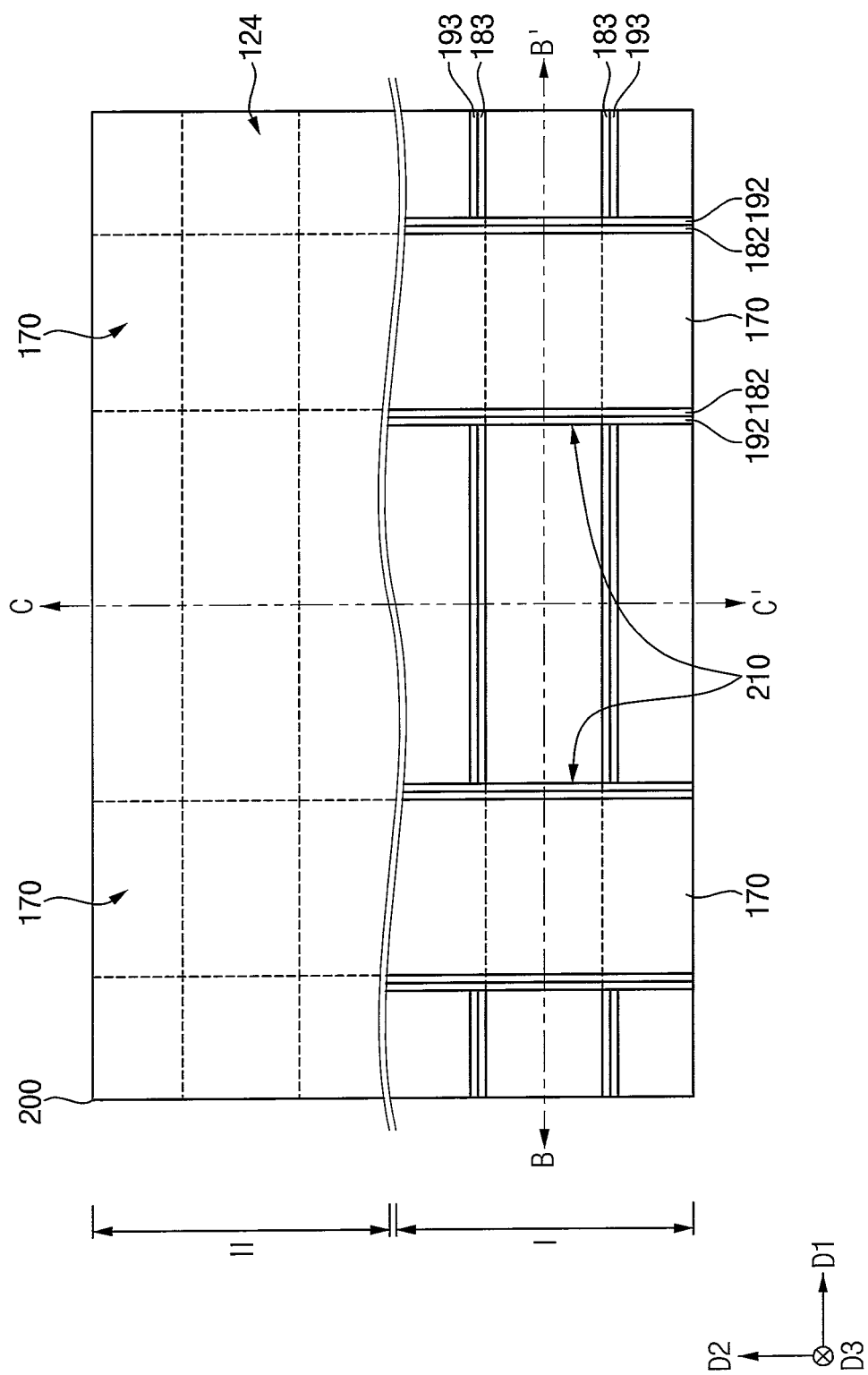
Figure 7:
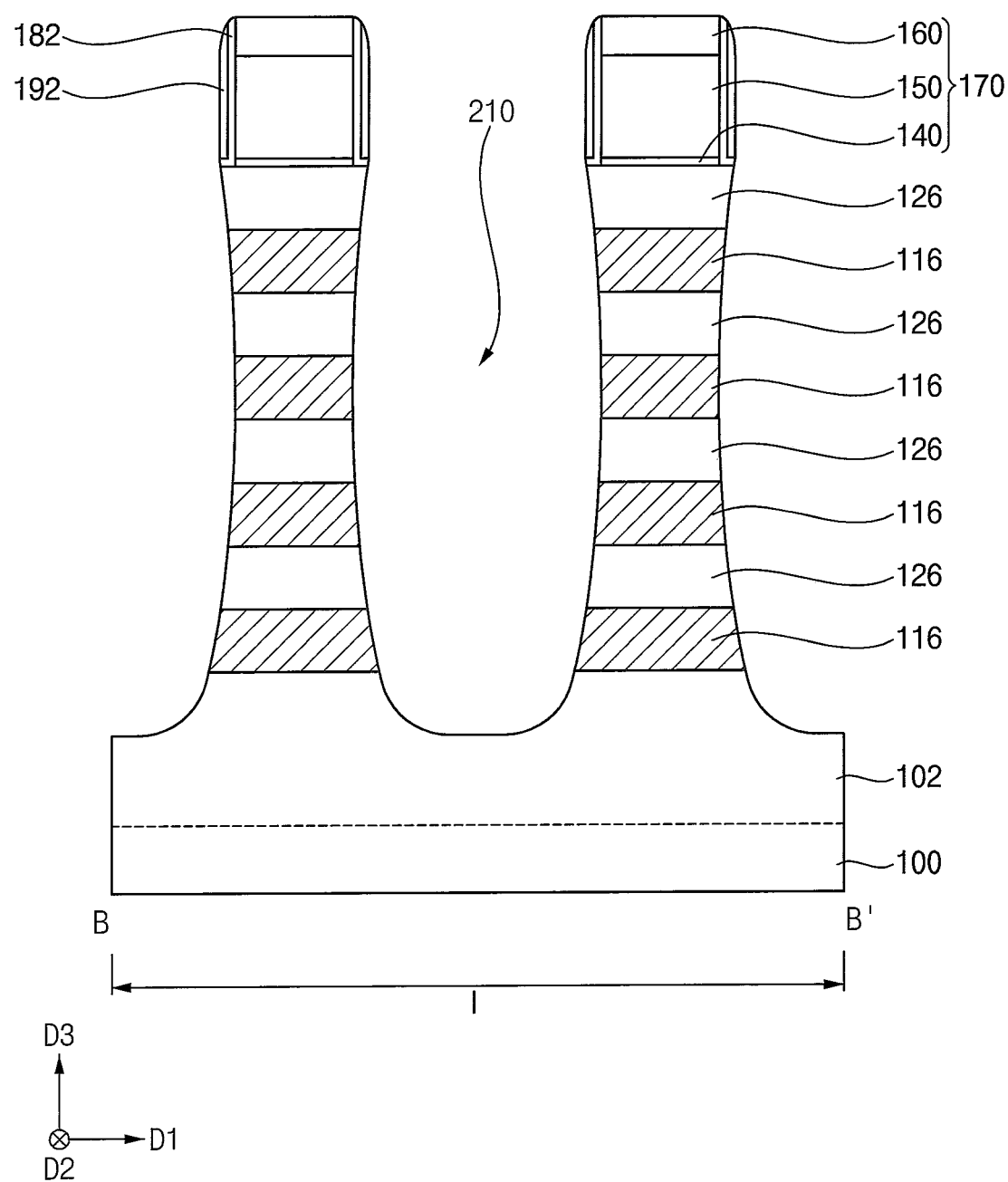
Figure 8:
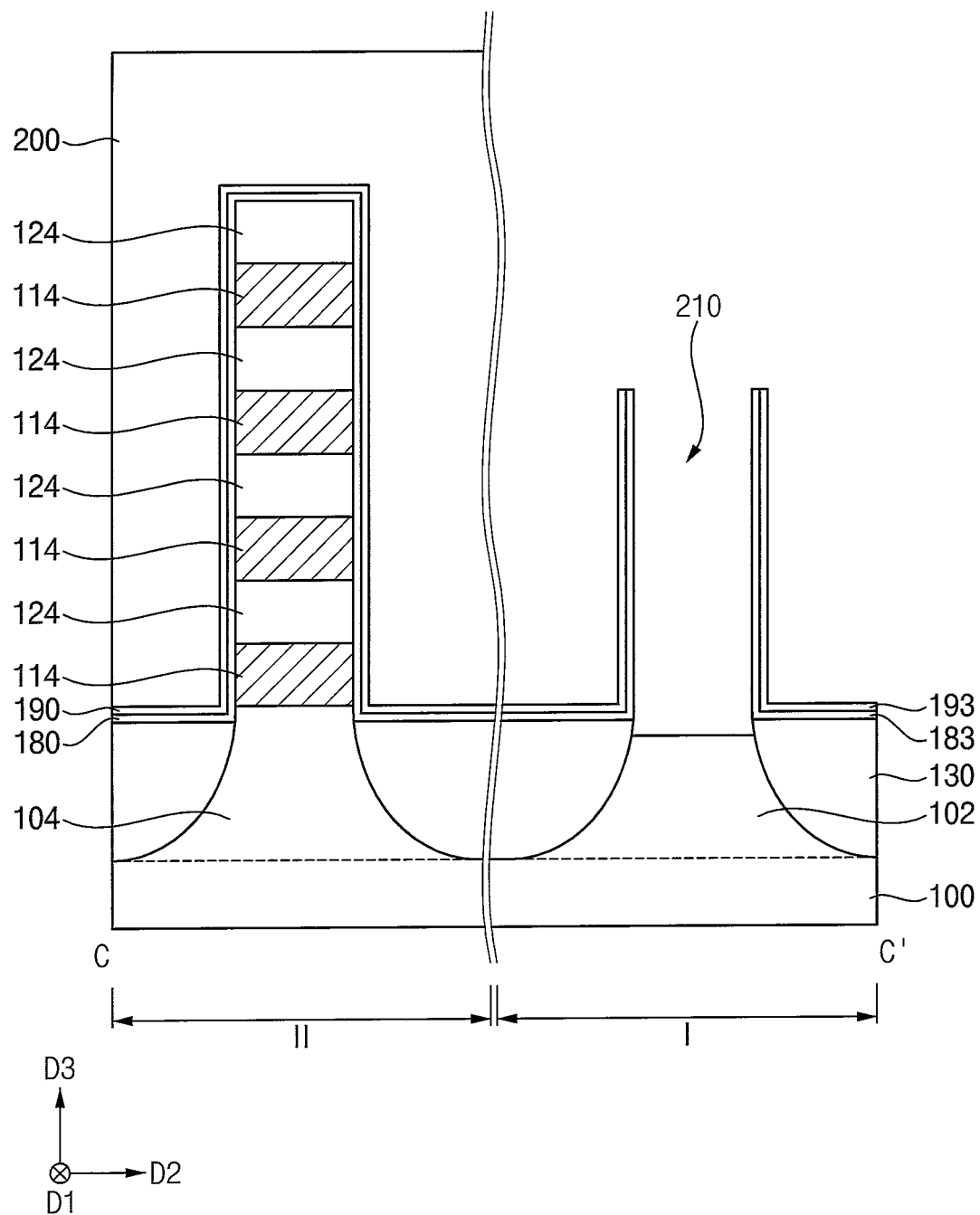

Referring to FIGS. 6 to 8, a first spacer layer 180 and a first sacrificial spacer layer 190 may be sequentially formed on the substrate 100 having the dummy gate structure 170, the first and second stack structures, the isolation pattern 130, and the first and second active patterns 102 and 104 thereon.

In example embodiments of the present disclosure, the first spacer layer 180 may include a low-k dielectric material, e.g., silicon oxycarbonitride, silicon oxynitride, silicon carbonitride, etc. Thus, the parasitic capacitance between a gate structure 340 (refer to FIGS. 25 to 29) and neighboring conductive structures, e.g., contact plugs may be reduced due to first and second gate spacers 182 and 184 that may remain on a sidewall of the gate structure 340 after partially etching the first spacer layer 180. As used herein, the term "low-k" may mean any material having a dielectric constant lower than that of silicon dioxide.

The first sacrificial spacer layer 190 may include, e.g., silicon nitride.

A third etching mask 200 may cover the second region II of the substrate 100, and the first sacrificial spacer layer 190 and the first spacer layer 180 may be anisotropically etched to form a first sacrificial gate spacer 192 and the first gate spacer 182, respectively, on each of opposite sidewalls in the first direction D1 of a portion of the dummy gate structure 170 on the first region I of the substrate 100. A first fin spacer 183 and a first sacrificial fin spacer 193 may be formed on each of opposite sidewalls in the second direction D2 of a portion of the first stack structure not covered by the dummy gate structure 170 on the first region I of the substrate 100 and a portion of the isolation pattern 130 adjacent to each of the opposite sidewalls in the second direction D2 of the portion of the first stack structure.

The third etching mask 200 may include, e.g., spin-on-hardmask (SOH) or amorphous carbon layer (ACL).

The first stack structure and an upper portion of the first active pattern 102 thereunder on the first region I of the substrate 100 may be etched using the dummy gate structure 170, the first gate spacer 182 and the first sacrificial gate spacer 192 as an etching mask to form a first opening 210.

Thus, the first sacrificial lines 112 and the first semiconductor lines 122 under the dummy gate structure 170, the first gate spacer 182 and the first sacrificial gate spacer 192 may be transformed into first sacrificial patterns 116 and first semiconductor patterns 126, respectively, and the first stack structure extending in the first direction D1 may be divided into a plurality of parts spaced apart from each other in the first direction D1.

In an example embodiment of the present disclosure, the first opening 210 may be formed to have a maximum volume. Thus, a sidewall of the first opening 210 may have a convex shape. Sidewalls in the first direction D1 of the first semiconductor patterns 126 might not be perpendicular but rather, may be slanted with respect to an upper surface of the substrate 100. Thus, lengths in the first direction D1 of the first semiconductor patterns 126 might not be constant in the third direction D3.

A portion of each of the first sacrificial patterns 116 adjacent to the first opening 210 may be removed to form a gap, and an inner spacer may fill the gap.

Figure 9:
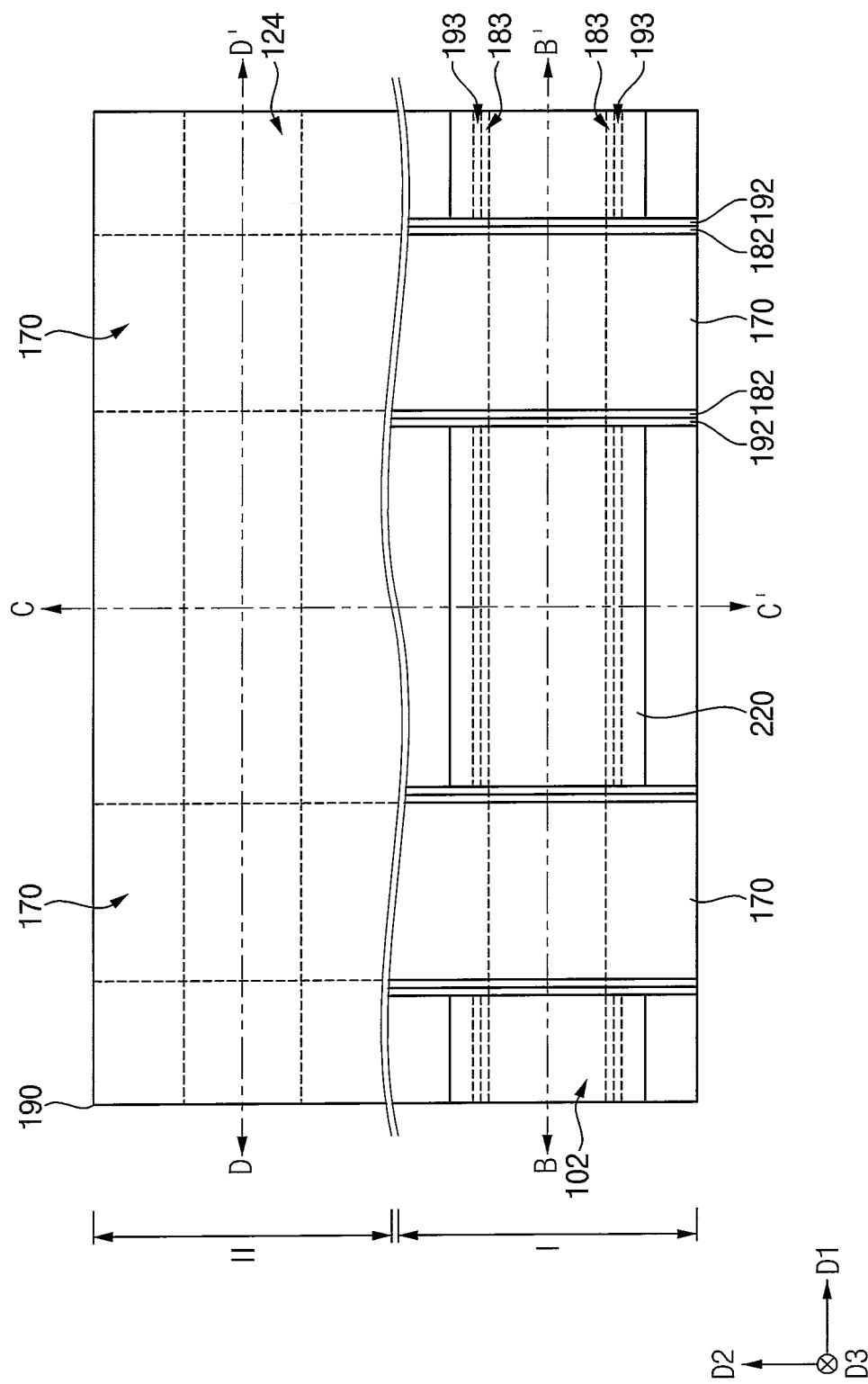
Figure 10:
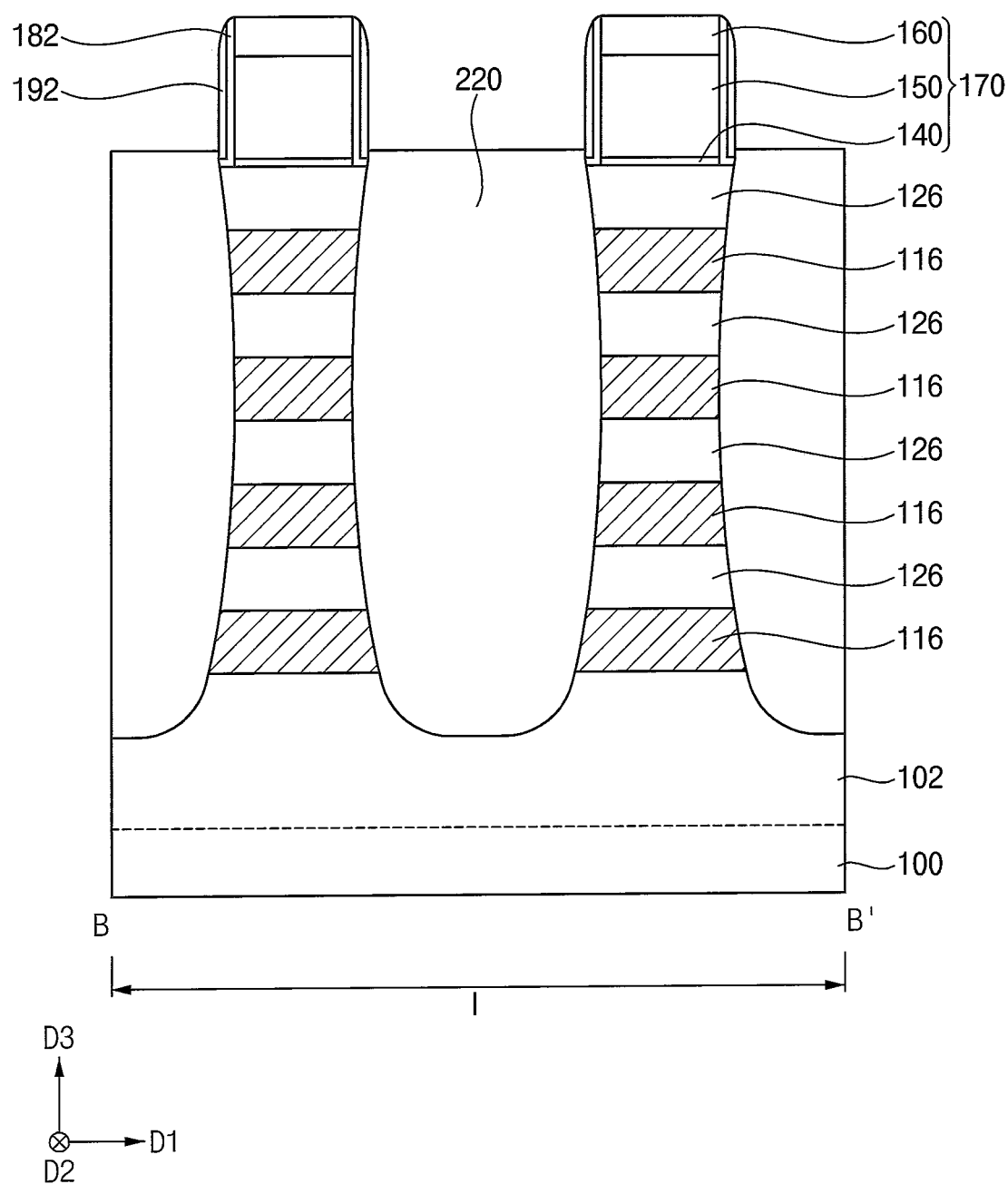
Figure 11:
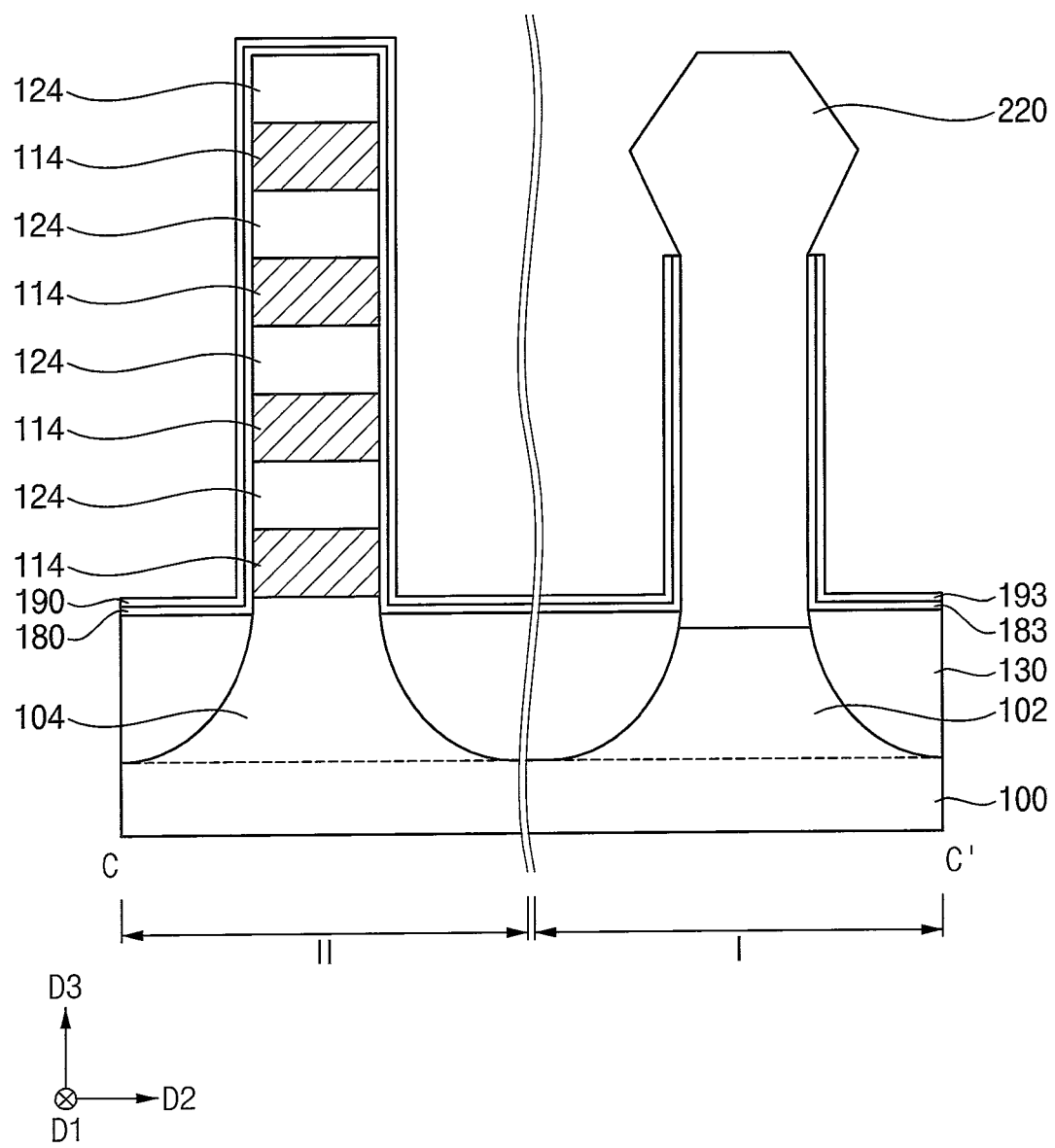

Referring to FIGS. 9 to 11, after removing the third etching mask 200, a cleansing process may be performed on an upper surface of the first active pattern 102 and sidewalls of the first semiconductor patterns 126 and the first sacrificial patterns 116 exposed by the first opening 210. The cleansing process may include a wet etching process using, e.g., hydrofluoric acid (HF).

A first selective epitaxial growth (SEG) process may be performed using the upper surface of the first active pattern 102 and the sidewalls of the first semiconductor patterns 126 and the first sacrificial patterns 116 exposed by the first opening 210 as a seed to form a first source/drain layer 220 on an inner wall of the first opening 210.

In an example embodiment of the present disclosure, the first SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as the first source/drain layer 220. In an example embodiment of the present disclosure, an upper portion of the first source/drain layer 220 may contact an outer sidewall of the first sacrificial gate spacer 192.

Hereinafter, a portion of the first source/drain layer 220 in the first opening 210 may be referred to as a lower portion thereof, and a portion of the first source/drain layer 220 grown upwardly from the first opening 210 may be referred to as an upper portion thereof.

In example embodiments of the present disclosure, a cross-section of the upper portion of the first source/drain layer 220 taken along the second direction D2 may have a shape of, e.g., a pentagon or hexagon.

Figure 12:
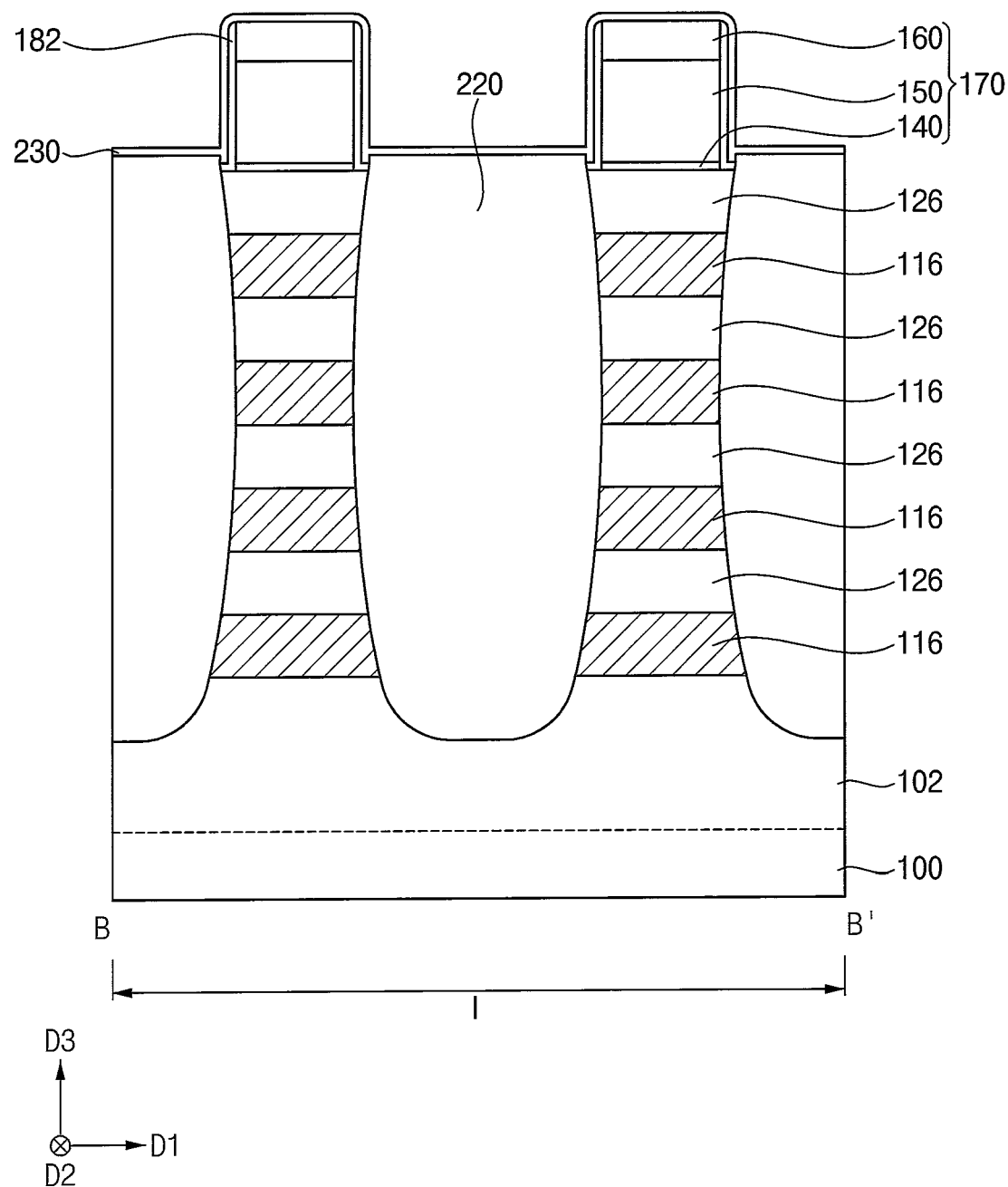
Figure 13:
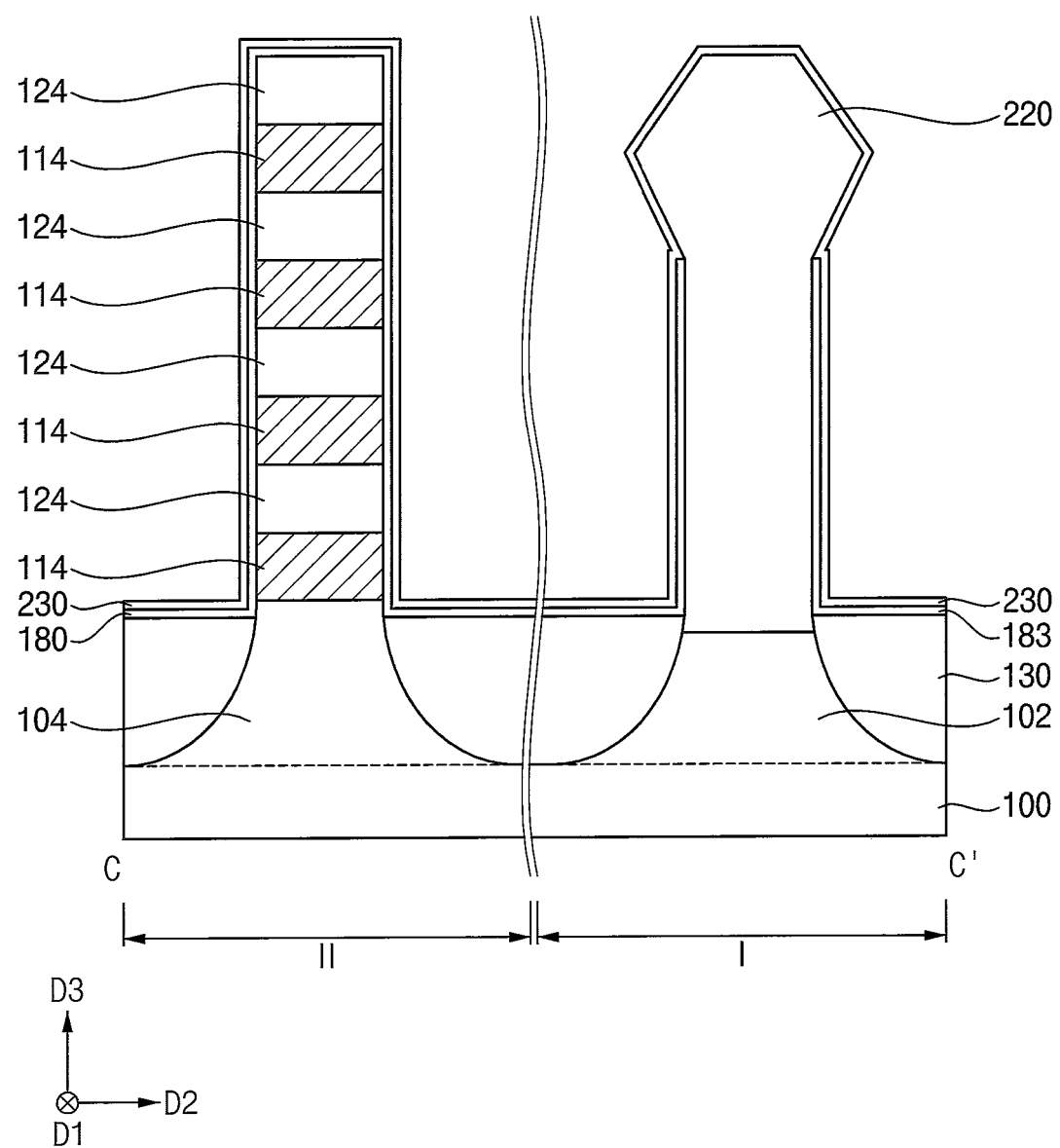
Figure 14:
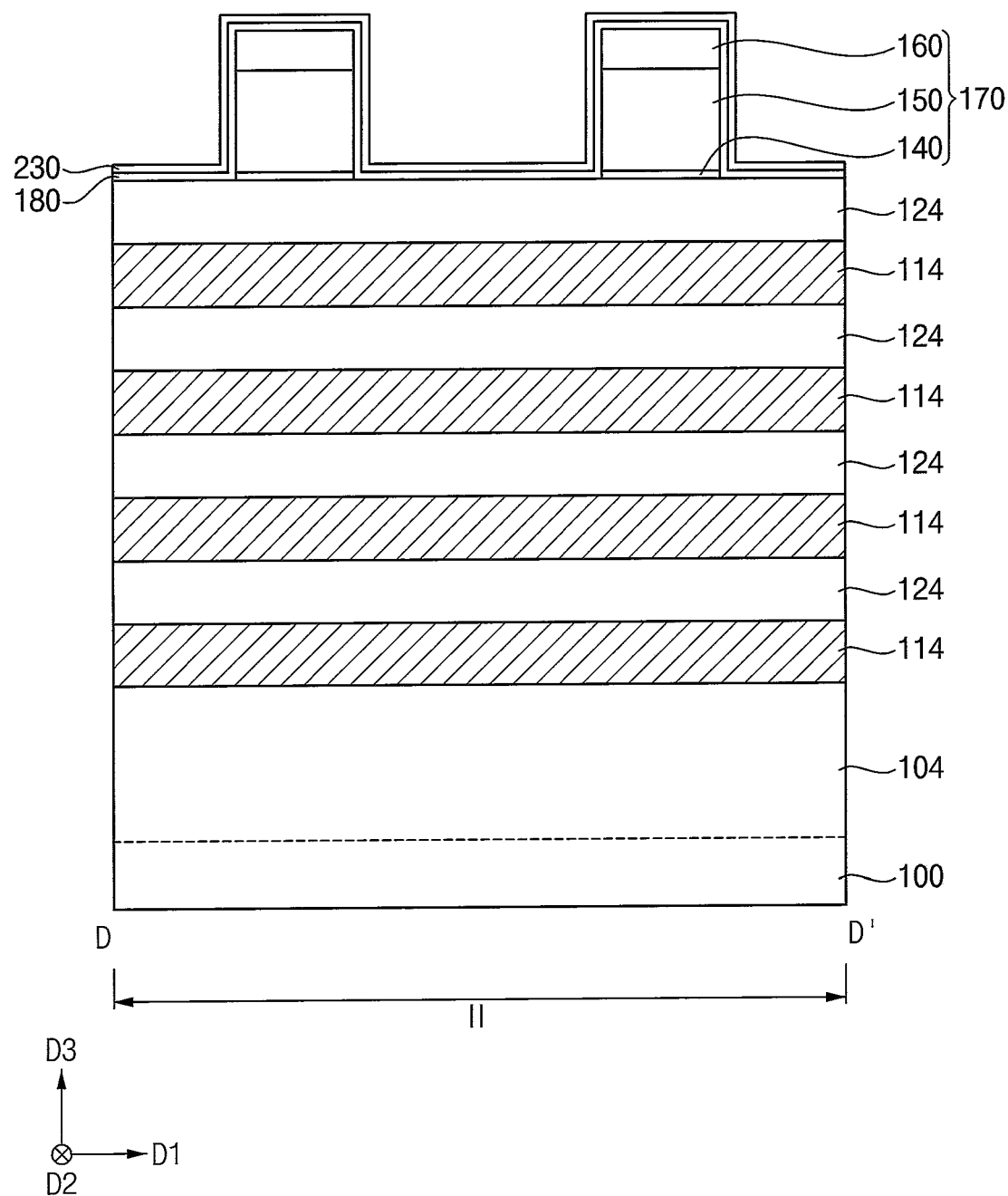

Referring to FIGS. 12 to 14, the first sacrificial gate spacer 192 and the first sacrificial fin spacer 193 on the first region I of the substrate 100 and the first sacrificial spacer layer 190 remaining on the second region II of the substrate 100 may be removed by, e.g., a wet etching process using phosphoric acid ($H_3PO_4$), and a second sacrificial layer 230 may be entirely formed on the first and second regions I and II of the substrate 100.

Thus, the second sacrificial layer 230 may be formed on the dummy gate structure 170, the first gate spacer 182, the first fin spacer 183 and the first source/drain layer 220 on the first region I of the substrate 100 and the first spacer layer 180 on the second region II of the substrate 100. The second sacrificial layer 230 may include, e.g., silicon nitride.

Figure 15:
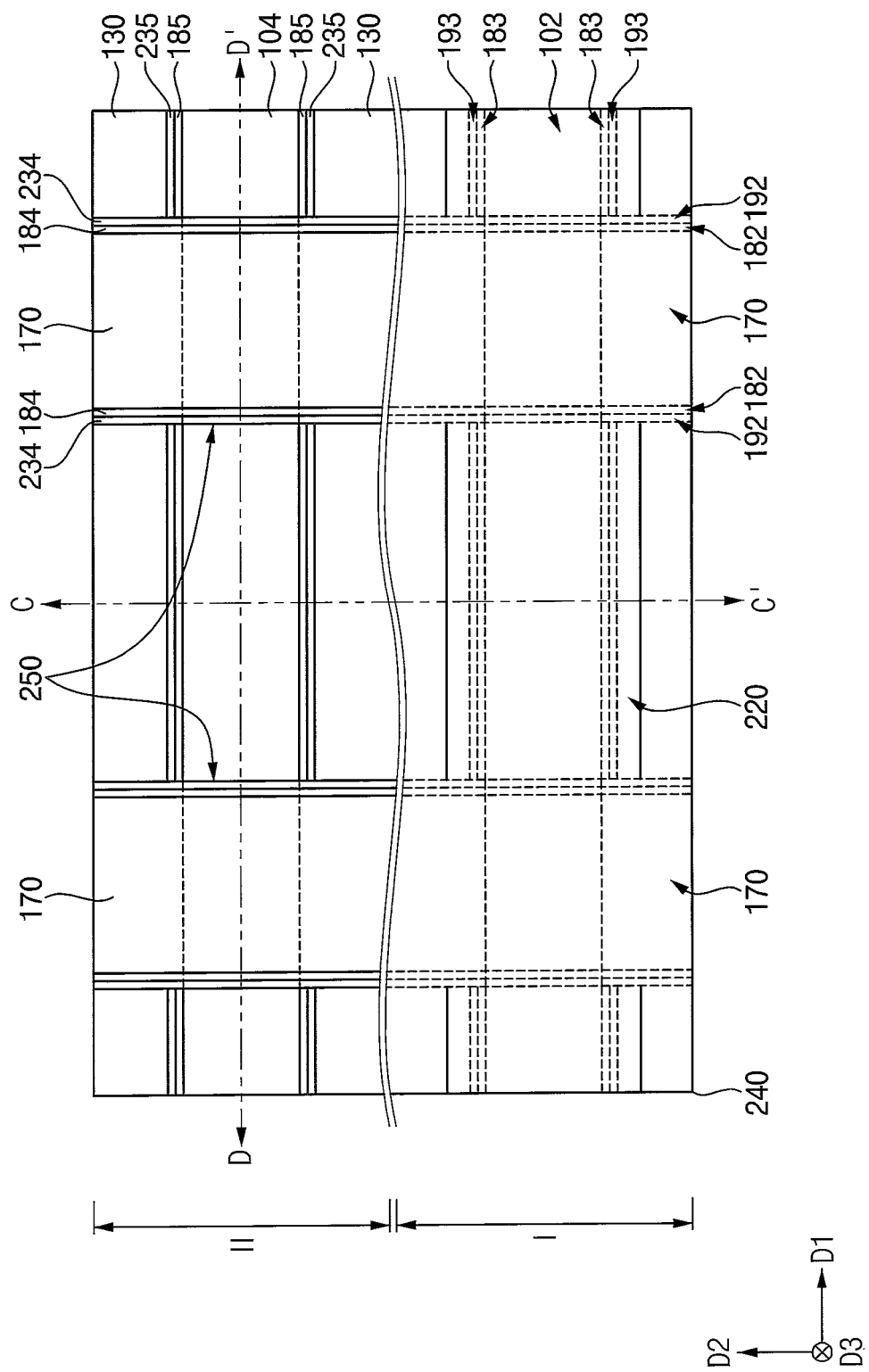
Figure 16:
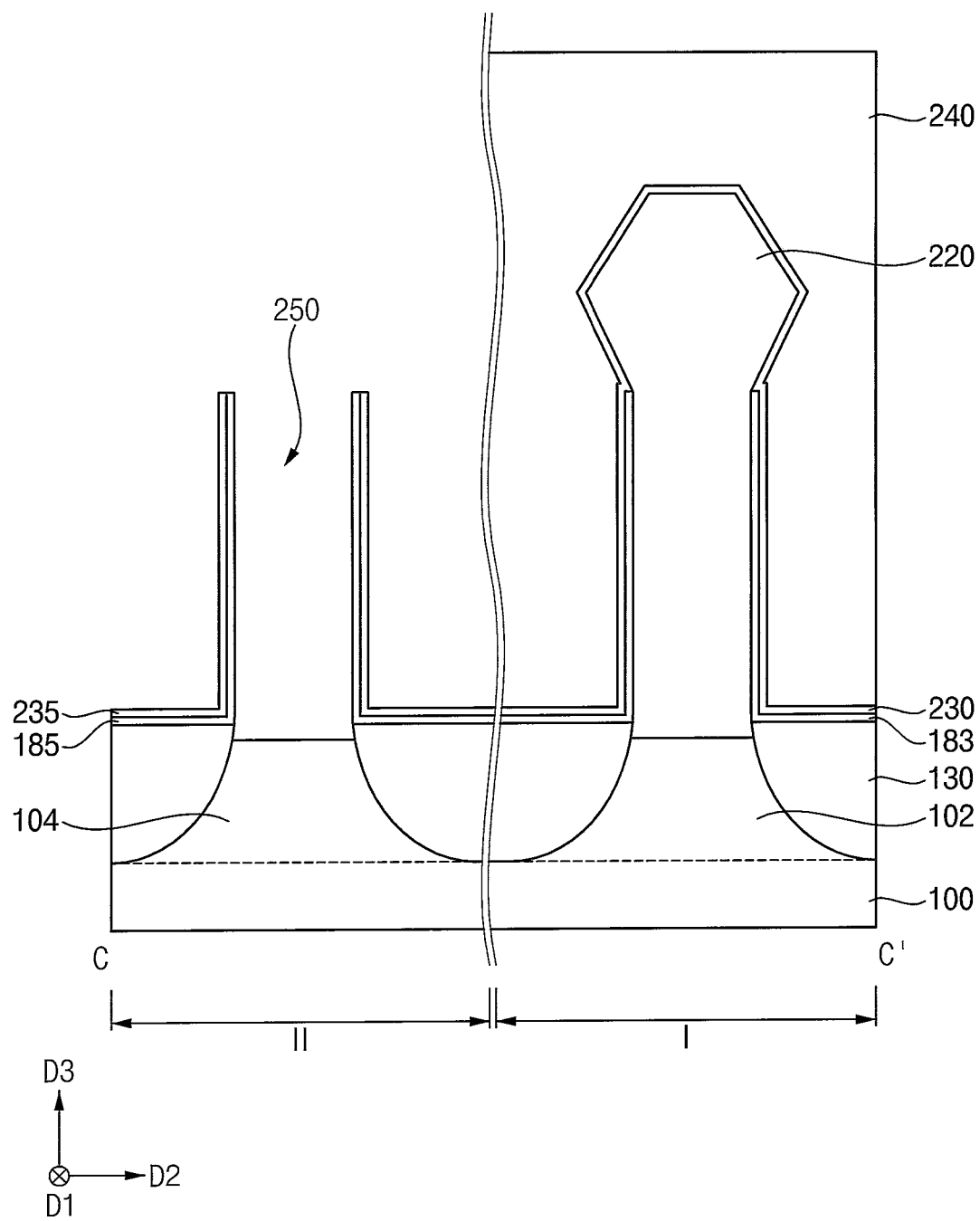
Figure 17:
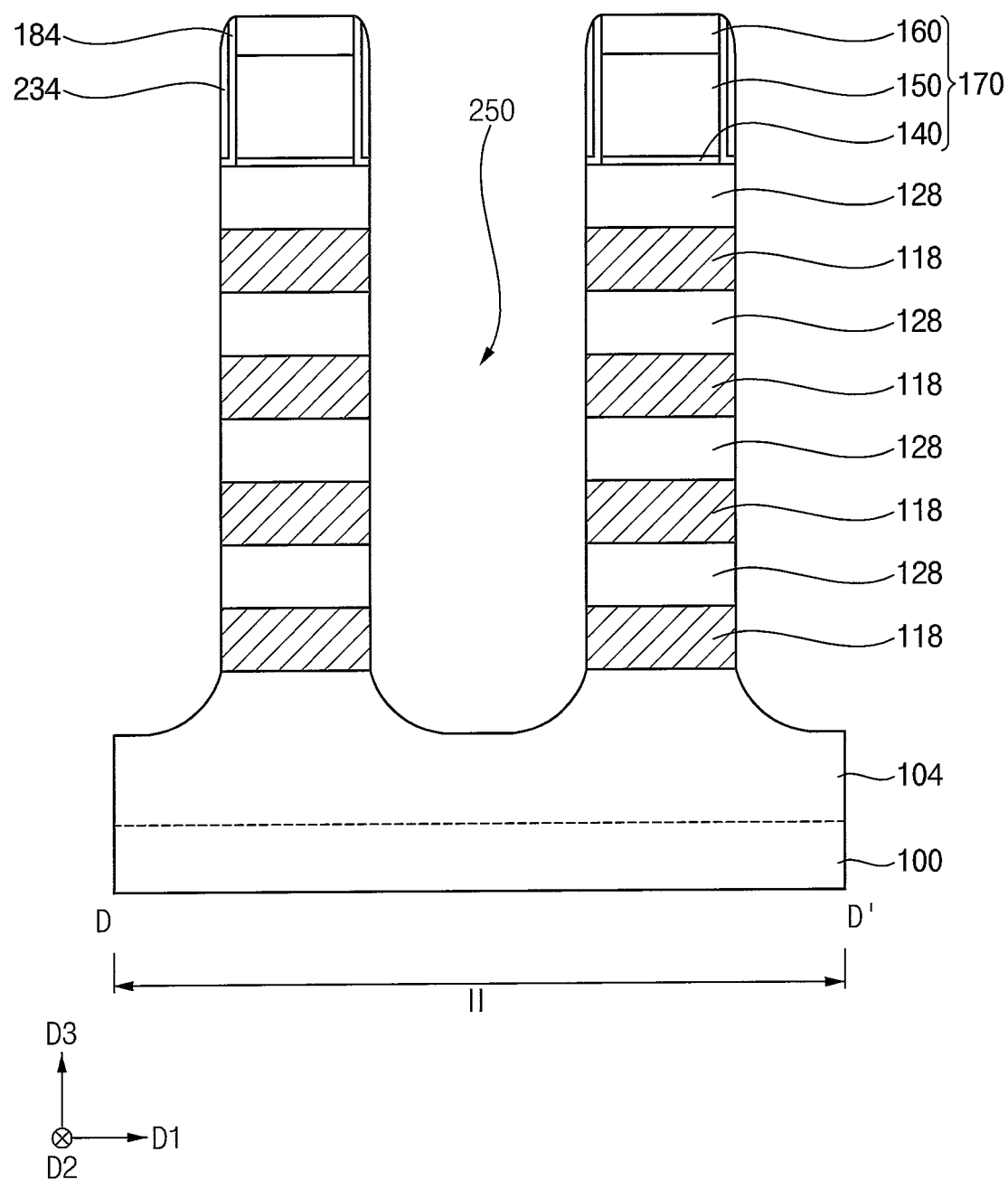

Referring to FIGS. 15 to 17, a fourth etching mask 240 may cover the first region I of the substrate 100, and the second sacrificial layer 230 and the first spacer layer 180 may be anisotropically etched to form a second sacrificial gate spacer 234 and a second gate spacer 184, respectively, on each of opposite sidewalls in the first direction D1 of a portion of the dummy gate structure 170 on the second region II of the substrate 100. A second fin spacer 185 and a second sacrificial fin spacer 235 may be formed on each of opposite sidewalls in the second direction D2 of a portion of the second stack structure not covered by the dummy gate structure 170 and a portion of the isolation pattern 130 adjacent to each of opposite sidewalls in the second direction D2 of the portion of the second stack structure on the second region II of the substrate 100.

The fourth etching mask 240 may include, e.g., SOH or ACL.

The second stack structure and an upper portion of the second active pattern 104 thereunder may be etched by an etching process using the dummy gate structure 170, the second gate spacer 184 and the second sacrificial gate spacer 234 as an etching mask to form a second opening 250 on the second region II of the substrate 100.

Thus, the second sacrificial lines 114 and the second semiconductor lines 124 under the dummy gate structure 170, the second gate spacer 184 and the second sacrificial gate spacer 234 may be transformed into second sacrificial patterns 118 and second semiconductor patterns 128, respectively, and the second stack structure extending in the first direction D1 may be divided into a plurality of parts spaced apart from each other in the first direction D1.

In an example embodiment of the present disclosure, a sidewall of the second opening 250 may be straight in the third direction D3. Thus, sidewalls in the first direction D1 of the second semiconductor patterns 128 may be substantially perpendicular to the upper surface of the substrate 100, and lengths in the first direction D1 of the second semiconductor patterns 128 may be constant in the third direction D3.

A portion of each of the second sacrificial patterns 118 adjacent to the second opening 250 may be removed to form a gap, and an inner spacer may be formed in the gap.

Figure 18:
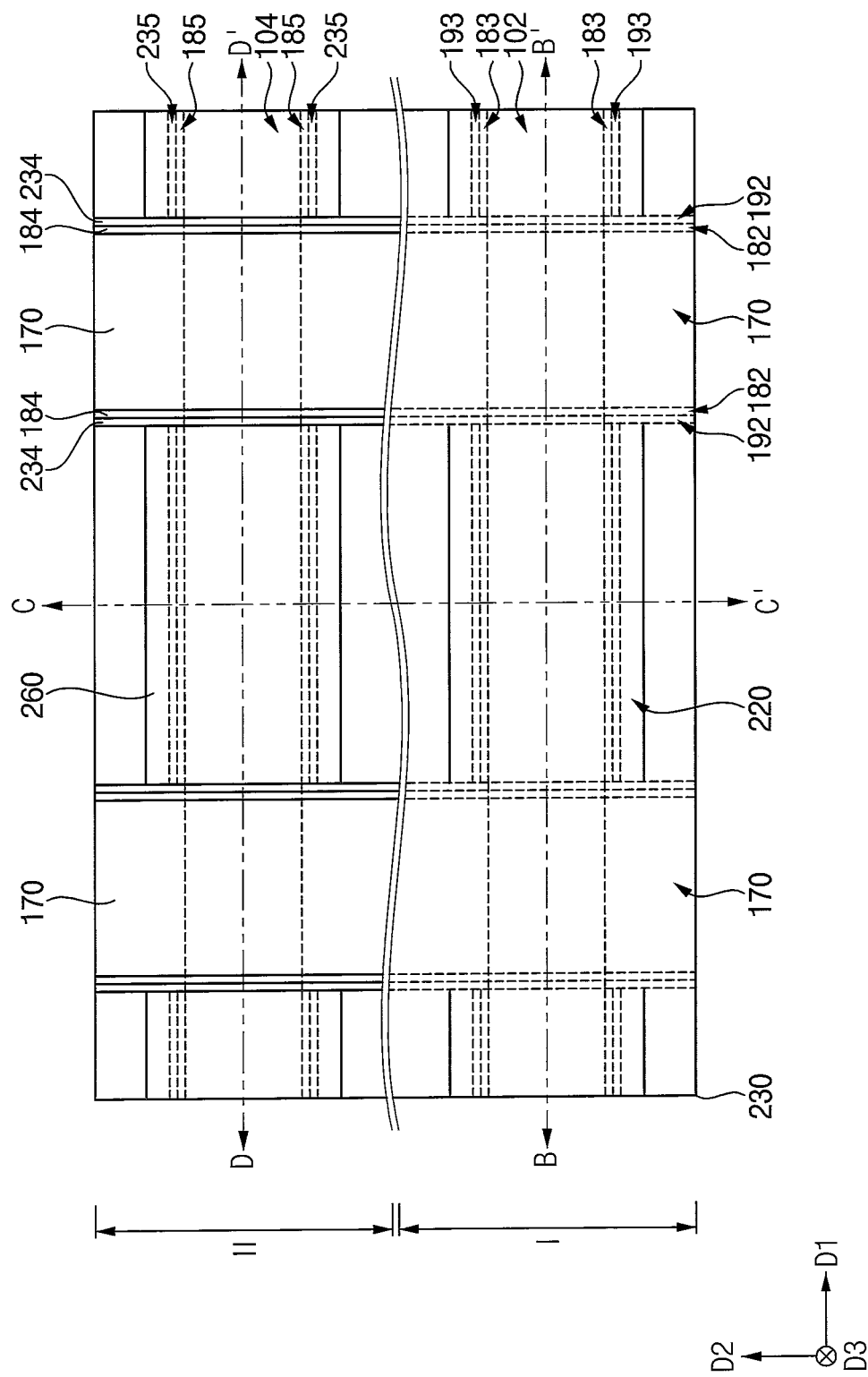
Figure 19:
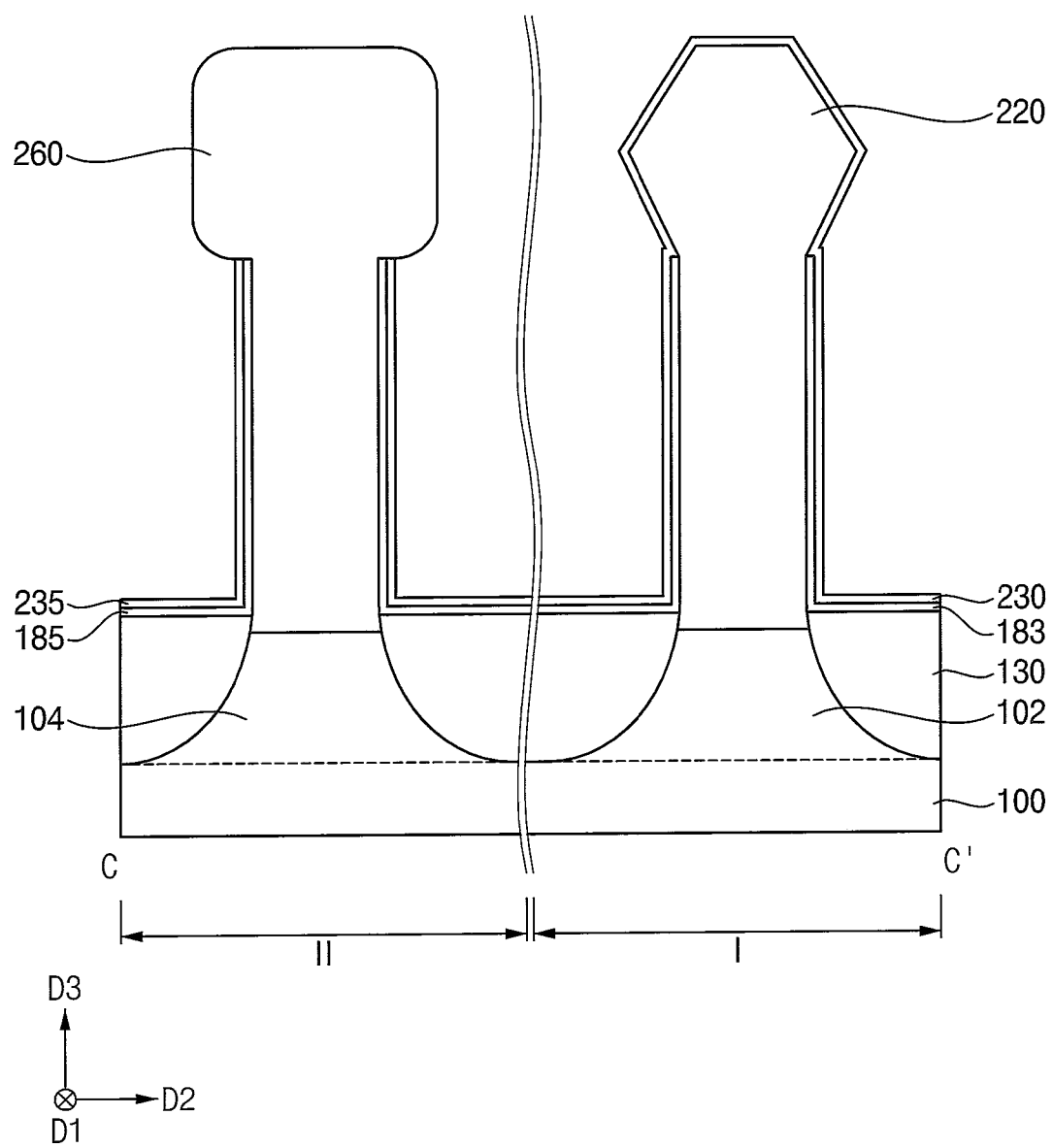
Figure 20:
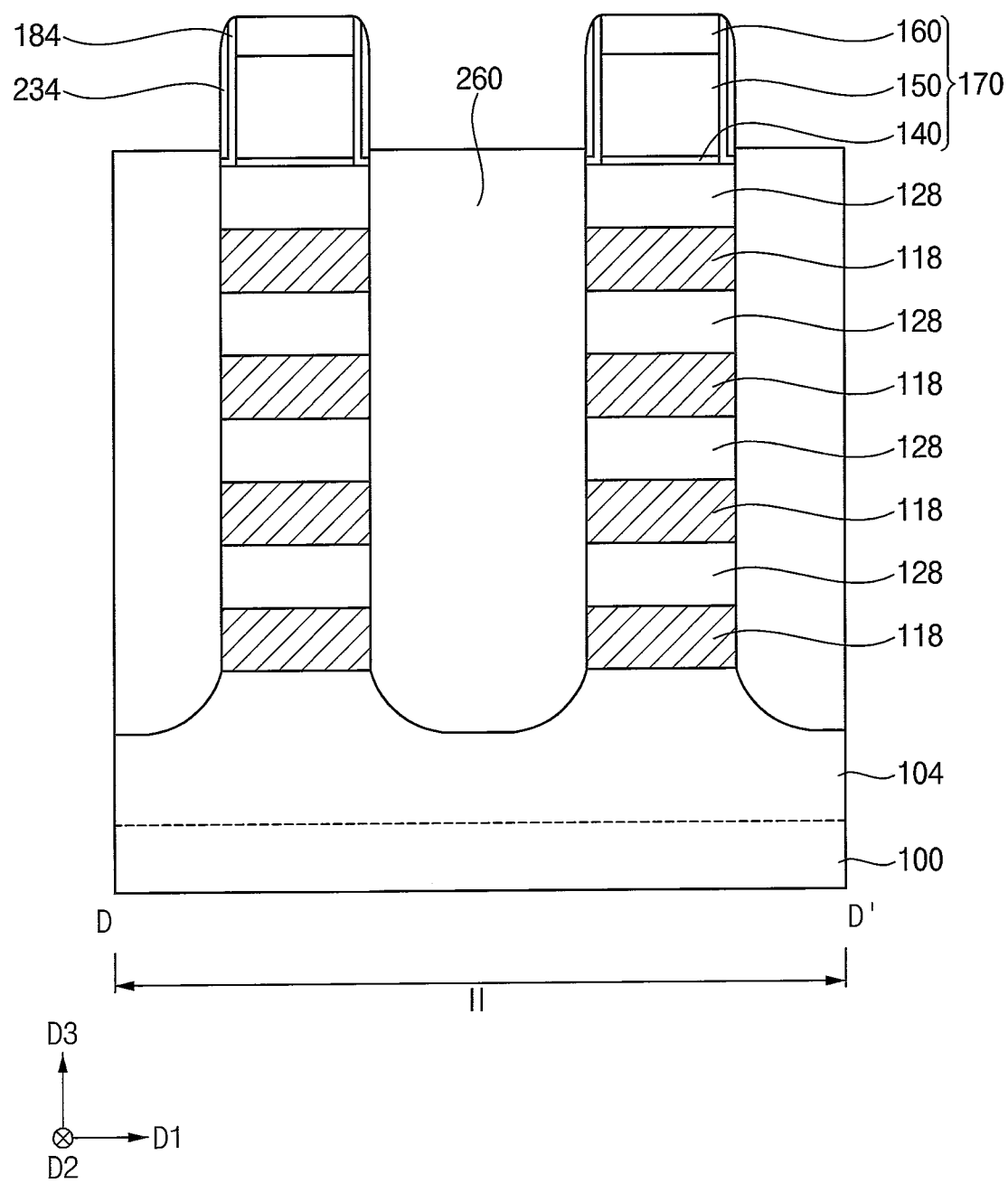

Referring to FIGS. 18 to 20, after removing the fourth etching mask 240, a cleansing process may be performed on an upper surface of the second active pattern 104 and sidewalls of the second semiconductor patterns 128 and the second sacrificial patterns 118 exposed by the second opening 250. The cleansing process may include a wet etching process using, e.g., hydrofluoric acid (HF).

A second SEG process may be performed using the upper surface of the second active pattern 104 and the sidewalls of the second semiconductor patterns 128 and the second sacrificial patterns 118 exposed by the second opening 250 as a seed to form a second source/drain layer 260 on an inner wall of the second opening 250.

In an example embodiment of the present disclosure, the second SEG process may be performed using a silicon source gas, e.g., disilane ($Si_2H_6$) gas and an n-type impurity source gas, e.g., $PH_3$, $POCl_3$, $P_2O_5$, etc., so that a single crystalline silicon layer doped with n-type impurities may be formed as the second source/drain layer 260. In an example embodiment of the present disclosure, an upper portion of the second source/drain layer 260 may contact an outer sidewall of the second sacrificial gate spacer 234.

Hereinafter, a portion of the second source/drain layer 260 in the second opening 250 may be referred to as a lower portion of the second source/drain layer 260, and a portion of the second source/drain layer 260 protruding upwardly from the second opening 250 may be referred to as an upper portion of the second source/drain layer 260.

In example embodiments of the present disclosure, a cross-section of the upper portion of the second source/drain layer 260 taken along the second direction D2 may have a shape of a rectangle with rounded corners. As used herein, the term "rectangle with rounded corners" is understood to be a shape that is not a rectangle but is rather a shape that looks as if the corners of a rectangle have all been replaced with rounded segments.

Figure 21:
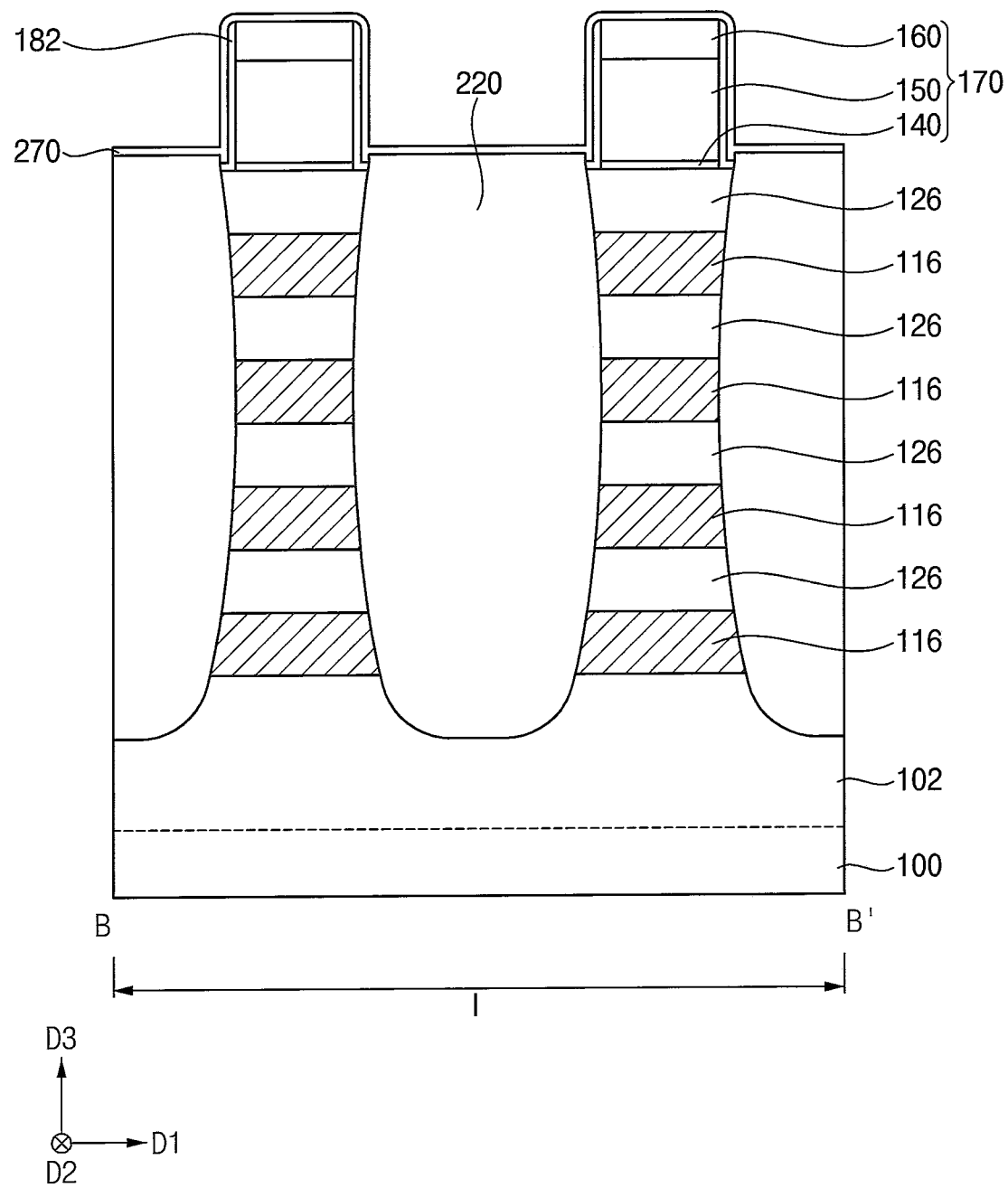
Figure 22:
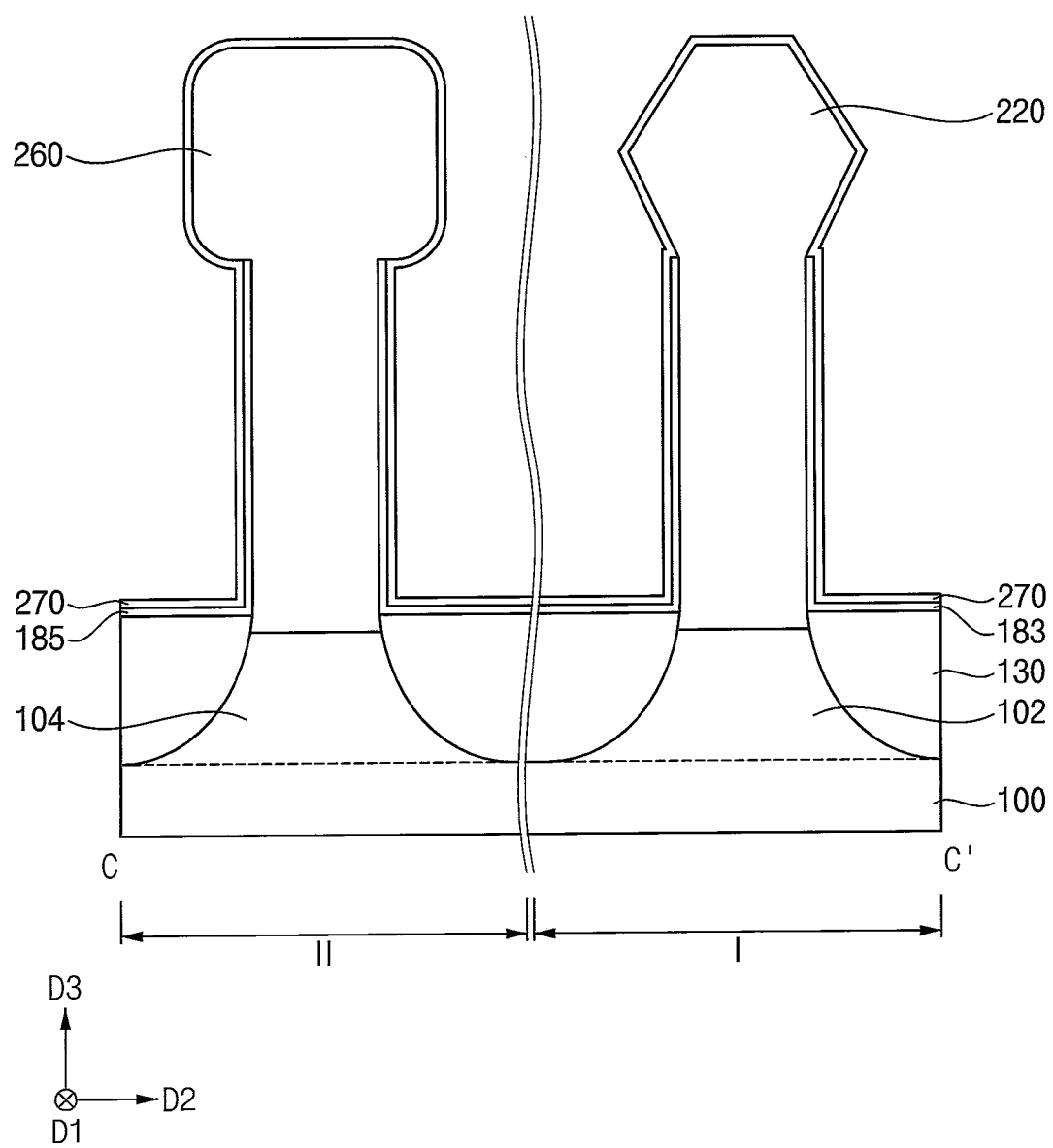
Figure 23:
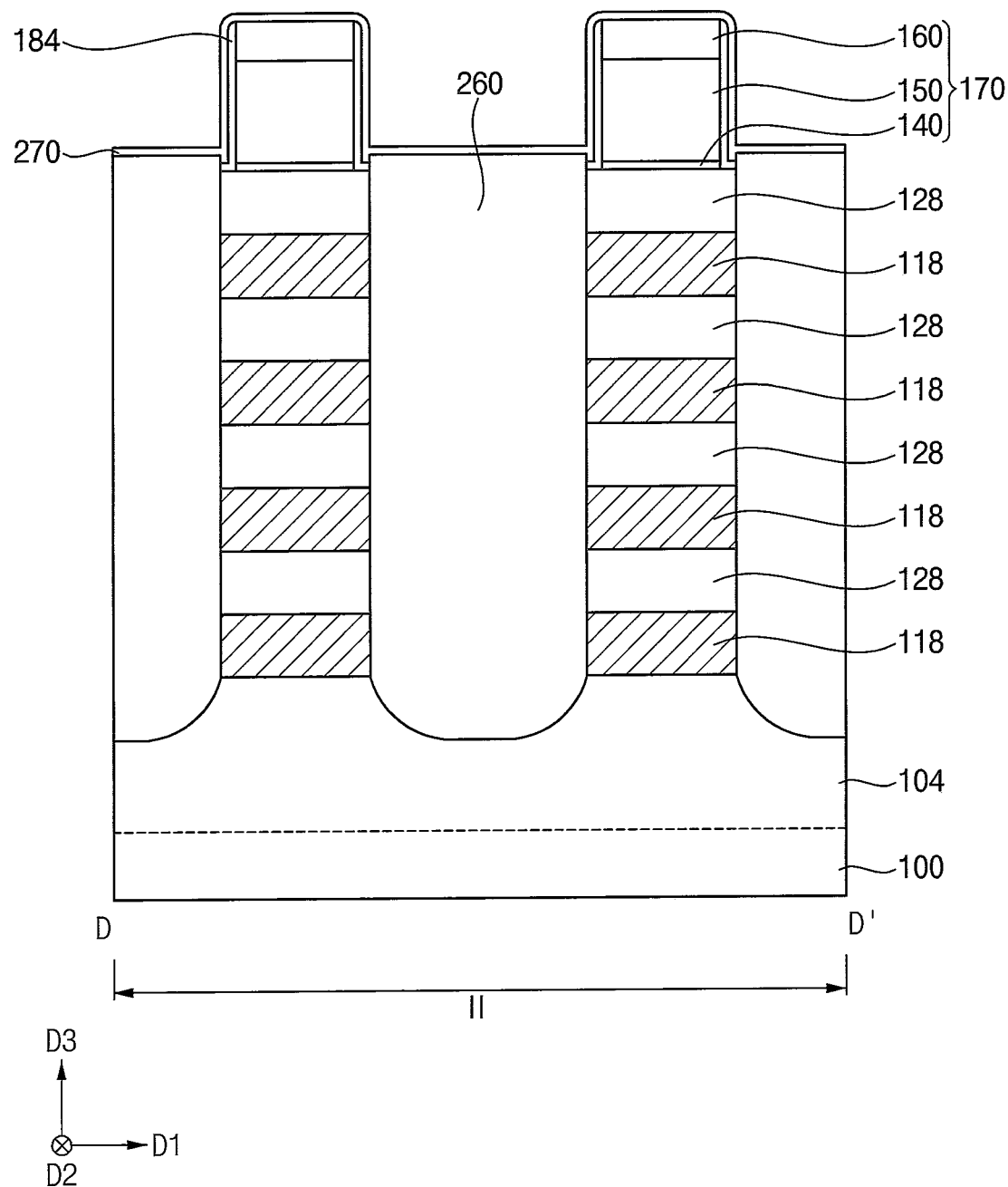

Referring to FIGS. 21 to 23, the second sacrificial gate spacer 234 and the second sacrificial fin spacer 235 on the second region II of the substrate 100 and the second sacrificial spacer layer 230 remaining on the first region I of the substrate 100 may be removed by performing a wet etching process using, e.g., phosphoric acid ($H_3PO_4$), and an etch stop layer 270 may be entirely formed on the first and second regions I and II of the substrate 100.

Thus, the etch stop layer 270 may be formed on the dummy gate structure 170, the first gate spacer 182, the first fin spacer 183 and the first source/drain layer 220 on the first region I of the substrate 100, and on the dummy gate structure 170, the second gate spacer 184, the second fin spacer 185 and the source/drain layer 260 on the second region II of the substrate 100. The etch stop layer 270 may include, e.g., silicon nitride.

Figure 24:
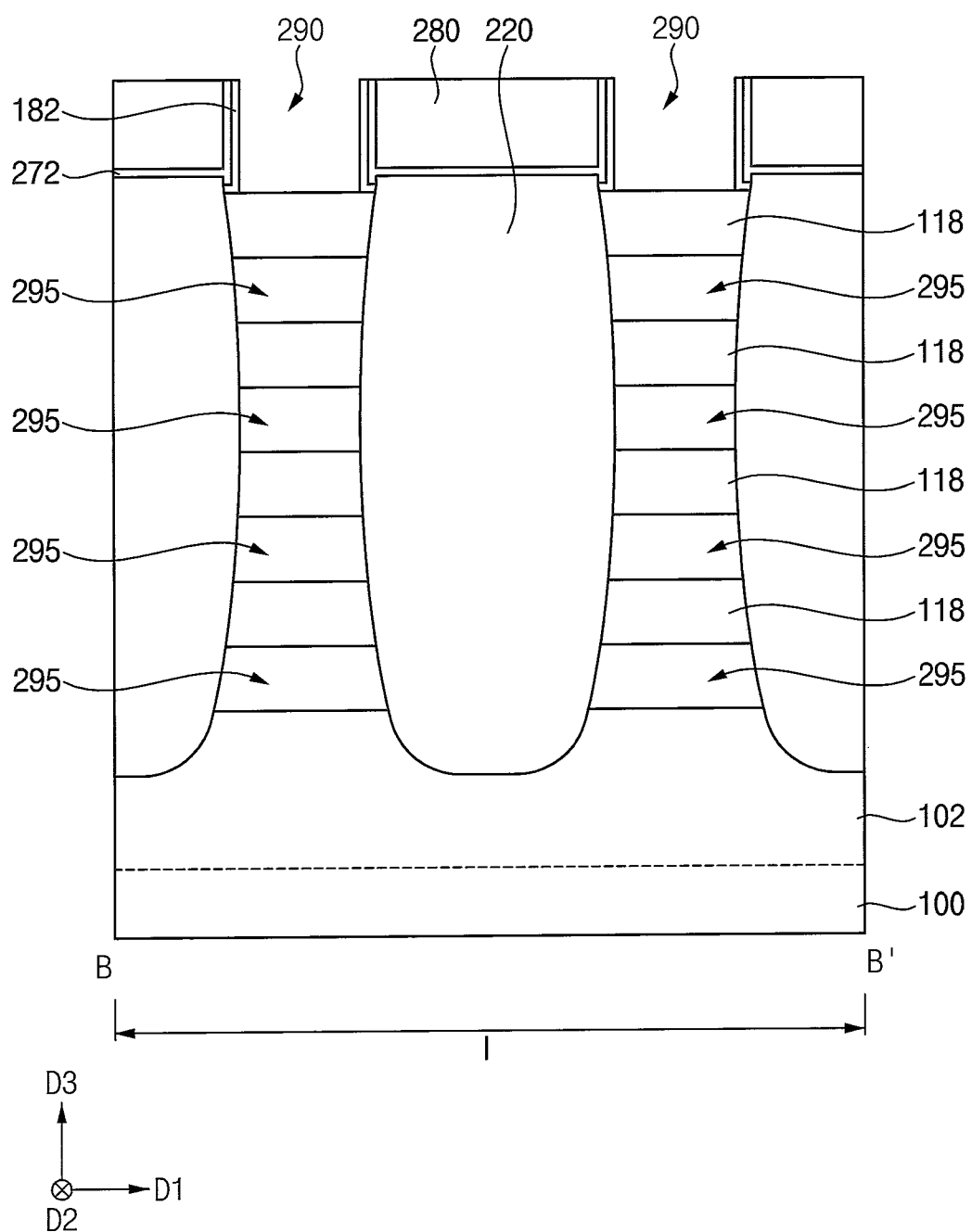
Figure 25:
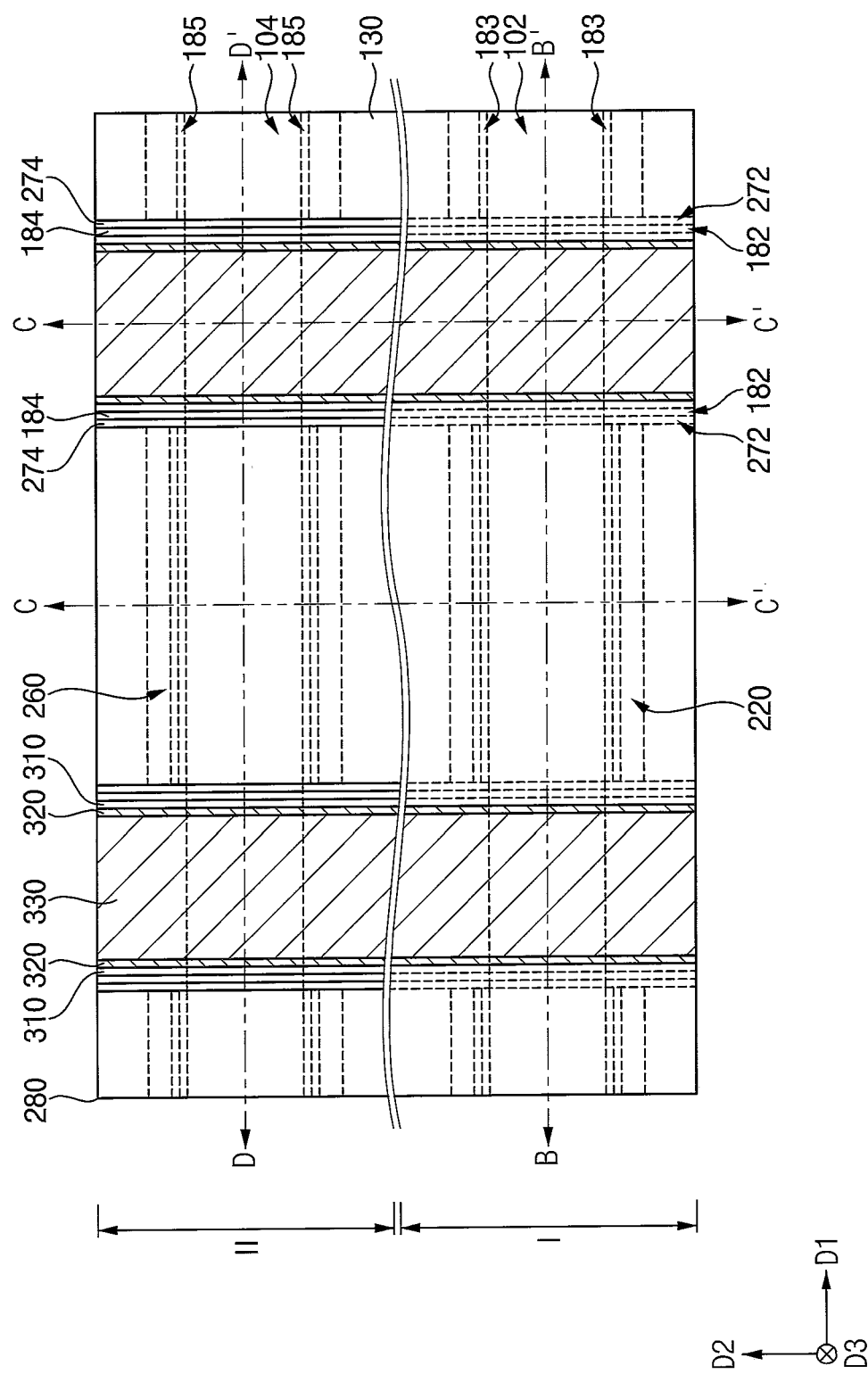

Referring to FIG. 24, an insulating interlayer 280 may be formed on the substrate 100 having the above-mentioned structures thereon and may be planarized until an upper surface of the dummy gate electrode 150 of the dummy gate structure 170 is exposed. During the planarization process, the dummy gate mask 160 may also be removed, and upper portions of the first and second gate spacers 182 and 184 may be partially removed.

A portion of the etch stop layer 270 remaining on a sidewall of the first gate spacer 182 and an upper surface of the first source/drain layer 220 may be referred to as a first etch stop pattern 272, and a portion of the etch stop layer 270 remaining on a sidewall of the second gate spacer 184 and an upper surface of the second source/drain layer 260 may be referred to as a second etch stop pattern 274.

The exposed dummy gate electrode 150, the dummy gate insulation pattern 140, and the first and second sacrificial patterns 116 and 118 may be removed by, e.g., a wet etching process and/or a dry etching process to form a third opening 290 exposing an inner sidewall of the first gate spacer 182 and an upper surface of an uppermost one of the first semiconductor patterns 126, or exposing an inner sidewall of the second gate spacer 184 and an upper surface of an uppermost one of the second semiconductor pattern 128, and to form a fourth opening 295 exposing a sidewall of the first source/drain layer 220, surfaces of the first semiconductor patterns 126 and an upper surface of the first active pattern 102, or exposing a sidewall of the second source/drain layer 260, surfaces of the second semiconductor patterns 128 and an upper surface of the second active pattern 104.

Referring to FIGS. 25 to 29, a gate structure 340 may be formed on the substrate 100 to fill the third and fourth openings 290 and 295.

For example, a thermal oxidation process may be performed on the upper surface of the first and second active patterns 102 and 104, the surfaces of the first and second semiconductor patterns 126 and 128, and the sidewalls of the first and second source/drain layers 220 and 260 exposed by the third and fourth openings 290 and 295 to form an interface pattern 300, a gate insulation layer and a gate barrier layer may be sequentially and conformally formed on a surface of the interface pattern 300, the inner sidewalls and upper surfaces of the first and second gate spacers 182 and 184 and an upper surface of the insulating interlayer 280, and a gate electrode layer may fill remaining portions of the third and fourth openings 290 and 295.

The gate insulation layer, the gate barrier layer and the gate electrode layer may be formed by, e.g., a CVD process, an ALD process, a PVD process, etc. In some embodiments, the interface pattern 300 may be formed by performing a CVD process, an ALD process, etc., instead of the thermal oxidation process, and may also be formed on the inner sidewalls and the upper surfaces of the first and second gate spacers 182 and 184 and the upper surface of the insulating interlayer 280.

The gate electrode layer, the gate barrier layer and the gate insulation layer may be planarized until the upper surface of the insulating interlayer 280 is exposed, so that gate electrode 330, a gate barrier 320, and a gate insulation pattern 310 may be formed. The interface pattern 300, the gate insulation pattern 310, the gate barrier 320, and the gate electrode 330 may form the gate structure 340.

The interface pattern 300 may include an oxide, e.g., silicon oxide, the gate insulation pattern 310 may include a metal oxide having a high dielectric constant, e.g., hafnium oxide, tantalum oxide, zirconium oxide, etc.

The gate barrier 320 may include a metal nitride, e.g., titanium nitride, titanium aluminum nitride, tantalum nitride, tantalum aluminum nitride, etc., the gate electrode 330 may include a low resistance metal, e.g., tungsten, aluminum, copper, tantalum, or a metal alloy, a metal carbide, a metal oxynitride, a metal carbonitride, a metal oxycarbonitride, etc., e.g., titanium aluminum, titanium aluminum carbide, titanium aluminum oxynitride, titanium aluminum carbonitride, titanium aluminum oxycarbonitride, etc. In an example embodiment of the present disclosure, the gate electrode 330 may have a plurality of conductive patterns sequentially stacked and including different materials.

An upper insulating interlayer, a contact plug and an upper wiring may be further formed to complete the fabrication of the semiconductor device.

In the semiconductor device, a portion of the gate structure 340 on the first region I of the substrate 100, the first source/drain layer 220 and the first semiconductor patterns 126, which may serve as channels and may also be referred to as first channels, respectively, may form a PMOS transistor. The first semiconductor patterns 126 may be arranged in the third direction D3, and thus the semiconductor device may be a multi bridge channel field effect transistor (MBCFET). A portion of the gate structure 340 on the second region II of the substrate 100, the second source/drain layer 260 and the second semiconductor patterns 128, which may serve as channels and may also be referred to as second channels, respectively, may form an NMOS transistor. The second semiconductor patterns 128 may be arranged in the third direction D3, and thus the semiconductor device may also be an MBCFET.

As illustrated above, the first sacrificial layer 190 that may be easily removed by, e.g., phosphoric acid ($H_3PO_4$) may be formed on the first spacer layer 180, the first sacrificial layer 190 and the first spacer layer 180 may be anisotropically etched on the first region I of the substrate 100 to form the first sacrificial gate spacer 192 and the first gate spacer 182, respectively, and the first stack structure may be etched using the first gate spacer 182 and the first sacrificial gate spacer 192 as an etching mask to form the first opening 210. The first source/drain layer 220 may be formed in the first opening 210 by the first SEG process, the first sacrificial gate spacer 192 may be removed, and the second sacrificial spacer layer 230 may cover the first source/drain layer 220.

The second sacrificial spacer layer 230 and the first spacer layer 180 and may be anisotropically etched on the second region II of the substrate 100 to form the second sacrificial gate spacer 234 and the second gate spacer 184, respectively, and the second stack structure may be etched using the second gate spacer 184 and the second sacrificial gate spacer 234 as an etching mask to form the second opening 250. The second source/drain layer 260 may be formed in the second opening 250 by the second SEG process, the second sacrificial gate spacer 234 may be removed, and the etch stop layer 270 may cover the first and second source/drain layers 220 and 260.

Thus, when the first and second openings 210 and 250 are formed, only the first gate spacer 182 and the first sacrificial gate spacer 192 have been formed, or only the second gate spacer 184 and the second sacrificial gate spacer 234 have been formed on the sidewalls of the dummy gate structure 170, the first and second stack structures and/or the first source/drain layer 220, and thus a spacer structure including several layers stacked on the sidewalls thereof. Accordingly, even if distances between the above structures decrease, process margin of etching processes for forming the structures may increase, so that the etching processes may be more easily performed.

The semiconductor device manufactured by the above processes may have the following characteristics:

In example embodiments of the present disclosure, the semiconductor device may include the first channels 126 spaced apart from each other in the third direction D3 on the first region I of the substrate 100 including the first and second regions I and II; the second channels 128 spaced apart from each other in the third direction D3 on the second region II of the substrate 100; a portion of the gate structure 340 at least partially covering a surface of each of the first channels 126 on the first region I of the substrate 100 (hereinafter, referred to as a first gate structure); a portion of the gate structure 340 at least partially covering a surface of each of the second channels 128 on the second region II of the substrate 100 (hereinafter, referred to as a second gate structure); the first source/drain layer 220 contacting the first channels 126 on a portion of the first region I of the substrate 100 adjacent to the first gate structure; the second source/drain layer 260 contacting the second channels 128 on a portion of the second region II of the substrate 100 adjacent to the second gate structure; the first gate spacer 182 covering each of opposite sidewalls of the first gate structure; the second gate spacer 184 covering each of opposite sidewalls of the second gate structure; the first etch stop pattern 272 contacting the first gate spacer 182 and the first source/drain layer 220; and the second etch stop pattern 274 contacting the second gate spacer 184 and the second source/drain layer 260.

In example embodiments of the present disclosure, a portion of the first gate spacer 182 contacting the first source/drain layer 220 may have a lowermost surface that is lower than an uppermost surface of the first source/drain layer 220 and may contact an upper sidewall of the first source/drain layer 220. A portion of the second gate spacer 184 contacting the second source/drain layer 260 may have a lowermost surface that is lower than an uppermost surface of the second source/drain layer 260 and may contact an upper sidewall of the second source/drain layer 260.

In example embodiments of the present disclosure, the first active pattern 102 extending in the first direction D1 may be formed on the first region I of the substrate 100, the second active pattern 104 extending in the first direction D1 may be formed on the second region II of the substrate 100, and the isolation pattern 130 covering sidewalls of the first and second active patterns 102 and 104 may be formed on the first and second regions I and II of the substrate 100.

In example embodiments of the present disclosure, the first channels 126 and the first source/drain layer 220 may be formed on the first active pattern 102, and the second channels 128 and the second source/drain layer 260 may be formed on the second active pattern 104.

In example embodiments of the present disclosure, the first gate structure may extend in the second direction D2 on the first active pattern 102 and the isolation pattern 130, and the second gate structure may extend in the second direction D2 on the second active pattern 104 and the isolation pattern 130. The first gate spacer 182 may cover each of opposite sidewalls in the first direction D1 of the first gate structure, and the second gate spacer 184 may cover each of opposite sidewalls in the first direction D1 of the second gate structure.

In example embodiments of the present disclosure, the first etch stop pattern 272 may cover an upper surface of the first source/drain layer 220 and a sidewall in the first direction D1 of the first gate spacer 182, and the second etch stop pattern 274 may cover an upper surface of the second source/drain layer 260 and a sidewall in the first direction D1 of the second gate spacer 184.

In example embodiments of the present disclosure, the first etch stop pattern 272 may contact an upper portion of a sidewall in the first direction D1 of the first source/drain layer 220, and the second etch stop pattern 274 may contact an upper portion of a sidewall in the first direction D1 of the second source/drain layer 260.

In example embodiments of the present disclosure, an upper portion of the first source/drain layer 220 may have a cross-section taken along the second direction D2, which may have a shape of a pentagon or hexagon, and an upper portion of the second source/drain layer 260 may have a cross-section taken along the second direction D2, which may have a shape of a rectangle with rounded corners.

In example embodiments of the present disclosure, the first etch stop pattern 272 may cover a sidewall in the second direction D2 of the upper portion of the first source/drain layer 220, and the second etch stop pattern 274 may cover a sidewall in the second direction D2 of the upper portion of the second source/drain layer 260.

In example embodiments of the present disclosure, the first fin spacer 183 may cover each of opposite sidewalls in the second direction D2 of a lower portion of the first source/drain layer 220 and may contact an upper surface of a portion of the isolation pattern 130 adjacent to the first source/drain layer 220 in the second direction D2. The second fin spacer 185 may cover each of opposite sidewalls in the second direction D2 of a lower portion of the second source/drain layer 220 and may contact an upper surface of a portion of the isolation pattern 130 adjacent to the second source/drain layer 260 in the second direction D2.

To this point, the first spacer layer 180 is formed to cover the dummy gate structure 170, and thus the first and second gate spacers 182 and 184 and the first and second fin spacers 183 and 185 are formed on the lower sidewalls of the gate structure 340 and the first and second source/drain layers 220 and 260, respectively, however, the inventive concept is not necessarily limited thereto. For example, an additional spacer layer may cover the dummy gate structure 170 before forming the first spacer layer 180. In this case, the additional spacer layer may be etched, so that additional gate spacers and additional fin spacers may be formed on the lower sidewalls of the gate structure 340 and the first source/drain layer 220.

FIGS. 30 to 33 are cross-sectional views illustrating a method of manufacturing a semiconductor device in accordance with example embodiments of the present disclosure. This method may include processes substantially the same as or similar to those illustrated with reference to FIGS. 1 to 29, and thus to the extent that some elements/method steps are not described in detail below, it may be understood that these elements/method steps are at least similar to corresponding elements/method steps that are described in detail elsewhere within the instant specification.

Figure 30:
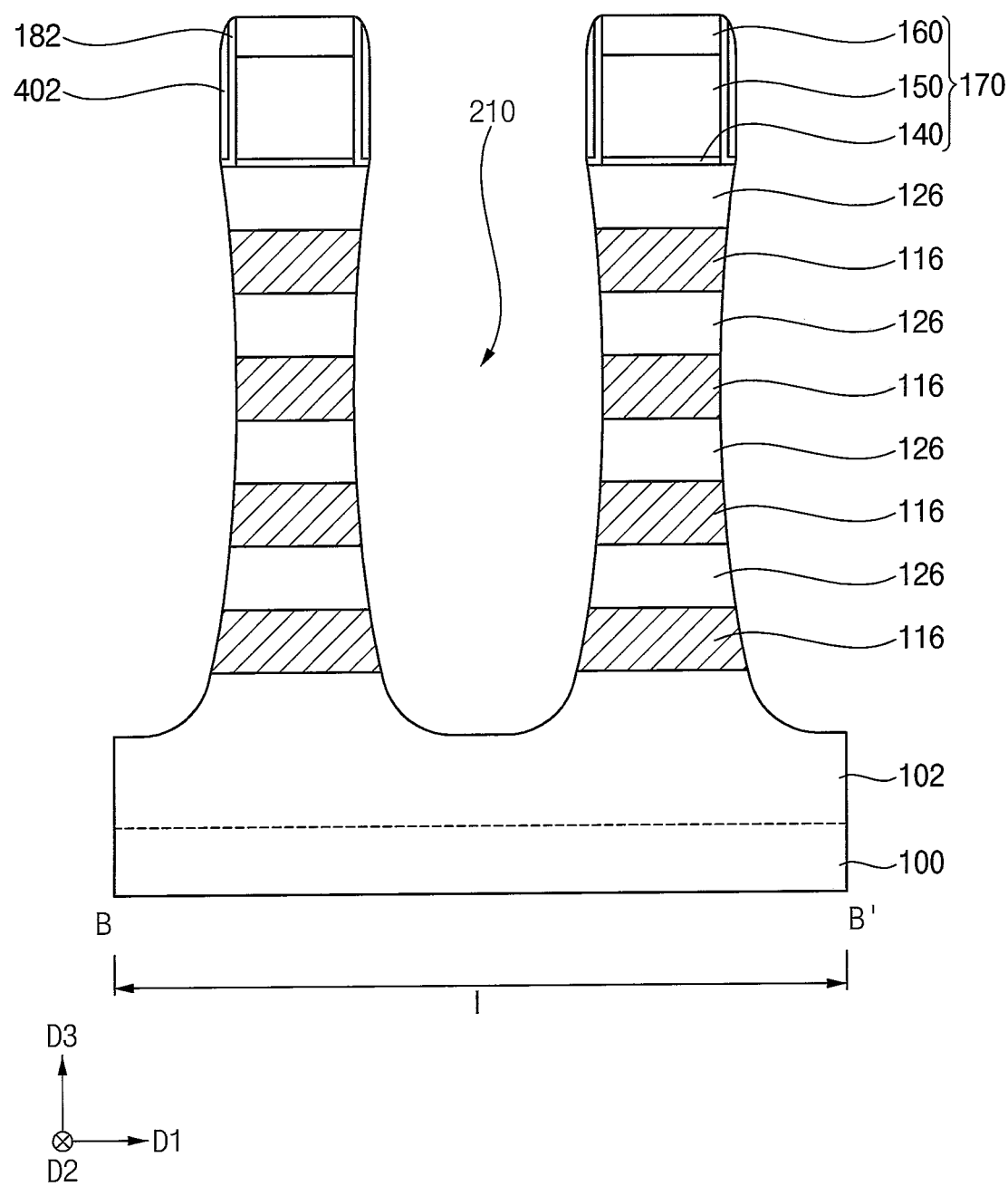
FIGS. 30 to 33 are cross-sectional views illustrating a method of manufacturing a semiconductor device in accordance with example embodiments of the present disclosure.
Figure 31:
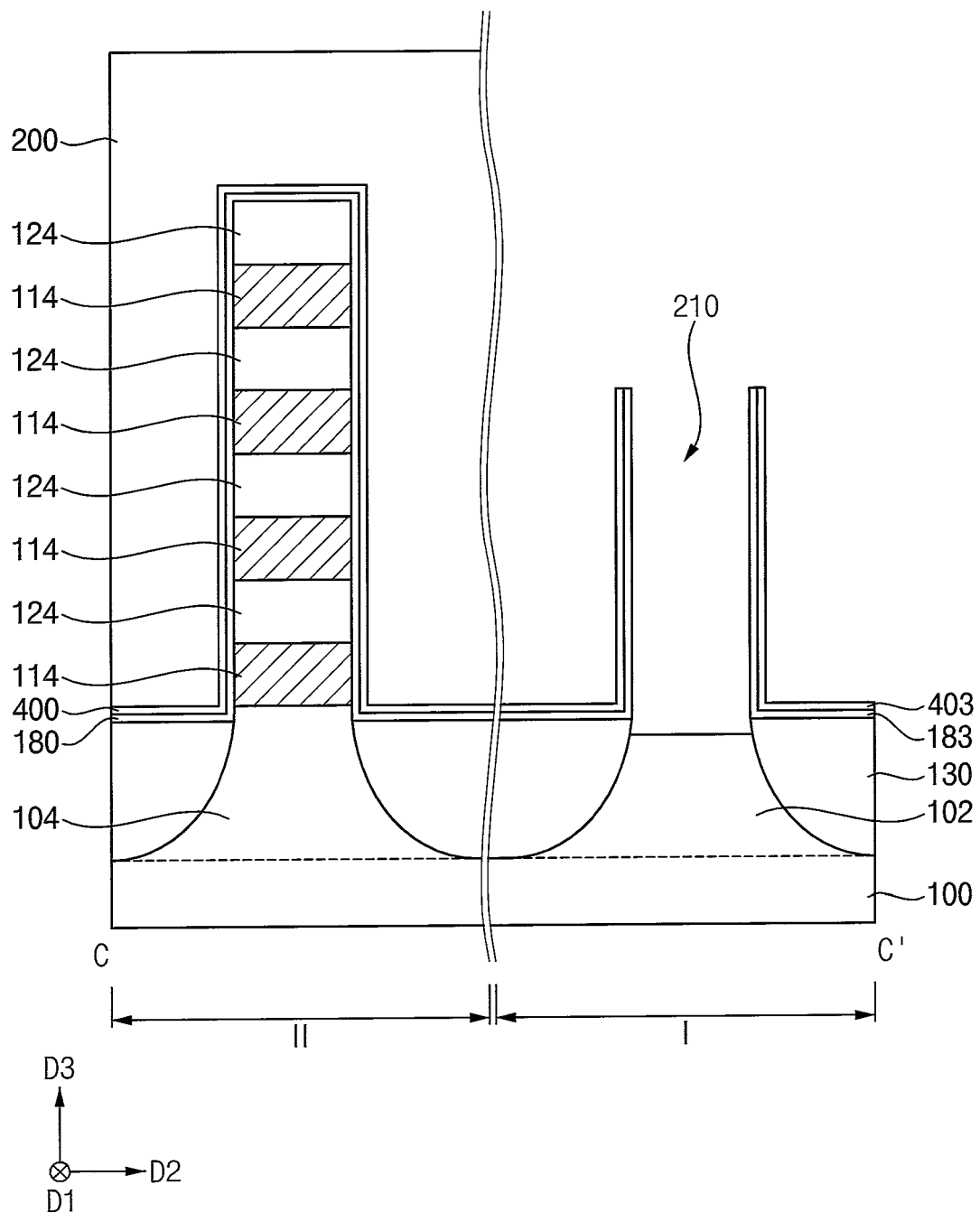

Referring to FIGS. 30 and 31, processes substantially the same as or similar to those illustrated with reference to FIGS. 1 to 5 may be performed, and processes similar to those illustrated with reference to FIGS. 6 to 8 may be performed.

However, a third sacrificial spacer layer 400, instead of the first sacrificial layer 190, may be formed on the first spacer layer 180. In example embodiments of the present disclosure, the second sacrificial layer 230 may include, e.g., silicon oxide.

Thus, the first gate spacer 182 and a third sacrificial gate spacer 402 may be formed by an anisotropical etching process to cover each of opposite sidewalls in the first direction D1 of a portion of the dummy gate structure 170 on the first region I of the substrate 100, and the first fin spacer 183 and a third sacrificial fin spacer 403 may be formed on each of opposite sidewalls in the second direction D2 of a portion of the first stack structure not covered by the dummy gate structure 170 and a portion of the isolation pattern 130 adjacent thereto on the first region I of the substrate 100.

The first stack structure and an upper portion of the first active pattern 102 thereunder on the first region I of the substrate 100 may be etched using the dummy gate structure 170, the first gate spacer 182 and the third sacrificial gate spacer 402 as an etching mask to form the first opening 210, and the first sacrificial lines 112 and the first semiconductor lines 122 under the dummy gate structure 170, the first gate spacer 182 and the first sacrificial gate spacer 192 may be transformed into first sacrificial patterns 116 and first semiconductor patterns 126, respectively.

Figure 32:
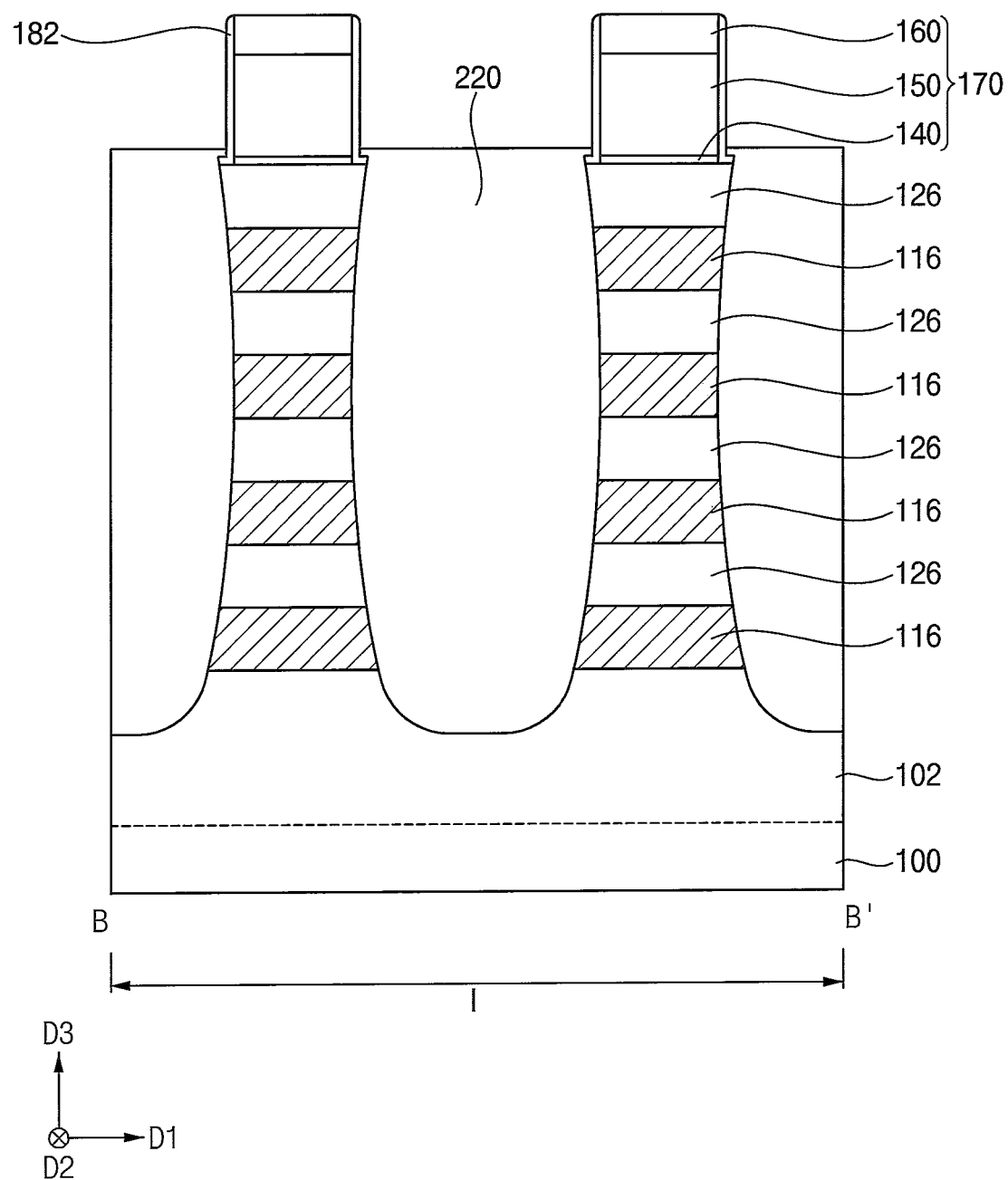
Figure 33:
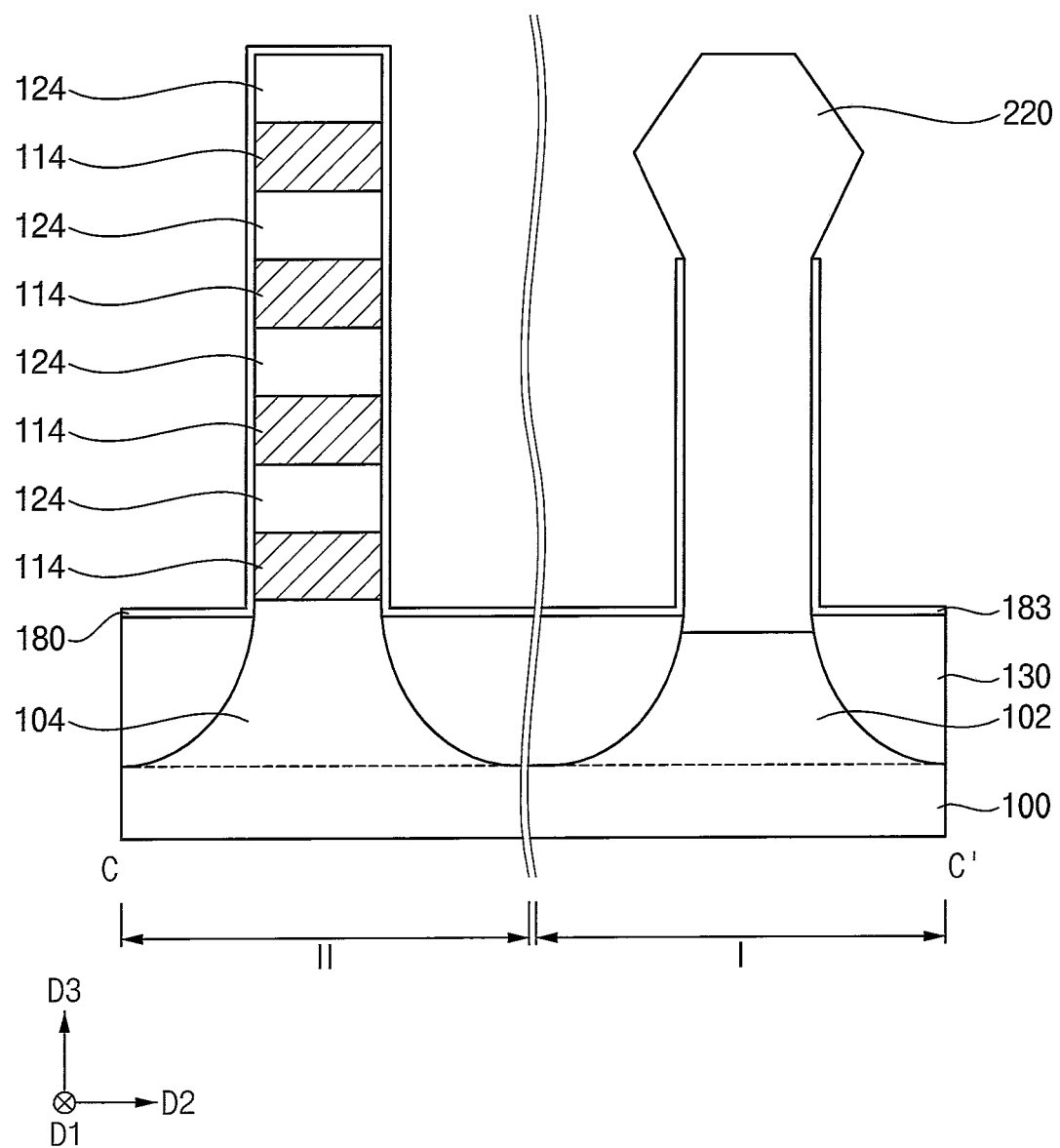

Referring to FIGS. 32 and 33, the cleansing process illustrated with reference to FIGS. 9 to 14 may be performed, and the first SEG process may be performed to form the first source/drain layer 220 on the inner wall of the first opening 210.

However, when the cleansing process is performed using the hydrofluoric acid (HF), the third sacrificial gate spacer 402, the third sacrificial fin spacer 403 and the third sacrificial spacer layer 400 that may include, e.g., silicon oxide may be removed.

Processes substantially the same as or similar to those illustrated with reference to FIGS. 12 to 14 may be performed.

However, the third sacrificial gate spacer 402, the third sacrificial fin spacer 403 and the third sacrificial spacer layer 400 have been removed through the cleansing process, and thus no additional wet etching process using phosphoric acid ($H_3PO_4$) is needed, and the second sacrificial spacer layer 230 may be formed on the first and second regions I and II of the substrate 100.

Accordingly, the second sacrificial spacer layer 230 may be formed on the dummy gate structure 170, the first gate spacer 182, the first fin spacer 183 and the first source/drain layer 220 on the first region I of the substrate 100 and may also be formed on the first spacer layer 180 on the second region II of the substrate 100.

Processes substantially the same as or similar to those illustrated with reference to FIGS. 15 to 29 may be performed to complete the fabrication of the semiconductor device.

As illustrated above, instead of the first sacrificial spacer layer 190, the third sacrificial spacer layer 400 that may be removed during the first cleansing process may be formed. Thus, even though the additional etching process for removing the first sacrificial spacer layer 190 is not performed, the semiconductor device substantially the same as that of FIGS. 25 to 29 may be manufactured.

FIGS. 34 to 50 are cross-sectional views illustrating a method of manufacturing a semiconductor device in accordance with example embodiments of the present disclosure. This method may include processes substantially the same as or similar to those illustrated with reference to FIGS. 1 to 29, and thus to the extent that some elements/method steps are not described in detail below, it may be understood that these elements/method steps are at least similar to corresponding elements/method steps that are described in detail elsewhere within the instant specification.

Figure 34:
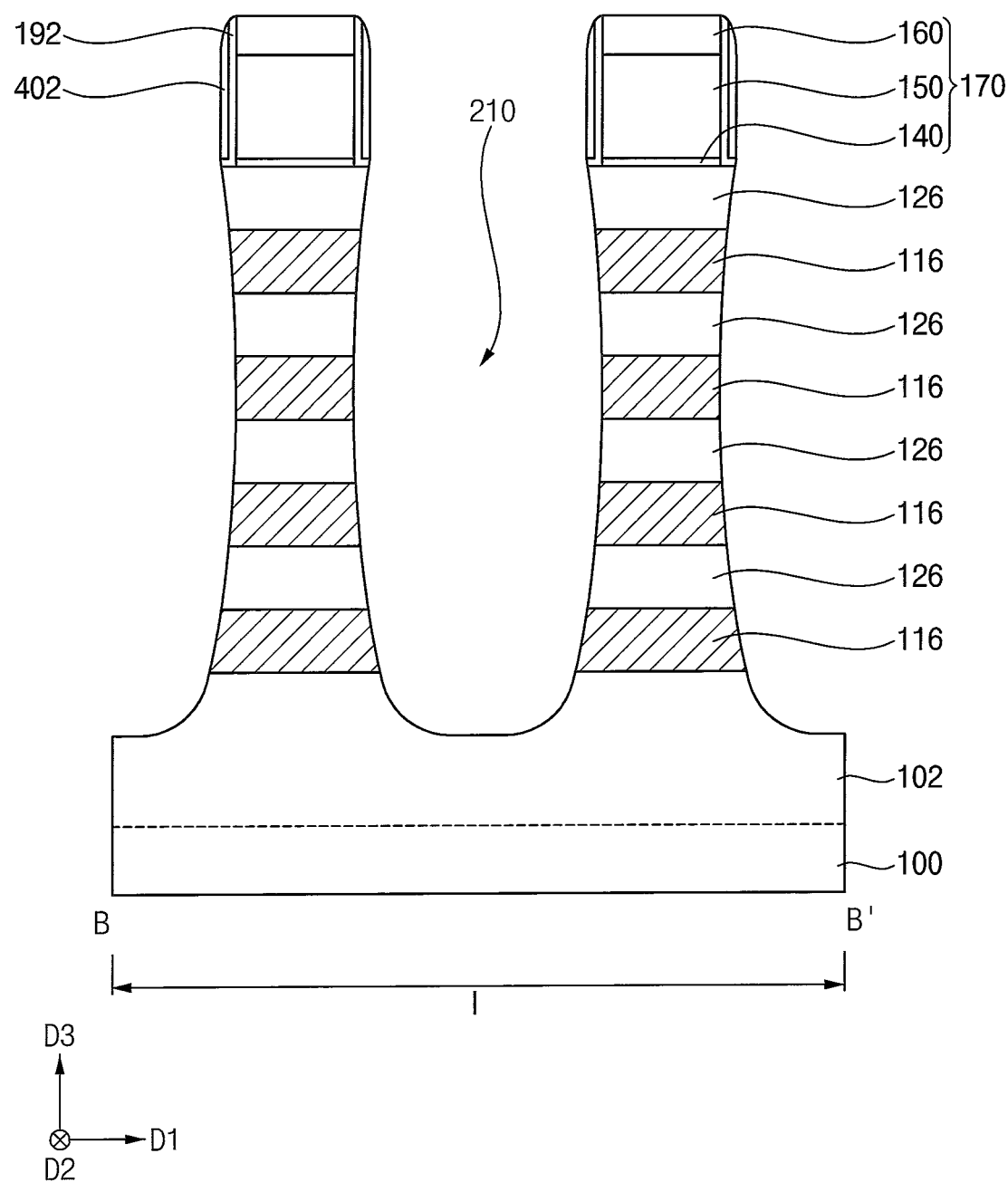
FIGS. 34 to 50 are cross-sectional views illustrating a method of manufacturing a semiconductor device in accordance with example embodiments of the present disclosure.
Figure 35:
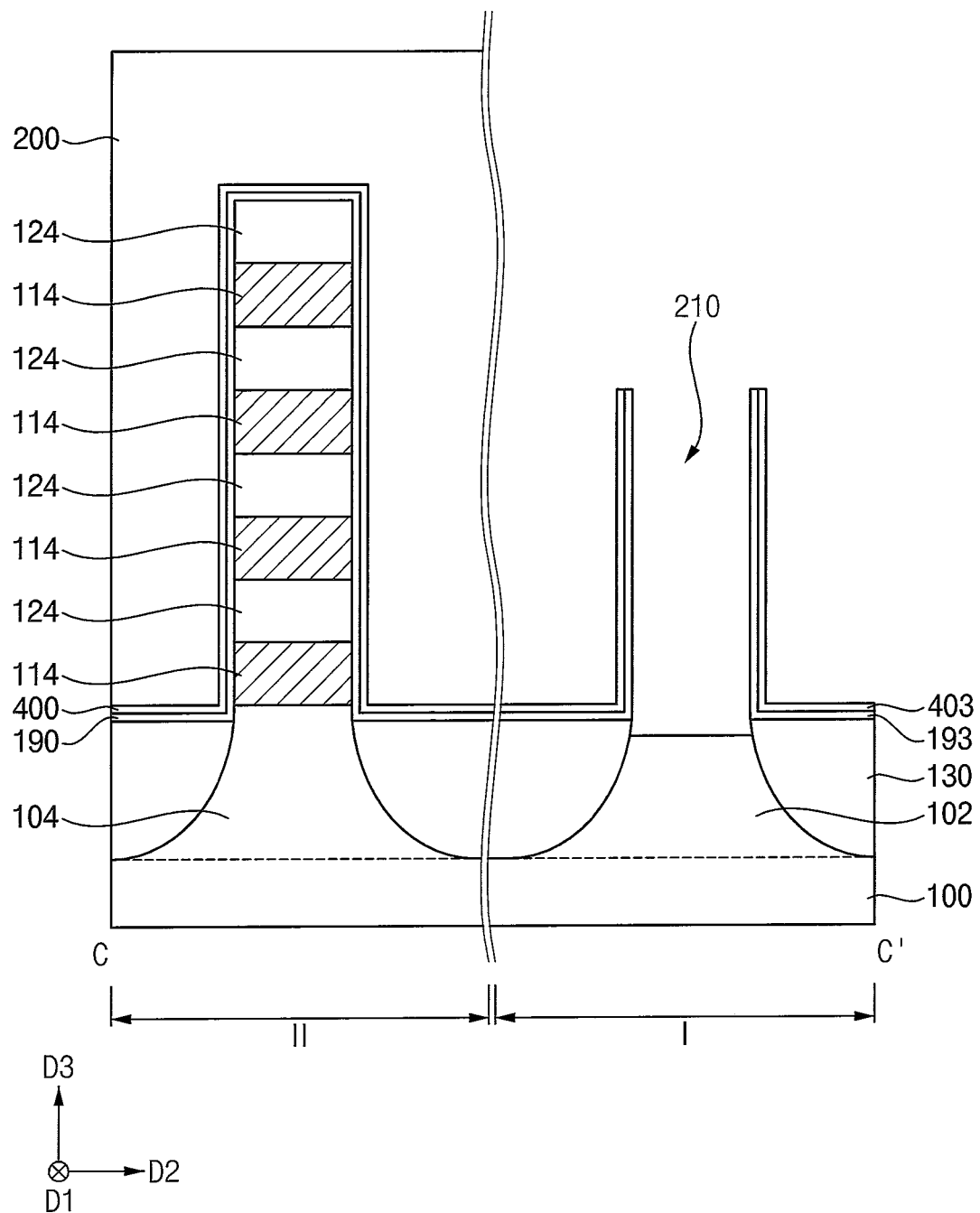

Referring to FIGS. 34 and 35, processes substantially the same as or similar to those illustrated with reference to FIGS. 1 to 5 may be performed, and processes similar to those illustrated with reference to FIGS. 6 to 8 may be performed.

However, instead of sequentially forming the first spacer layer 180 including, e.g., a low-k dielectric material and the first sacrificial spacer layer 190 including, e.g., silicon nitride, the first sacrificial spacer layer 190 and the third sacrificial spacer layer 400 including, e.g., silicon oxide may be sequentially formed.

Thus, the first sacrificial gate spacer 192 and the third sacrificial gate spacer 402 covering each of opposite sidewalls in the first direction D1 of the portion of the dummy gate structure 170 on the first region I of the substrate 100 may be formed, and the first sacrificial fin spacer 193 and the third sacrificial fin spacer 403 may be formed on each of opposite sidewalls in the second direction D2 of the portion of the first stack structure not covered by the dummy gate structure 170 and the portion of the isolation pattern 130 adjacent thereto in the second direction D2.

As the first opening 210 is formed, the first sacrificial lines 112 and the first semiconductor lines 122 under the dummy gate structure 170, the first sacrificial gate spacer 192 and the third sacrificial gate spacer 402 may be transformed into the first sacrificial patterns 116 and the first semiconductor patterns 126, respectively.

Figure 36:
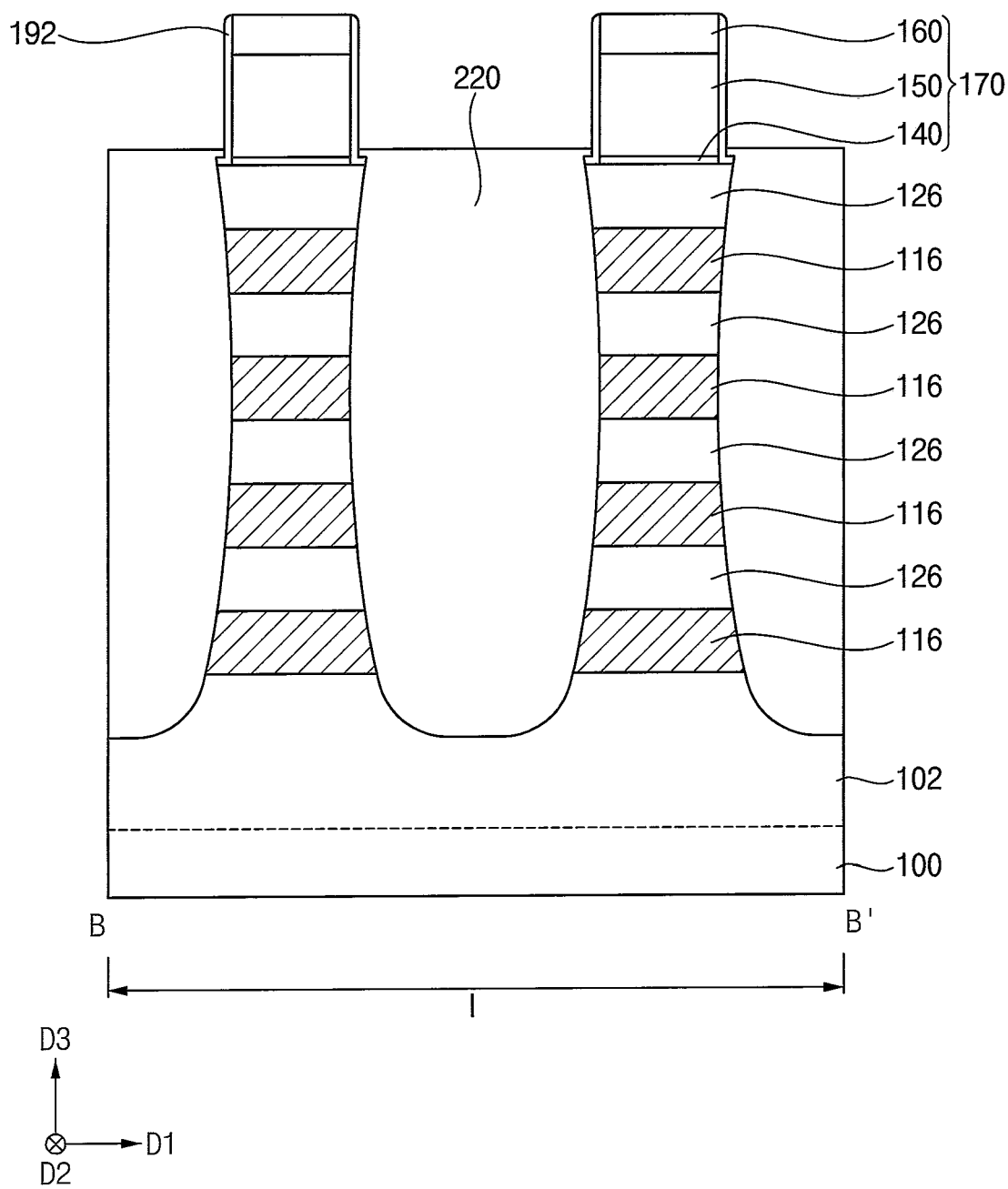
Figure 37:
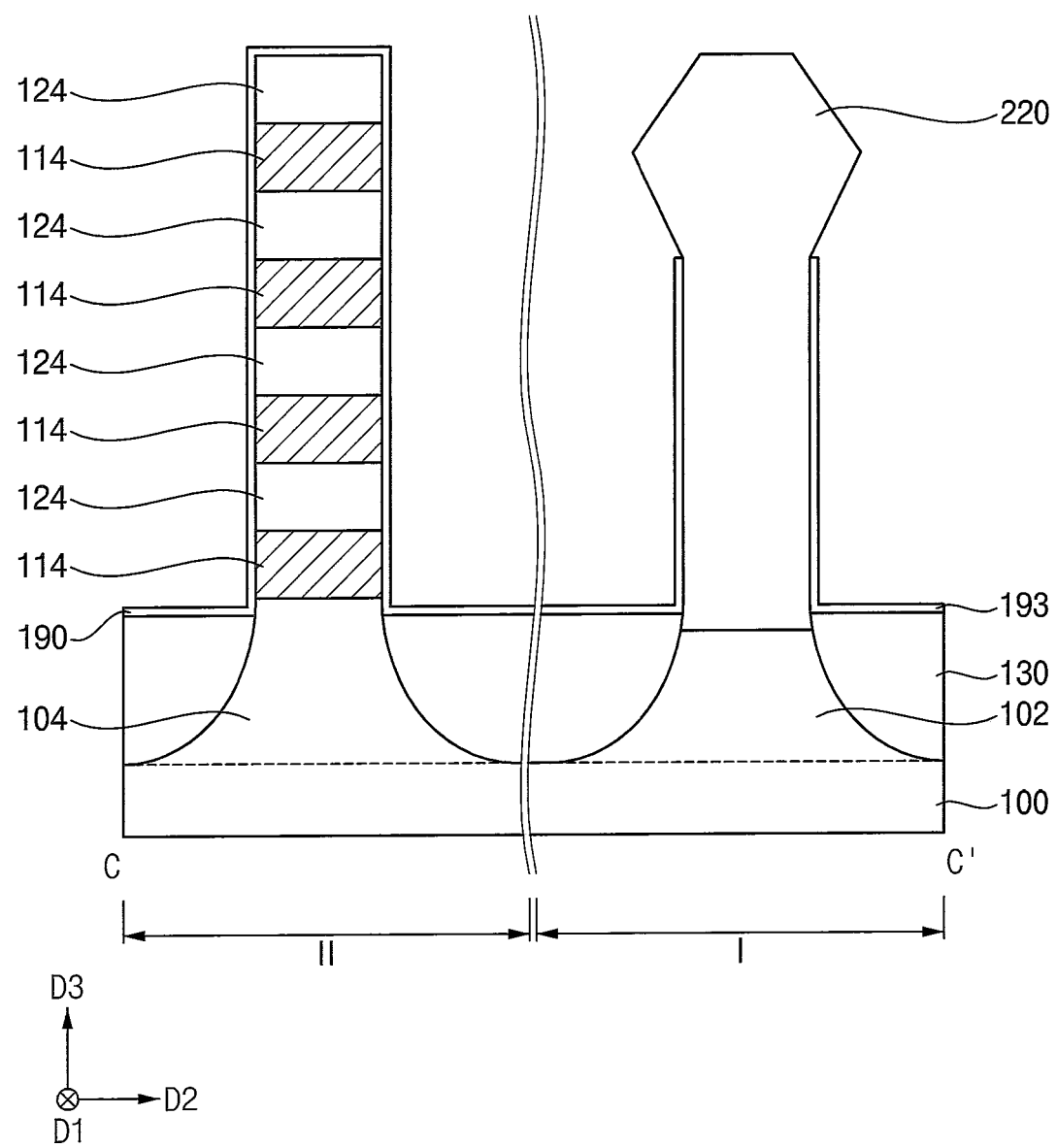

Referring to FIGS. 36 and 37, processes substantially the same as or similar to those illustrated with reference to FIGS. 9 to 11 may be performed, and the first source/drain layer 220 may be formed on the inner wall of the first opening 210 by the first SEG process.

However, when the cleansing process is performed using the hydrofluoric acid (HF), the third sacrificial gate spacer 402, the third sacrificial fin spacer 403 and the third sacrificial spacer layer 400 that may include, e.g., silicon oxide may be removed.

Figure 38:
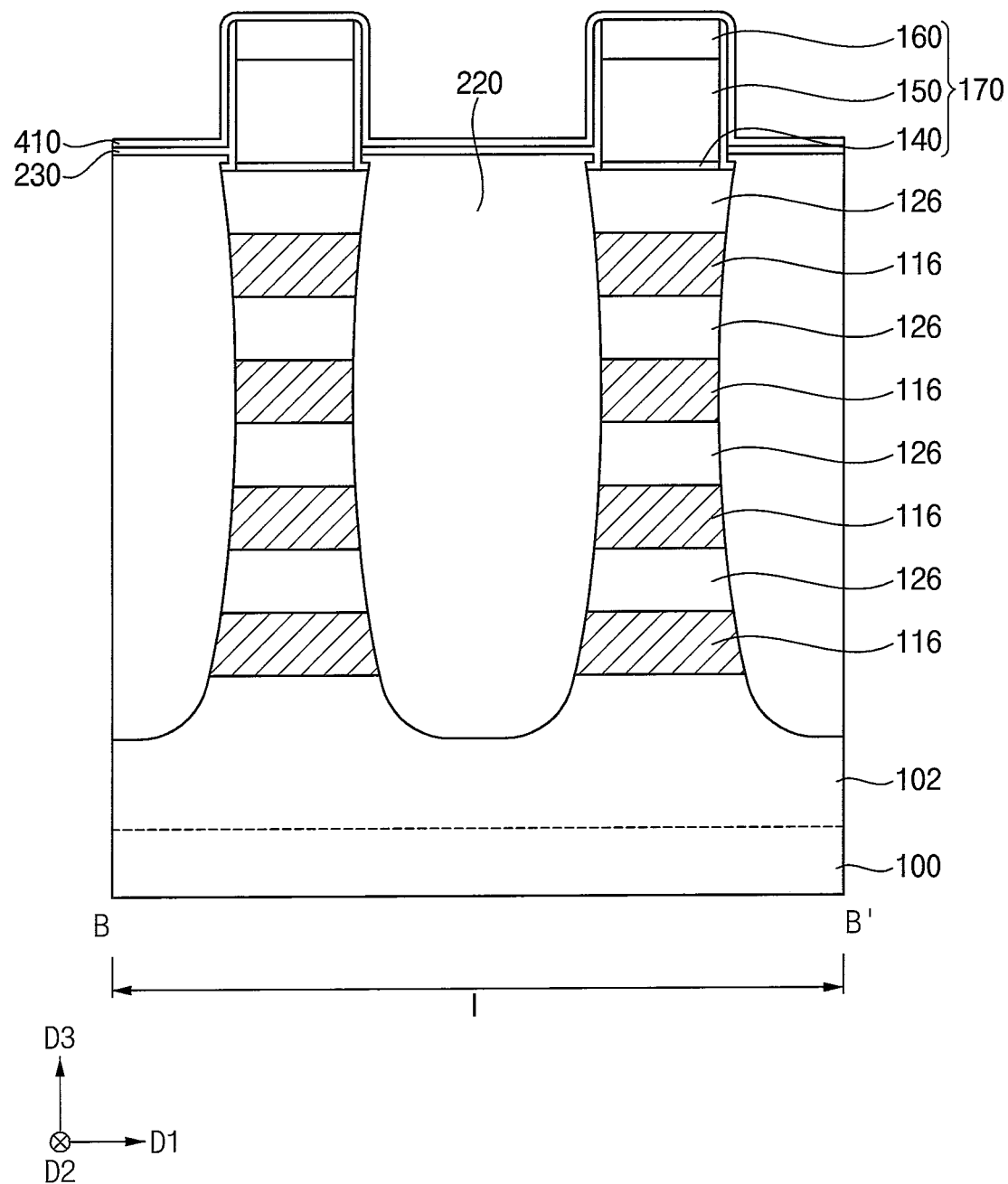
Figure 39:
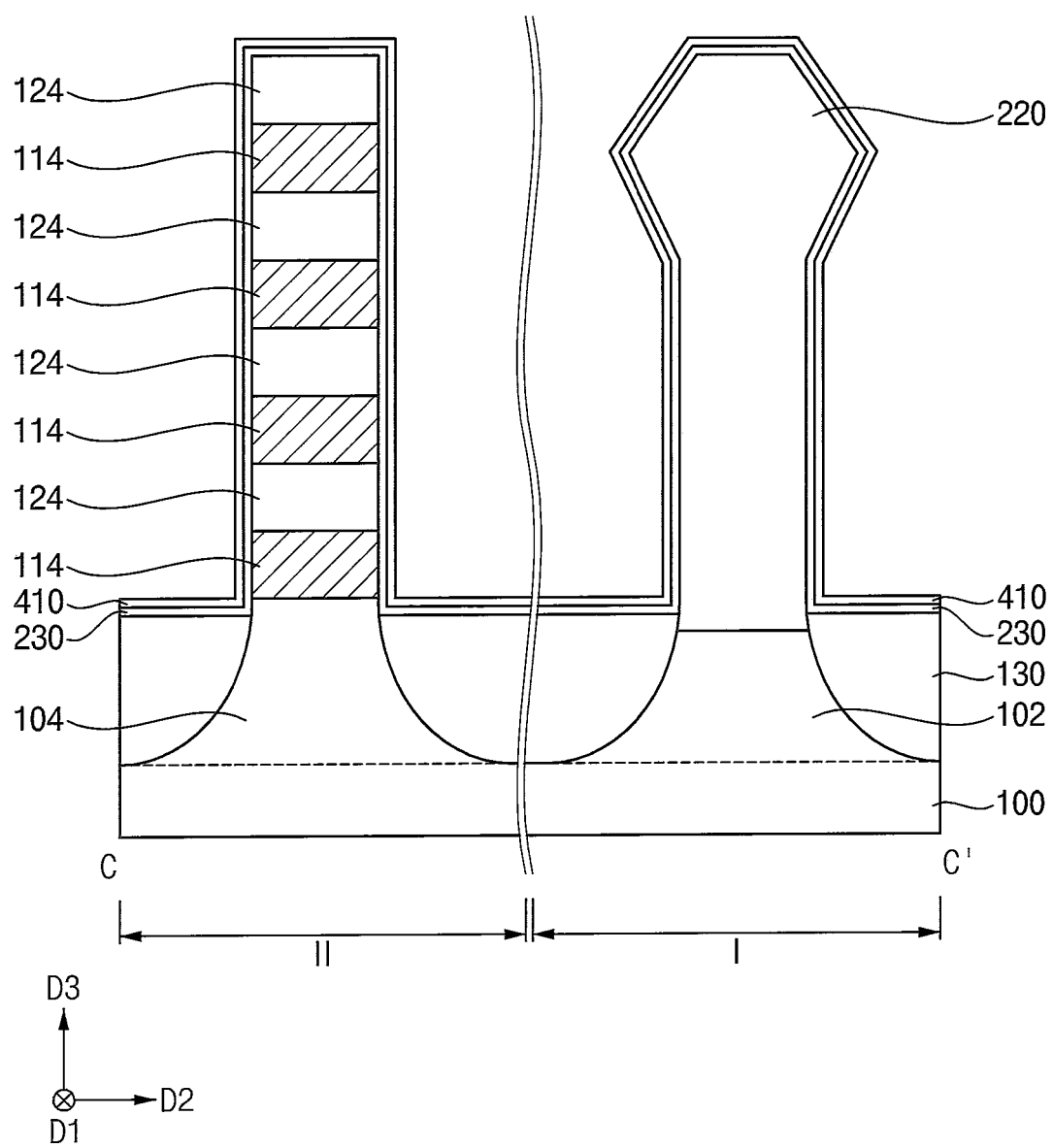
Figure 40:
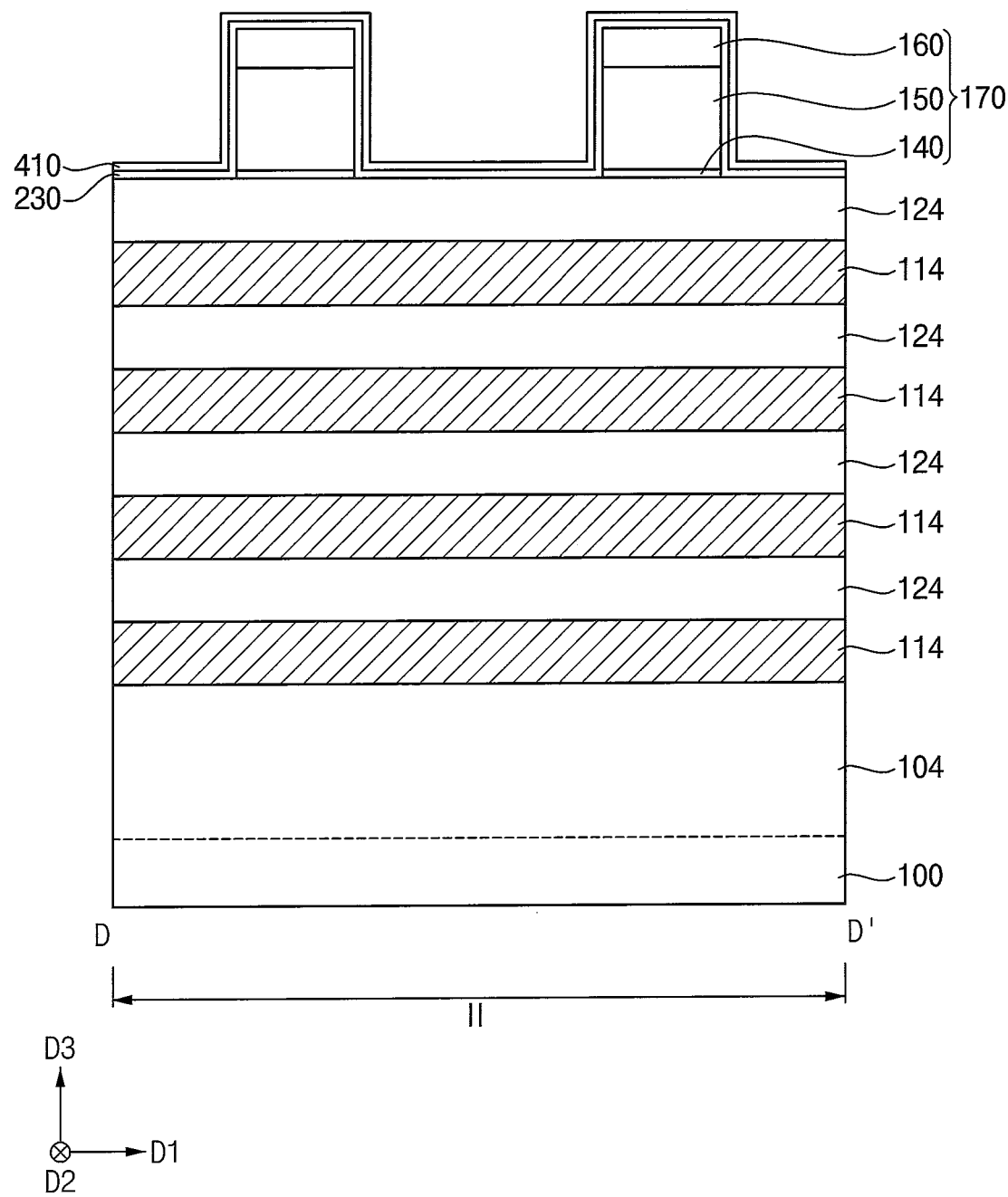

Referring to FIGS. 38 to 40, processes substantially the same as or similar to those illustrated with reference to FIGS. 12 to 14 may be performed.

For example, the first sacrificial spacer layer 190 on the first sacrificial gate spacer 192 and the first sacrificial fin spacer 193 on the first region I of the substrate 100 and the first sacrificial spacer layer 190 remaining on the second region II of the substrate 100 may be removed by performing a wet etching process using, e.g., phosphoric acid ($H_3PO_4$), and the second sacrificial spacer layer 230 may be entirely formed on the first and second regions I and II of the substrate 100.

Thus, the second sacrificial spacer layer 230 may be formed on the dummy gate structure 170, the first source/drain layer 220, the second stack structure and the isolation pattern 130 on the first and second regions I and II of the substrate 100.

A fourth sacrificial spacer layer 410 including, e.g., silicon oxide may be formed on the second sacrificial spacer layer 230.

Figure 41:
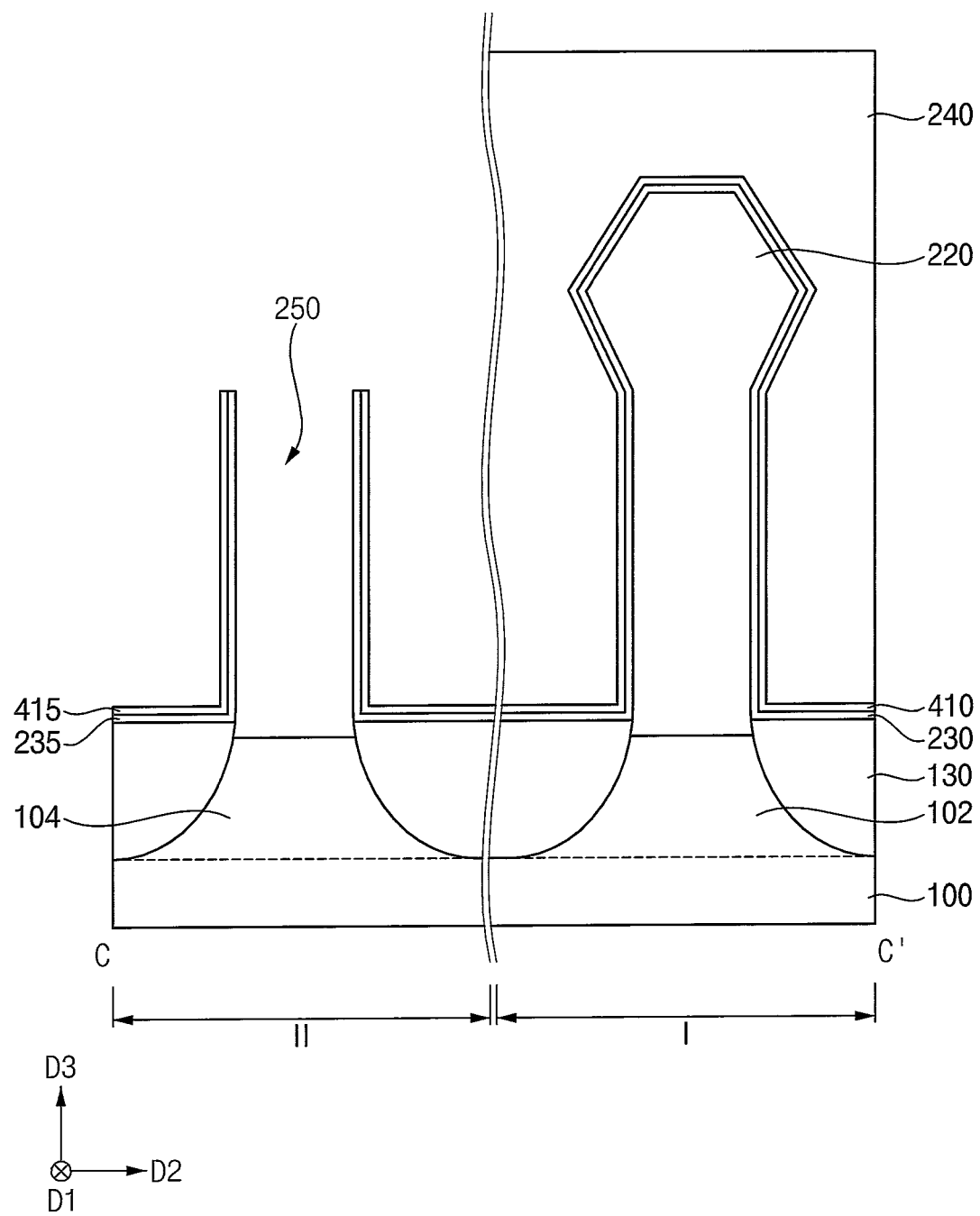
Figure 42:
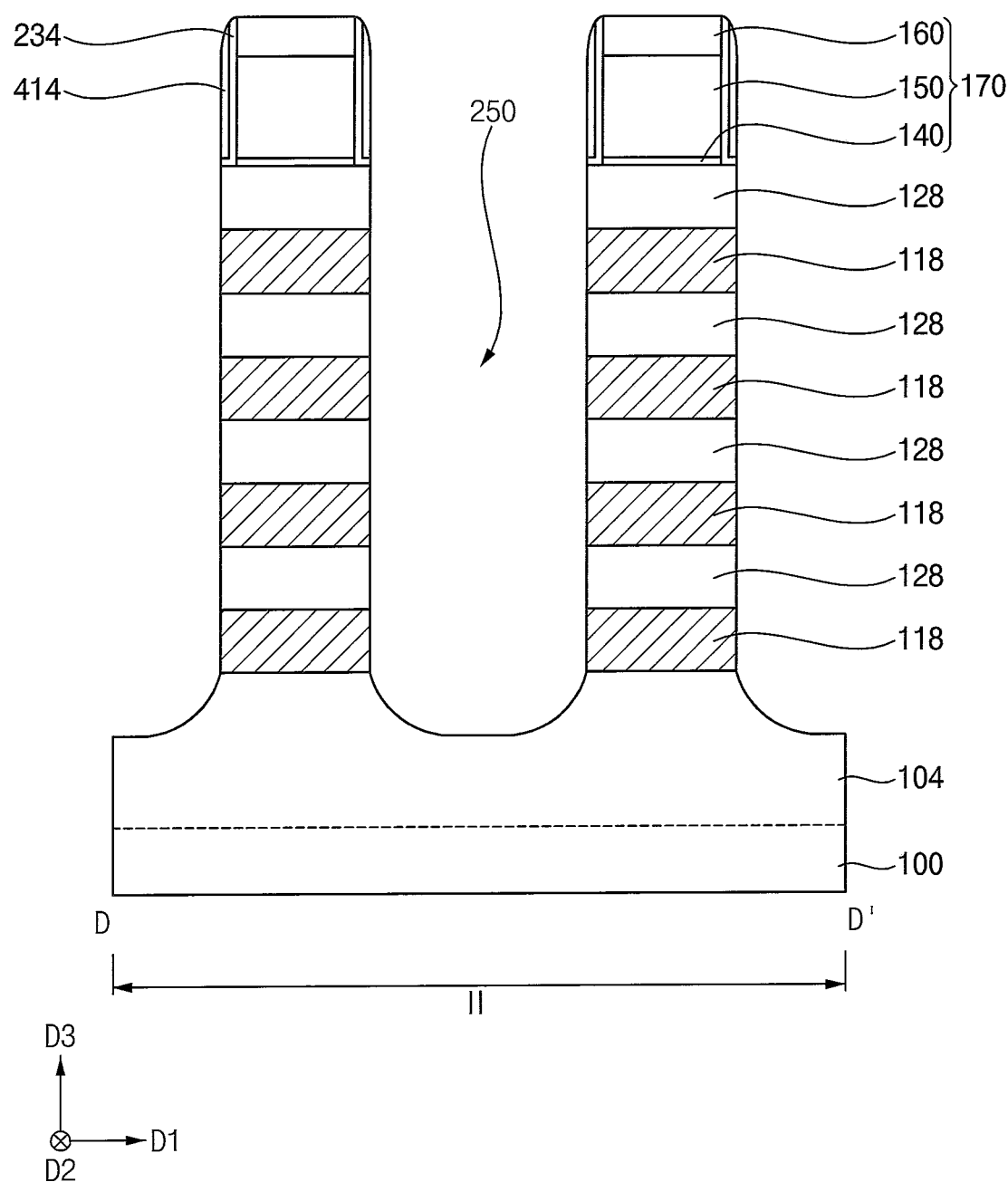

Referring to FIGS. 41 and 42, processes substantially the same as or similar to those illustrated with reference to FIGS. 15 to 17 may be performed.

For example, the fourth etching mask 240 may cover the first region I of the substrate 100, and the fourth sacrificial spacer layer 410 and the second sacrificial spacer layer 230 may be anisotropically etched to form the fourth gate spacer 414 and the second sacrificial gate spacer 234, respectively, on each of opposite sidewalls in the first direction D1 of the portion of the dummy gate structure 170 on the second region II of the substrate 100. The fourth sacrificial fin spacer 415 and the second sacrificial fin spacer 235 may be formed on each of opposite sidewalls in the second direction D2 of the portion of the second stack structure not covered by the dummy gate structure 170 and the portion of the isolation pattern 130 adjacent thereto in the second direction D2, respectively, on the second region II of the substrate 100.

The second stack structure and an upper portion of the second active pattern 104 thereunder may be etched by an etching process using the dummy gate structure 170, the second sacrificial gate spacer 234 and the fourth sacrificial gate spacer 414 as an etching mask on the second region II of the substrate 100 to form the second opening 250.

Thus, the second sacrificial lines 114 and the second semiconductor lines 124 under the dummy gate structure 170, the second sacrificial gate spacer 234 and the fourth sacrificial gate spacer 414 may be transformed into the second sacrificial patterns 118 and the second semiconductor patterns 128, respectively.

Figure 43:
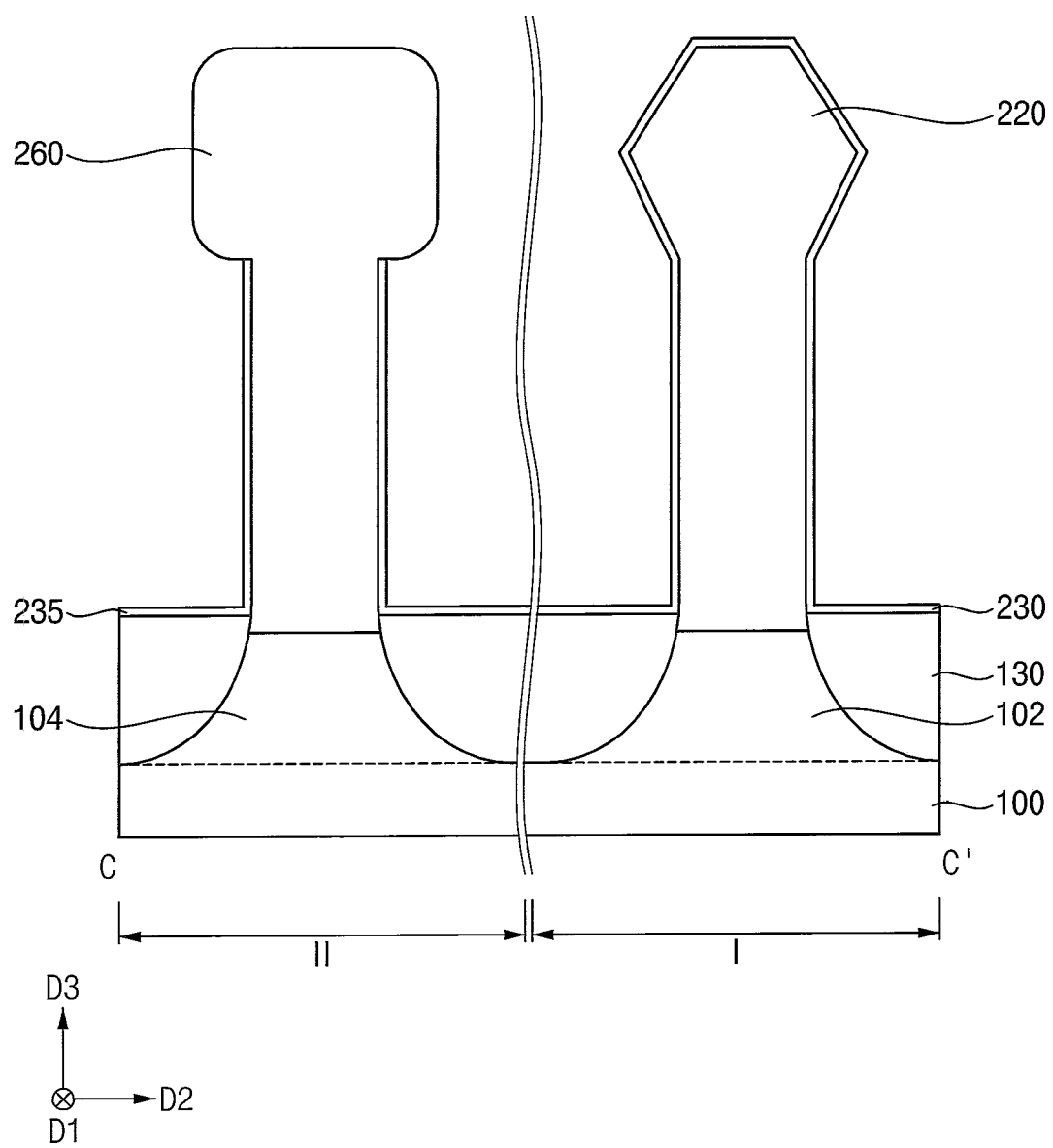
Figure 44:
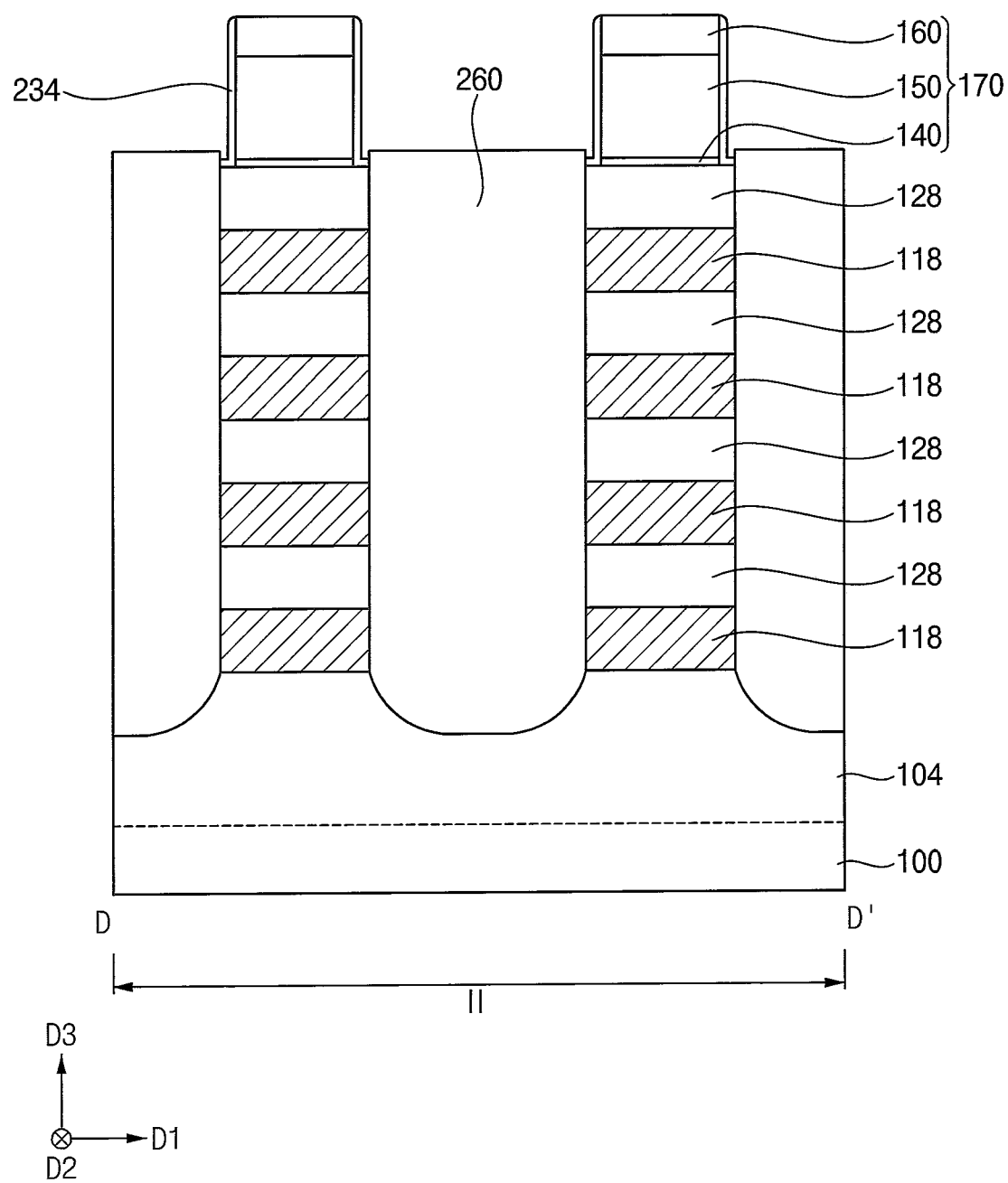

Referring to FIGS. 43 and 44, processes substantially the same as or similar to those illustrated with reference to FIGS. 18 to 20 may be performed, and the second source/drain layer 260 may be formed on the inner wall of the second opening 250 by the second SEG process.

However, when the cleansing process is performed by performing a wet etching process using hydrofluoric acid (HF), the fourth sacrificial gate spacer 414, the fourth sacrificial fin spacer 415 and the fourth sacrificial spacer layer 410 including, e.g., silicon oxide may be removed.

Figure 45:
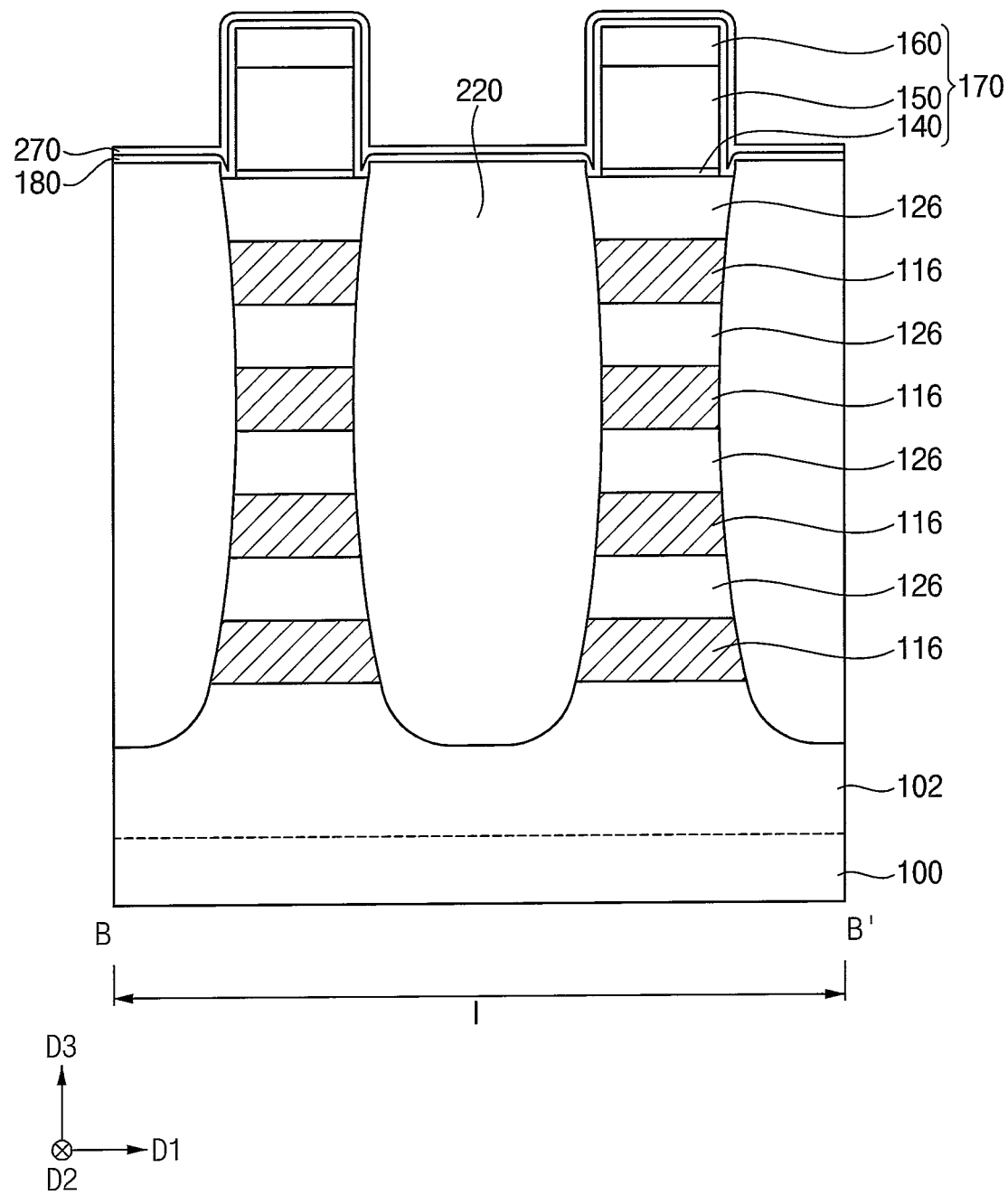
Figure 46:
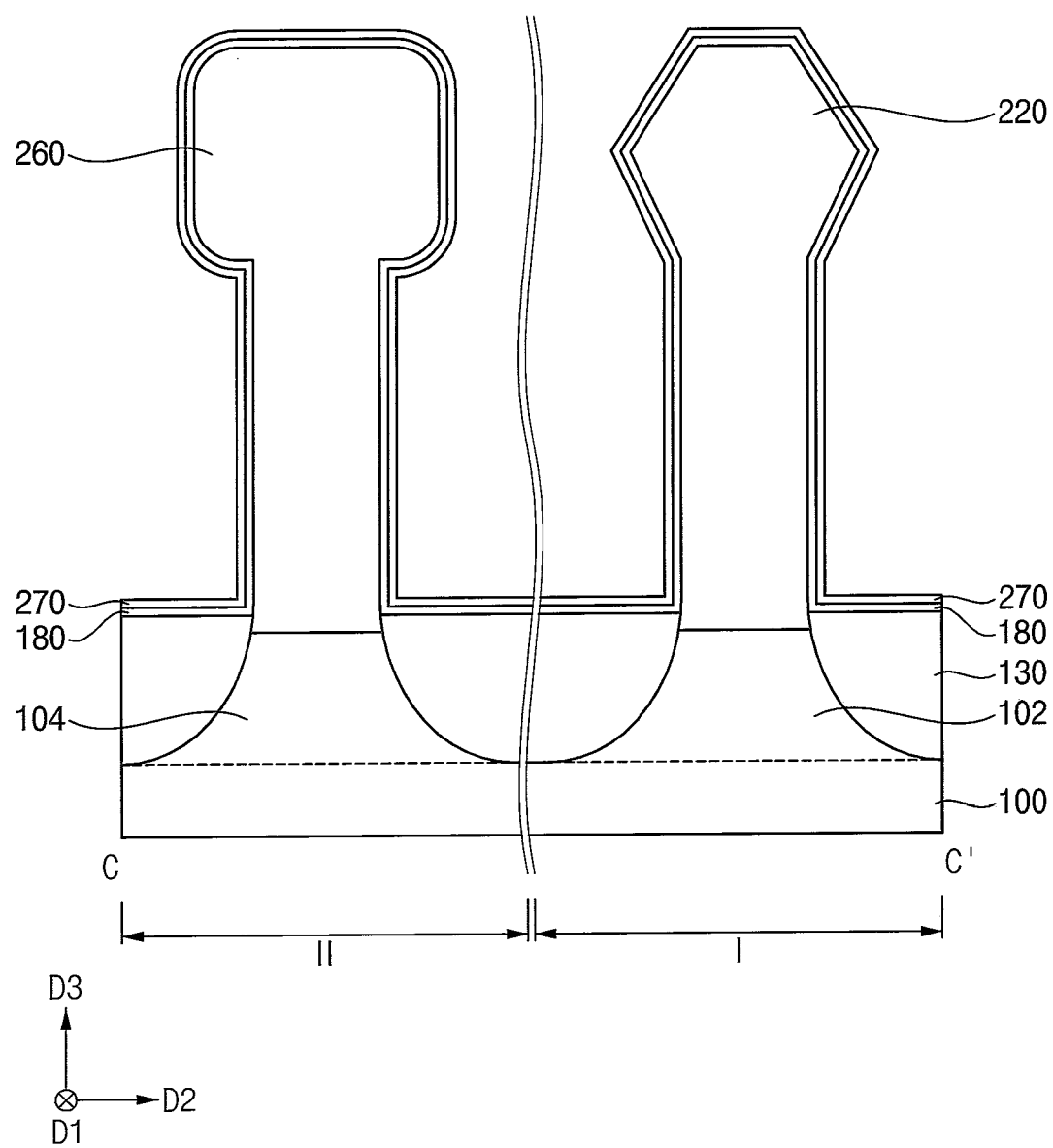
Figure 47:
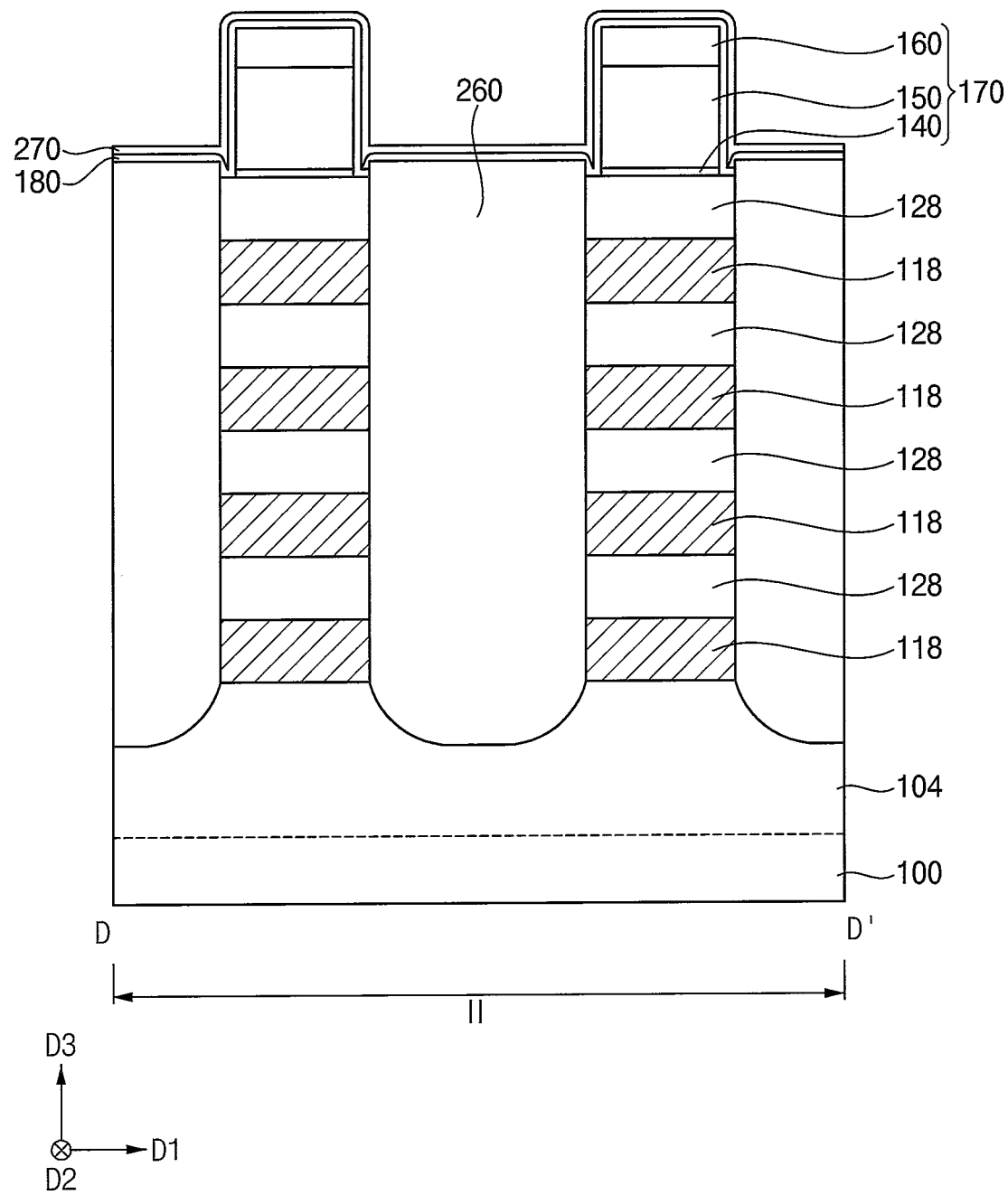

Referring to FIGS. 45 to 47, processes similar to those illustrated with reference to FIGS. 21 to 23 may be performed.

For example, the second sacrificial gate spacer 234 and the second sacrificial fin spacer 235 on the second region II of the substrate 100 and the second sacrificial spacer layer 230 remaining on the first region I of the substrate 100 may be removed by performing a wet etching process using, e.g., phosphoric acid ($H_3PO_4$).

However, the first spacer layer 180 and the etch stop layer 270 may be sequentially formed on the first and second regions I and II of the substrate 100.

Thus, the first spacer layer 180 and the etch stop layer 270 may be formed on the dummy gate structure 170, the first and second source/drain layers 220 and 260 and the isolation pattern 130 on the first and second regions I and II of the substrate 100.

Figure 48:
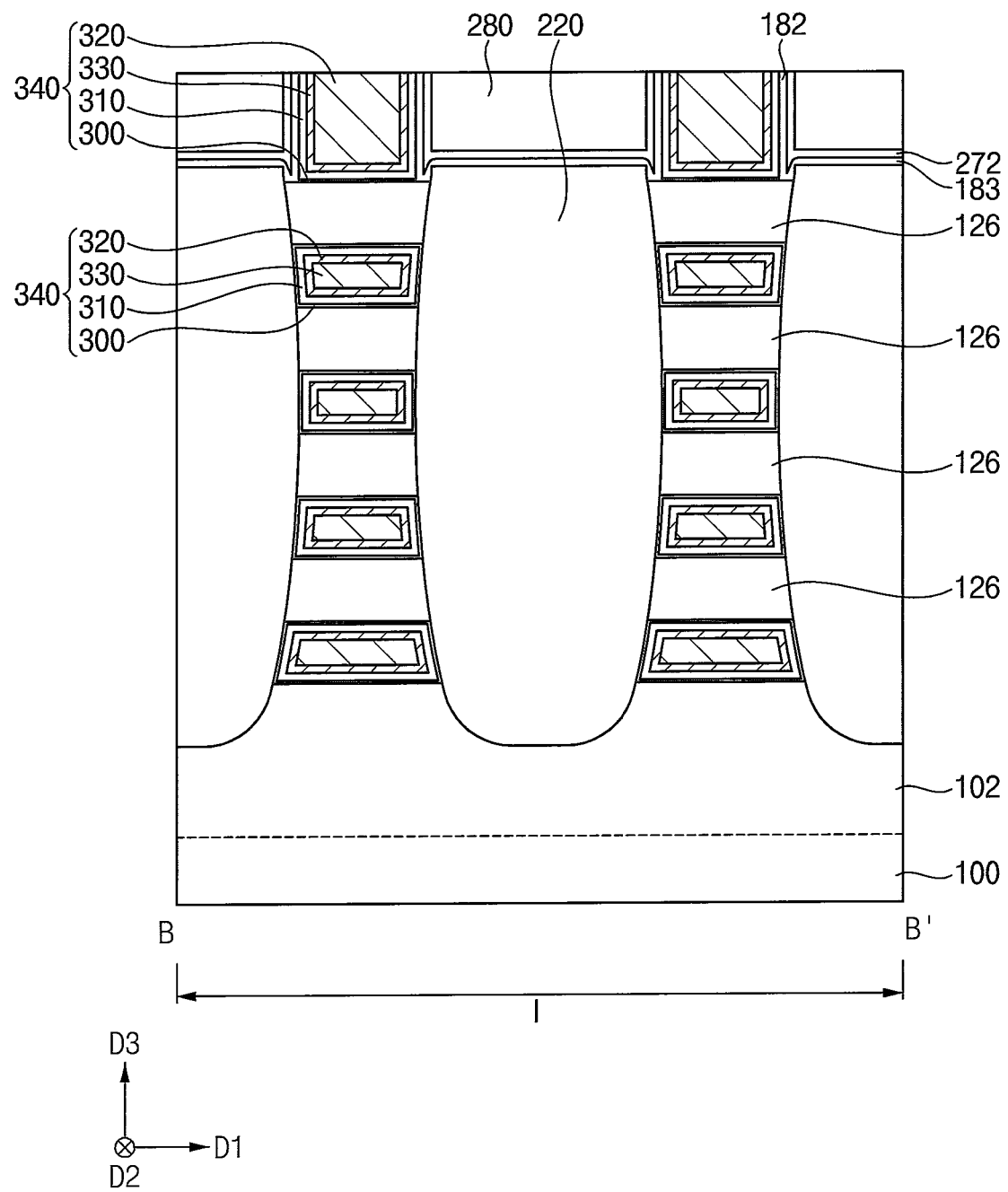
Figure 49:
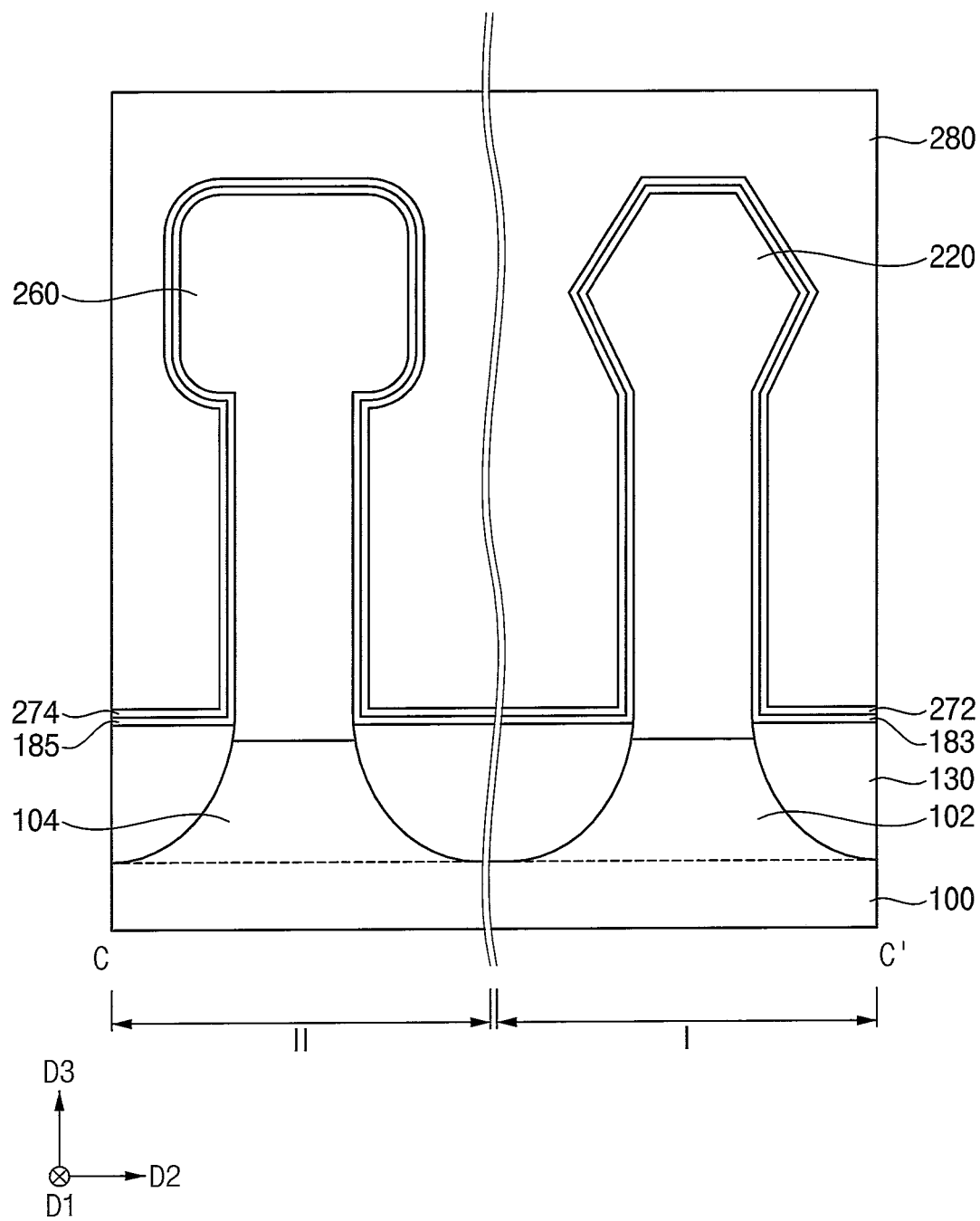
Figure 50:
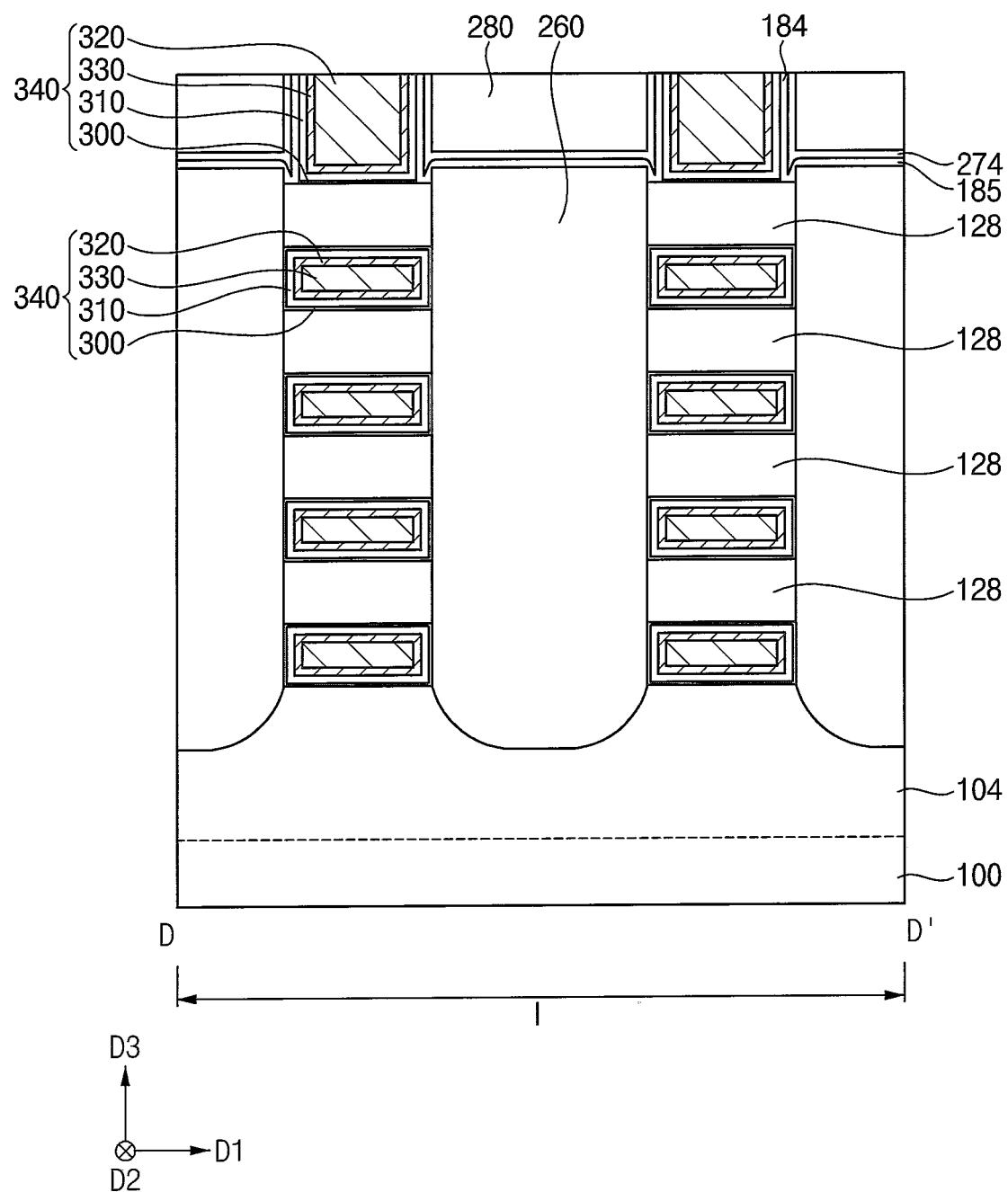

Referring to FIGS. 48 to 50, processes substantially the same as or similar to those illustrated with reference to FIGS. 24 to 29 may be performed to complete the fabrication of the semiconductor device.

For example, the first gate spacer 182 may be formed on each of opposite sidewalls in the first direction D1 of the portion of the gate structure 340 on the first region I of the substrate 100, the first fin spacer 183 may be formed on the sidewall and the upper surface of the first source/drain layer 220, and the first etch stop pattern 272 may be formed on the first gate spacer 182 and the first fin spacer 183. Additionally, the second gate spacer 184 may be formed on each of opposite sidewalls in the first direction D1 of the portion of the gate structure 340 on the second region II of the substrate 100, the second fin spacer 185 may be formed on the sidewall and the upper surface of the second source/drain layer 260, and the second etch stop pattern 274 may be formed on the second gate spacer 184 and the second fin spacer 185.

In example embodiments of the present disclosure, the first gate spacer 182 and the first fin spacer 183 may be integrally formed (e.g., formed as a singular and uninterrupted unit), and thus may include substantially the same material and connected with each other. Likewise, the second gate spacer 184 and the second fin spacer 185 may be integrally formed, and thus may include substantially the same material and connected with each other.

As illustrated above, unlike the method of manufacturing the semiconductor device illustrate with reference to FIGS. 1 to 29, instead of the first spacer layer 180 covering the dummy gate structure 170, the first sacrificial spacer layer 190 or the second sacrificial spacer layer 230 may be formed, and the third sacrificial spacer layer 400 or the fourth sacrificial spacer layer 410 may be formed on the first sacrificial spacer layer 190 or the second sacrificial spacer layer 230. The first opening 210 or the second opening 250 may be formed using a spacer structure, which may be formed by an anisotropical etching process of the first and third sacrificial spacer layers 190 and 400 or the second and fourth sacrificial spacer layers 230 and 410. However, the first spacer layer 180 for reducing the parasitic capacitance between the gate structure 340 and neighboring structures may be entirely formed after removing the first to fourth sacrificial spacer layers 190, 230, 400 and 410.

The semiconductor device manufactured by the above processes may have the following characteristics:

In example embodiments of the present disclosure, the first fin spacer 183 may contact sidewalls in the second direction D2 and an upper surface of the first source/drain layer 220, and the second fin spacer 185 may contact sidewalls in the second direction D2 and an upper surface of the second source/drain layer 260. The first etch stop pattern 272 may be formed on the first fin spacer 183, and might not contact the first source/drain layer 220. The second etch stop pattern 274 may be formed on the second fin spacer 185, and might not contact the second source/drain layer 260.

In example embodiments of the present disclosure, the first fin spacer 183 may contact an upper surface of a portion of the isolation pattern 130 adjacent to the first source/drain layer 220 in the second direction D2, and the second fin spacer 185 may contact an upper surface of a portion of the isolation pattern 130 adjacent to the second source/drain layer 260 in the second direction D2.

In example embodiments of the present disclosure, a portion of the first gate spacer 182 overlapping the first source/drain layer 220 in the first direction D1 may have a lowermost surface that is lower than an uppermost surface of the first source/drain layer 220, and a portion of the second gate spacer 184 overlapping the second source/drain layer 260 in the first direction D1 may have a lowermost surface that is lower than an uppermost surface of the second source/drain layer 260.

In example embodiments of the present disclosure, the first etch stop pattern 272 may cover a sidewall of the first gate spacer 182, and the second etch stop pattern 274 may cover a sidewall of the second gate spacer 184.

FIGS. 51 to 62 are cross-sectional views illustrating a method of manufacturing a semiconductor device in accordance with example embodiments of the present disclosure. This method may include processes substantially the same as or similar to those illustrated with reference to FIGS. 1 to 29, and thus to the extent that some elements/method steps are not described in detail below, it may be understood that these elements/method steps are at least similar to corresponding elements/method steps that are described in detail elsewhere within the instant specification.

Figure 51:
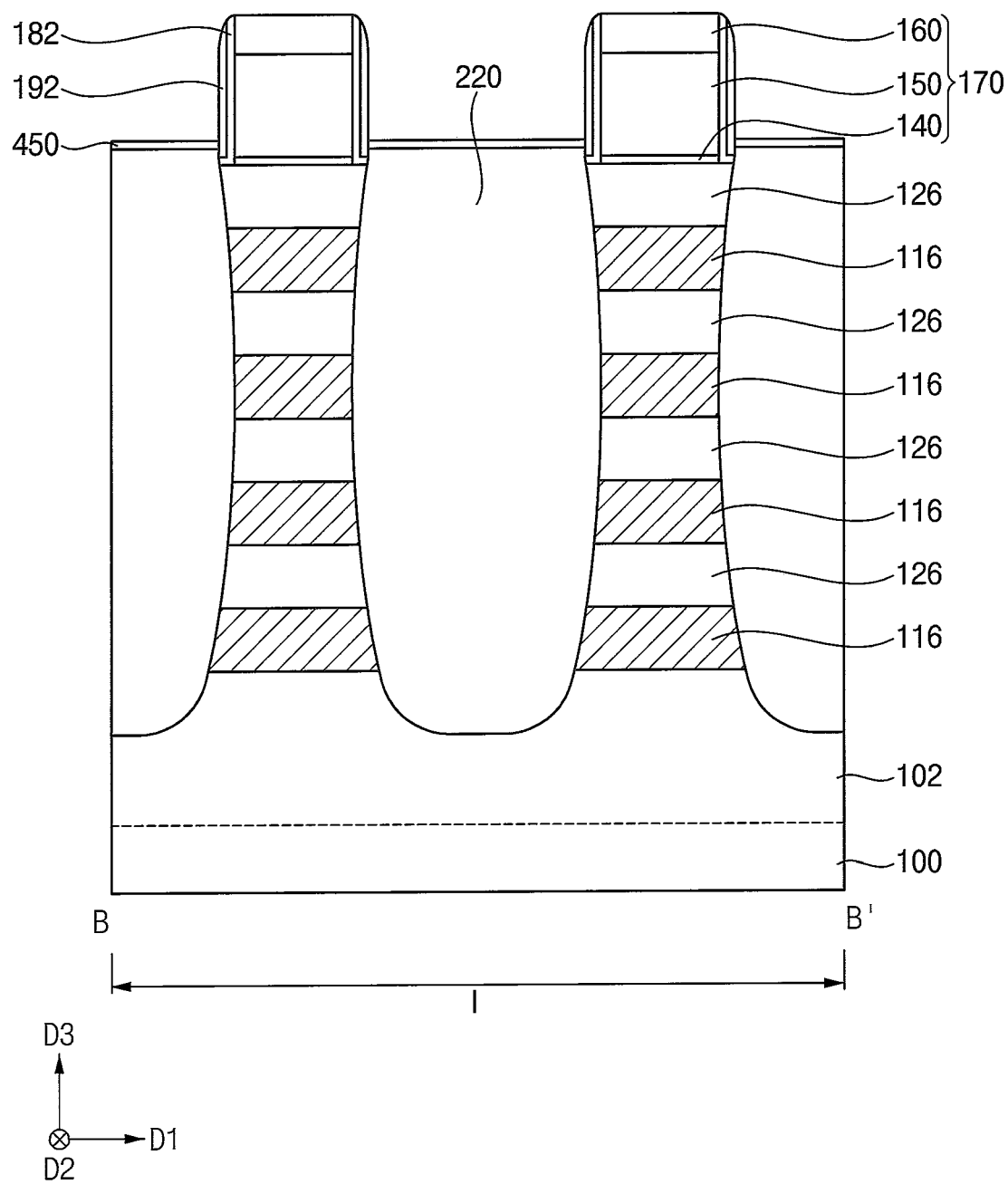
FIGS. 51 to 62 are cross-sectional views illustrating a method of manufacturing a semiconductor device in accordance with example embodiments of the present disclosure.
Figure 52:
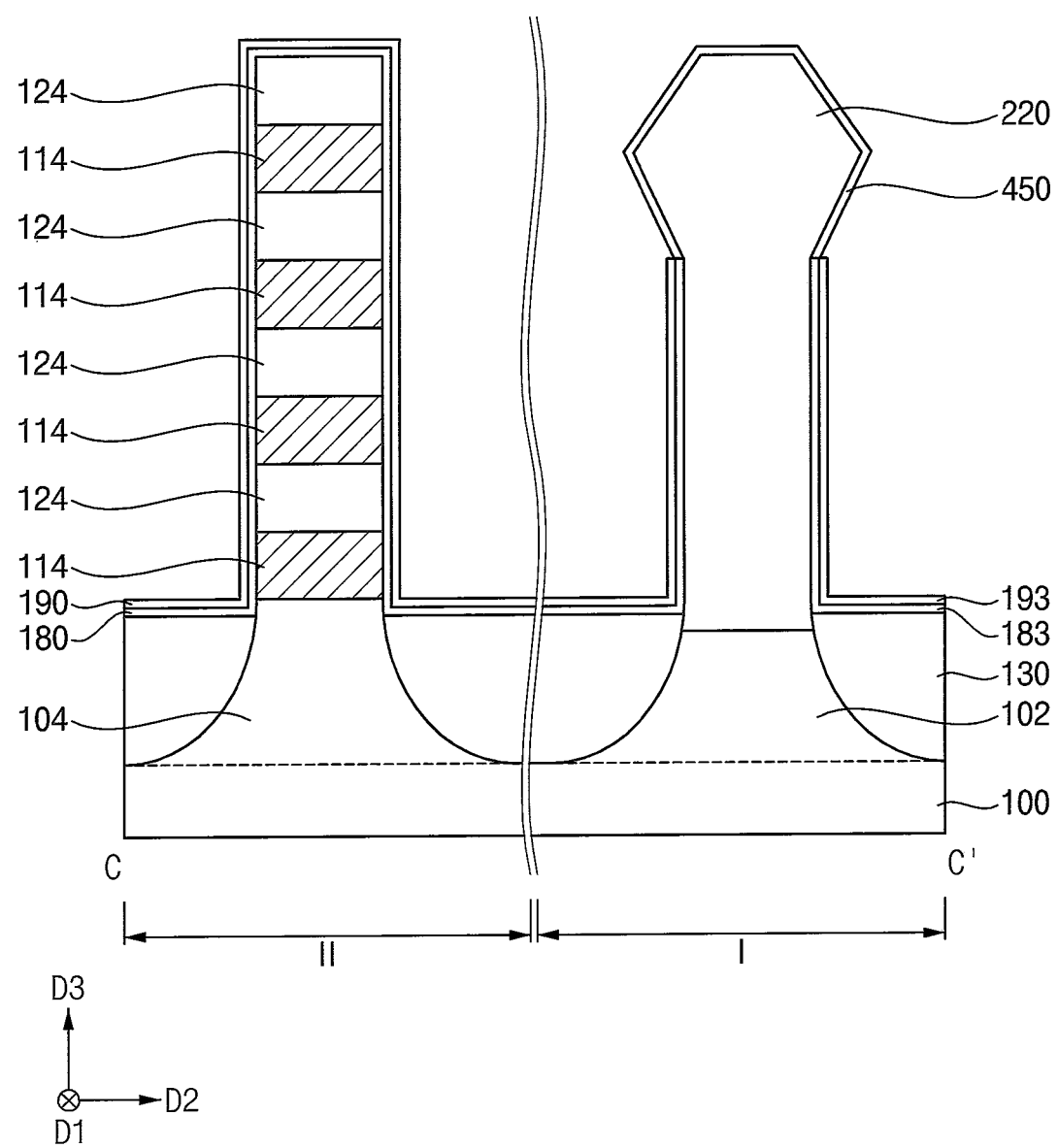

Referring to FIGS. 51 and 52, processes substantially the same as or similar to those illustrated with reference to FIGS. 1 to 11 may be performed, and a first capping layer 450 may be formed on the first source/drain layer 220.

In example embodiments of the present disclosure, the first capping layer 450 may be formed by performing a selective deposition process, and thus may be formed on only the first source/drain layer 220 including a semiconductor material, e.g., silicon, germanium, etc., but might not be formed on the dummy gate mask 160, the first gate spacer 182, the first sacrificial gate spacer 192, the first sacrificial fin spacer 193, the first sacrificial spacer layer 190 and the isolation pattern 130 including an insulating material.

The first capping layer 450 may include a low-k dielectric material, e.g., silicon oxycarbonitride, silicon oxynitride, silicon carbonitride, etc. In an example embodiment of the present disclosure, the first capping layer 450 may have a thickness that is less than that of the first fin spacer 183, however, the inventive concept is not necessarily limited thereto.

Figure 53:
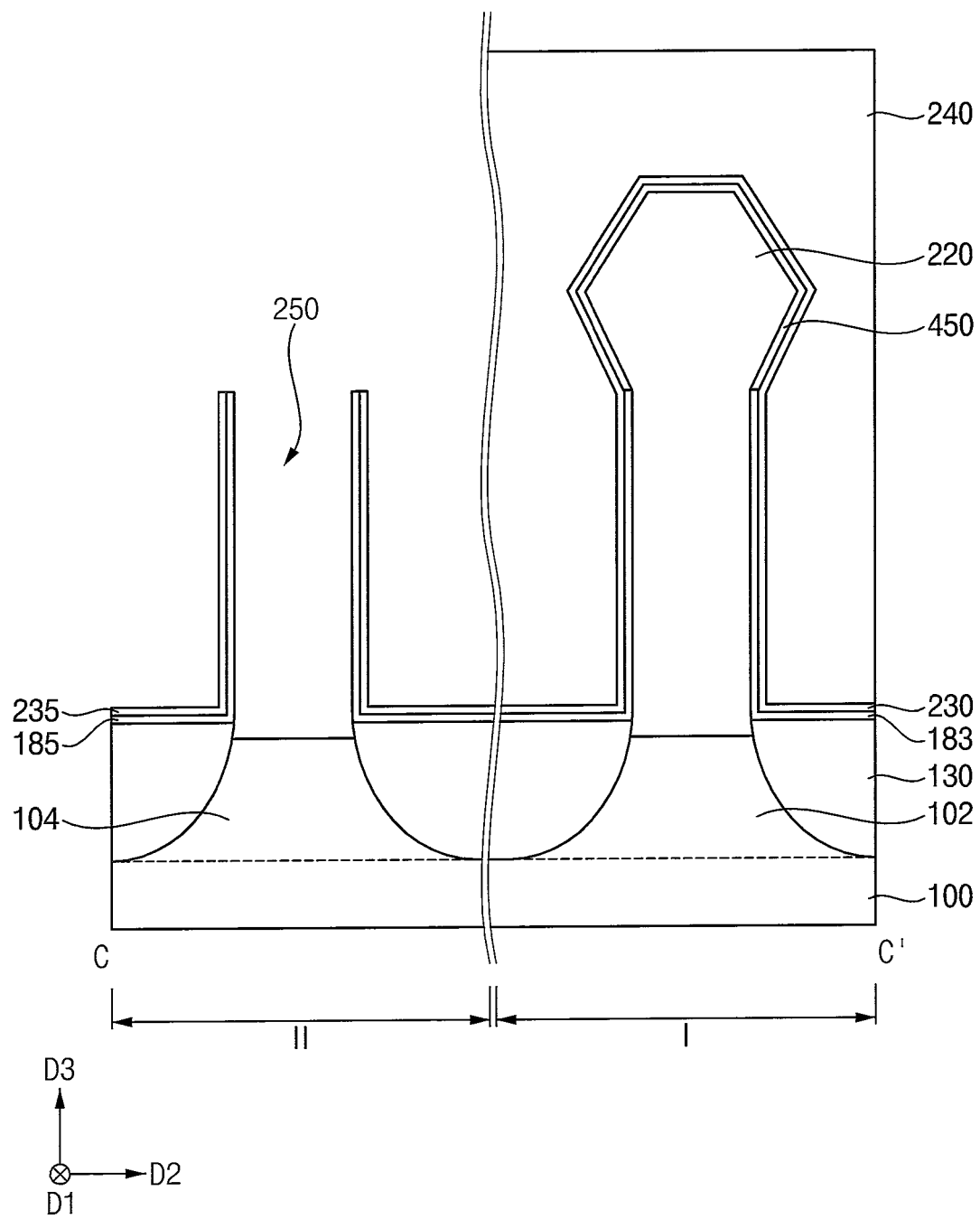
Figure 54:
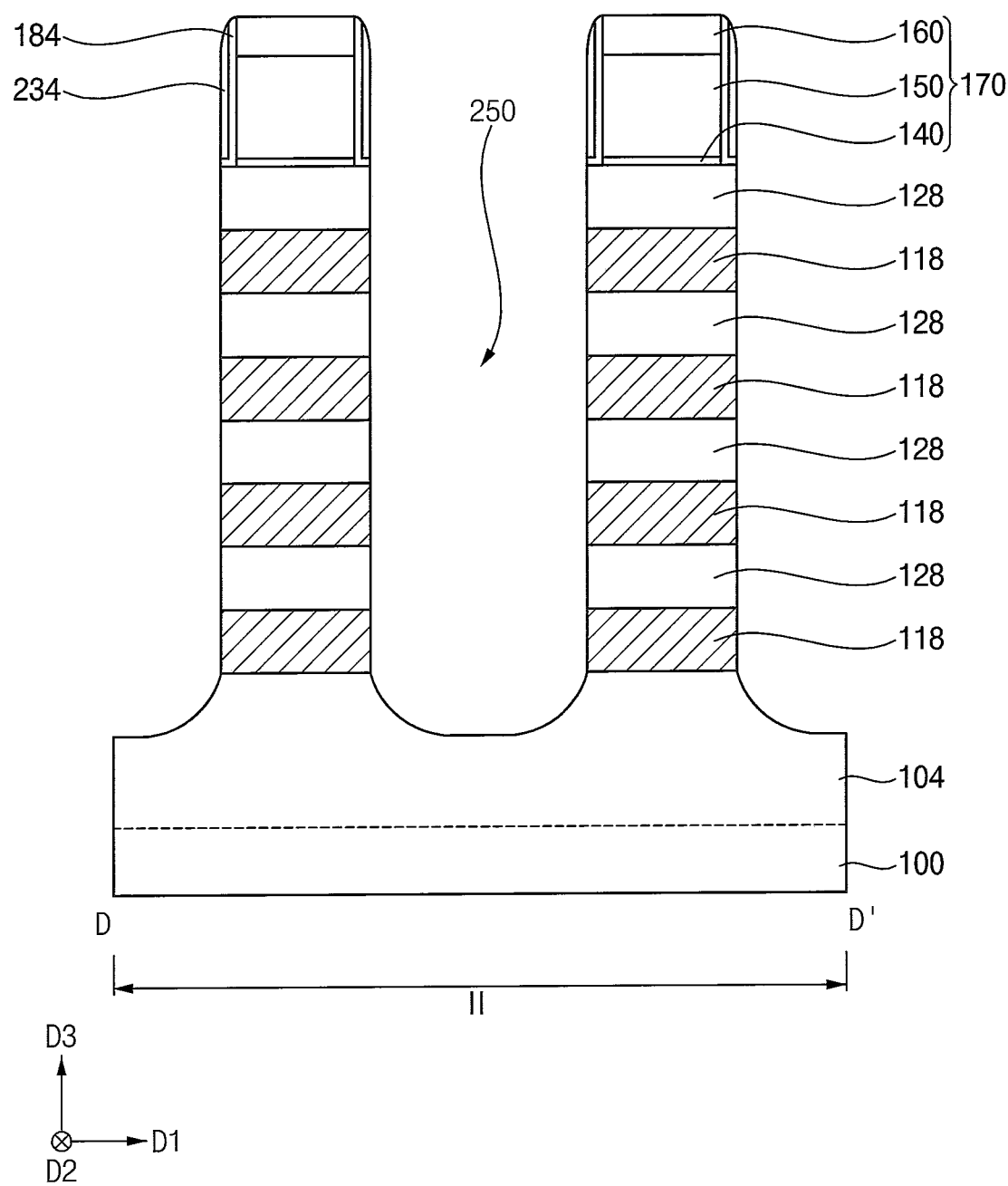

Referring to FIGS. 53 and 54, processes similar to those illustrated with reference to FIGS. 12 to 14 may be performed.

For example, the first sacrificial gate spacer 192, the first sacrificial fin spacer 193 and the first sacrificial spacer layer 190 may be removed, and the second sacrificial spacer layer 230 may be entirely formed on the first and second regions I and II of the substrate 100.

However, the first capping layer 450 has been formed on the first source/drain layer 220, and thus the second sacrificial spacer layer 230 may be formed on the dummy gate structure 170, the first gate spacer 182, the first fin spacer 183 and the first capping layer 450 on the first region I of the substrate 100, and on the first spacer layer 180 on the second region II of the substrate 100.

Processes substantially the same as or similar to those illustrated with reference to FIGS. 15 to 17 may be performed to form the second opening 250.

Figure 55:
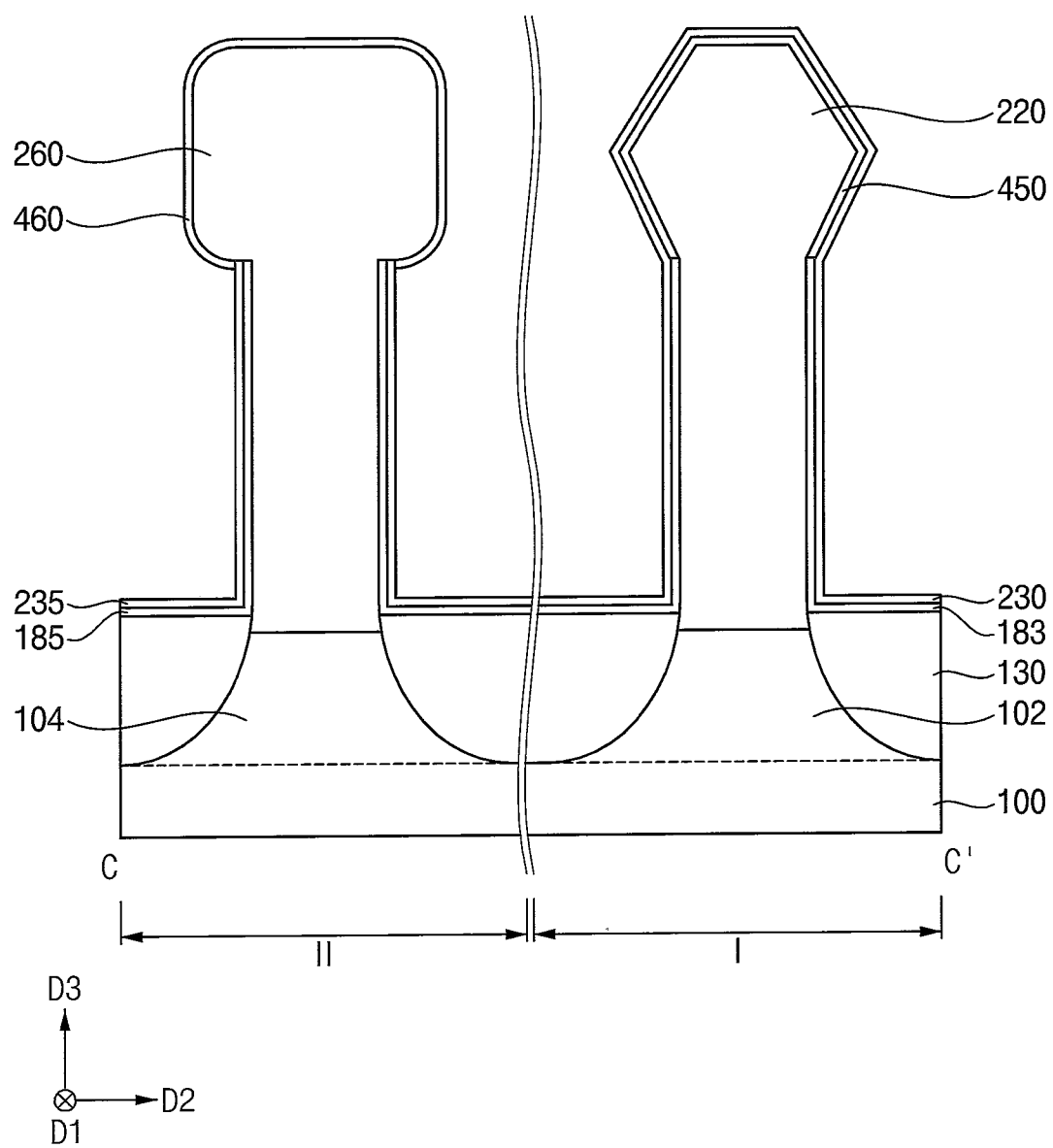
Figure 56:
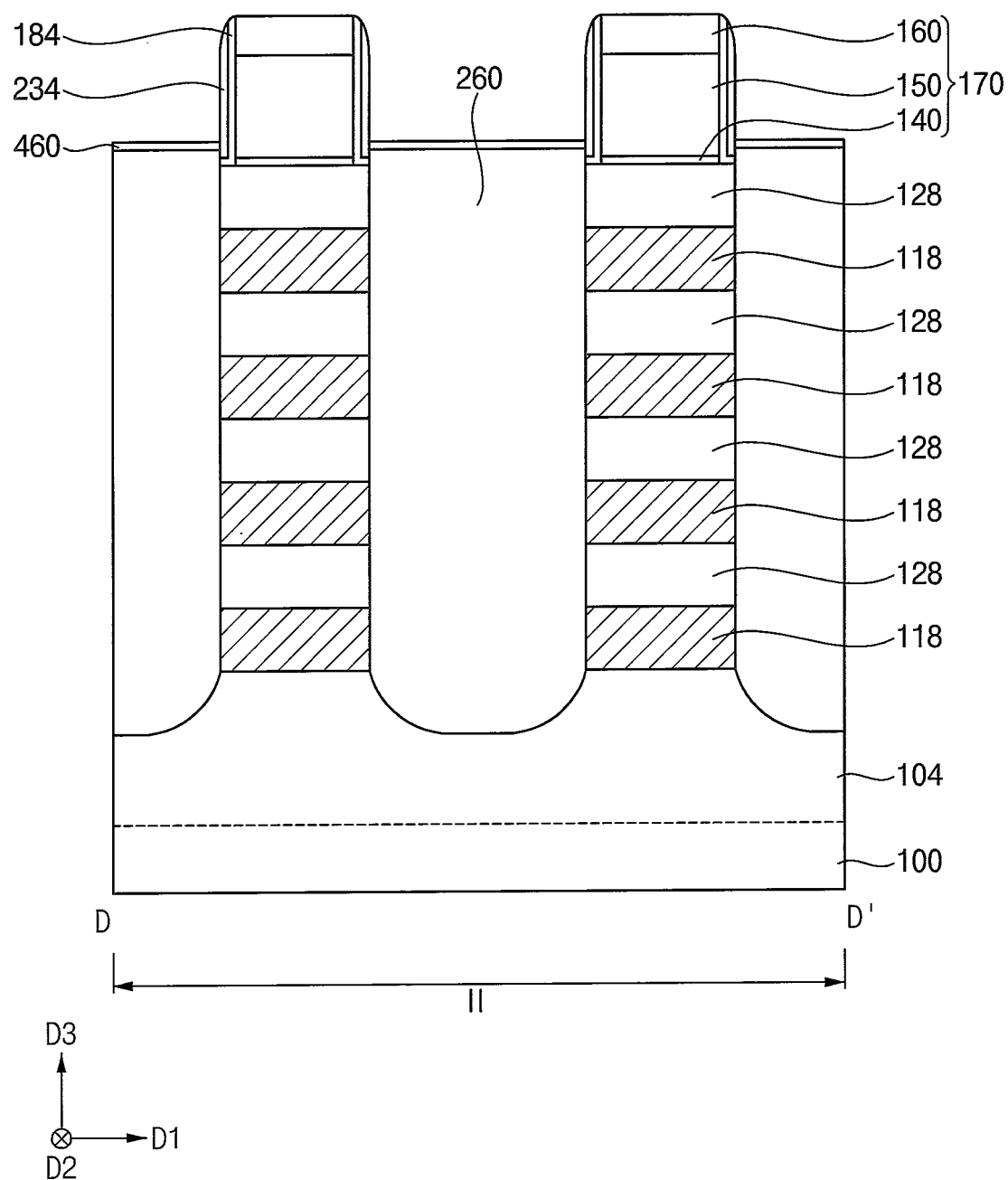

Referring to FIGS. 55 and 56, processes substantially the same as or similar to those illustrated with reference to FIGS. 18 to 20 may be performed to form the second source/drain layer 260, and processes substantially the same as or similar to those illustrated with reference to FIGS. 51 and 52 may be performed to form a second capping layer 460 on the second source/drain layer 260.

In example embodiments of the present disclosure, the second capping layer 460 may be formed by performing a second selective deposition process, and thus may be formed only on the second source/drain layer 260 including a semiconductor material. The second capping layer 460 may include a low-k dielectric material like the first capping layer 450. In an example embodiment of the present disclosure, the second capping layer 460 may have a thickness that is less than that of the second fin spacer 185, however, the inventive concept is not necessarily limited thereto.

In example embodiments of the present disclosure, the second fin spacer 185 may be covered by the second sacrificial fin spacer 235, and thus a lowermost surface of the second capping layer 460 might not contact an uppermost surface of the second fin spacer 185 covering a lower sidewall of the second source/drain layer 260.

Figure 57:
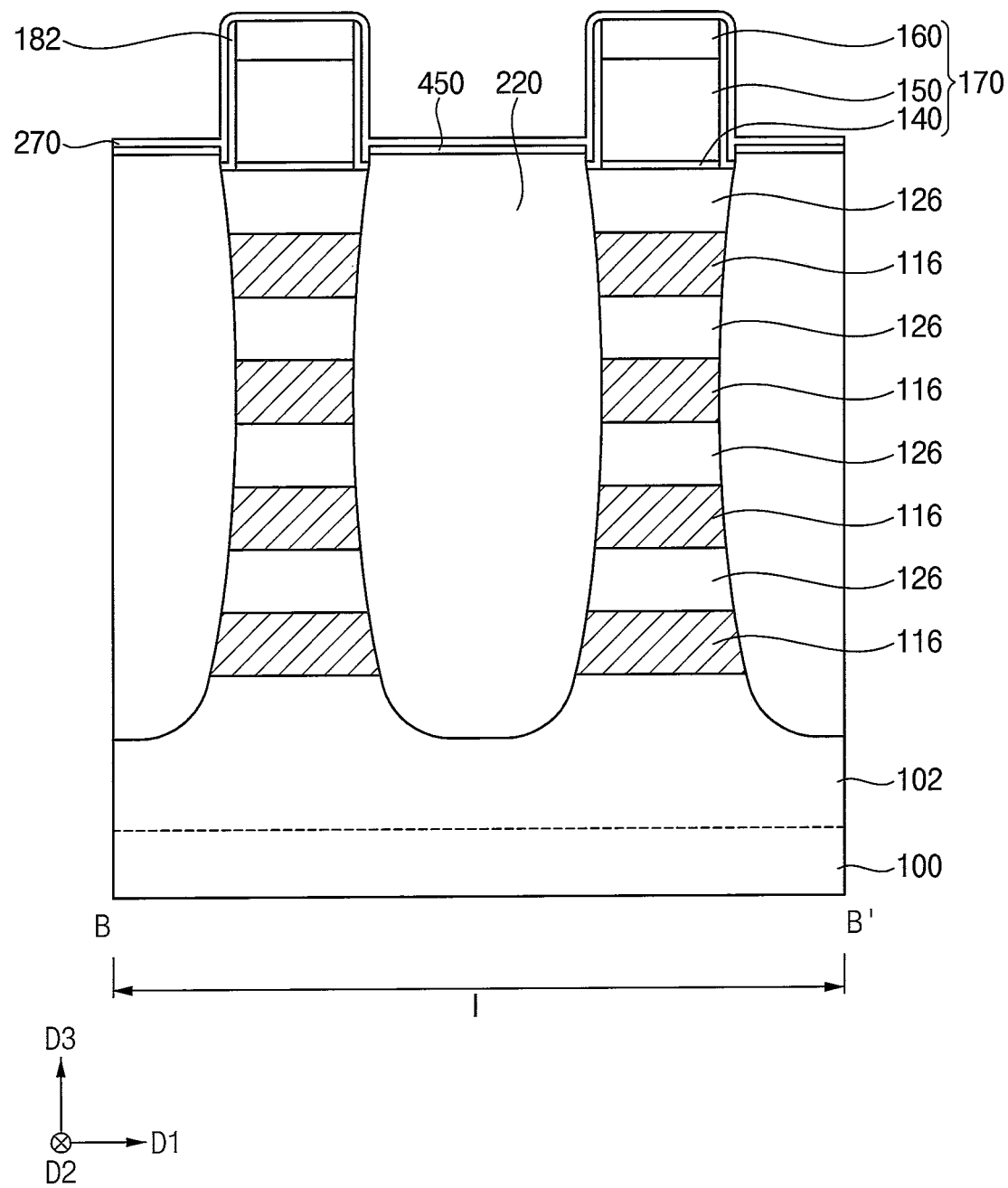
Figure 58:
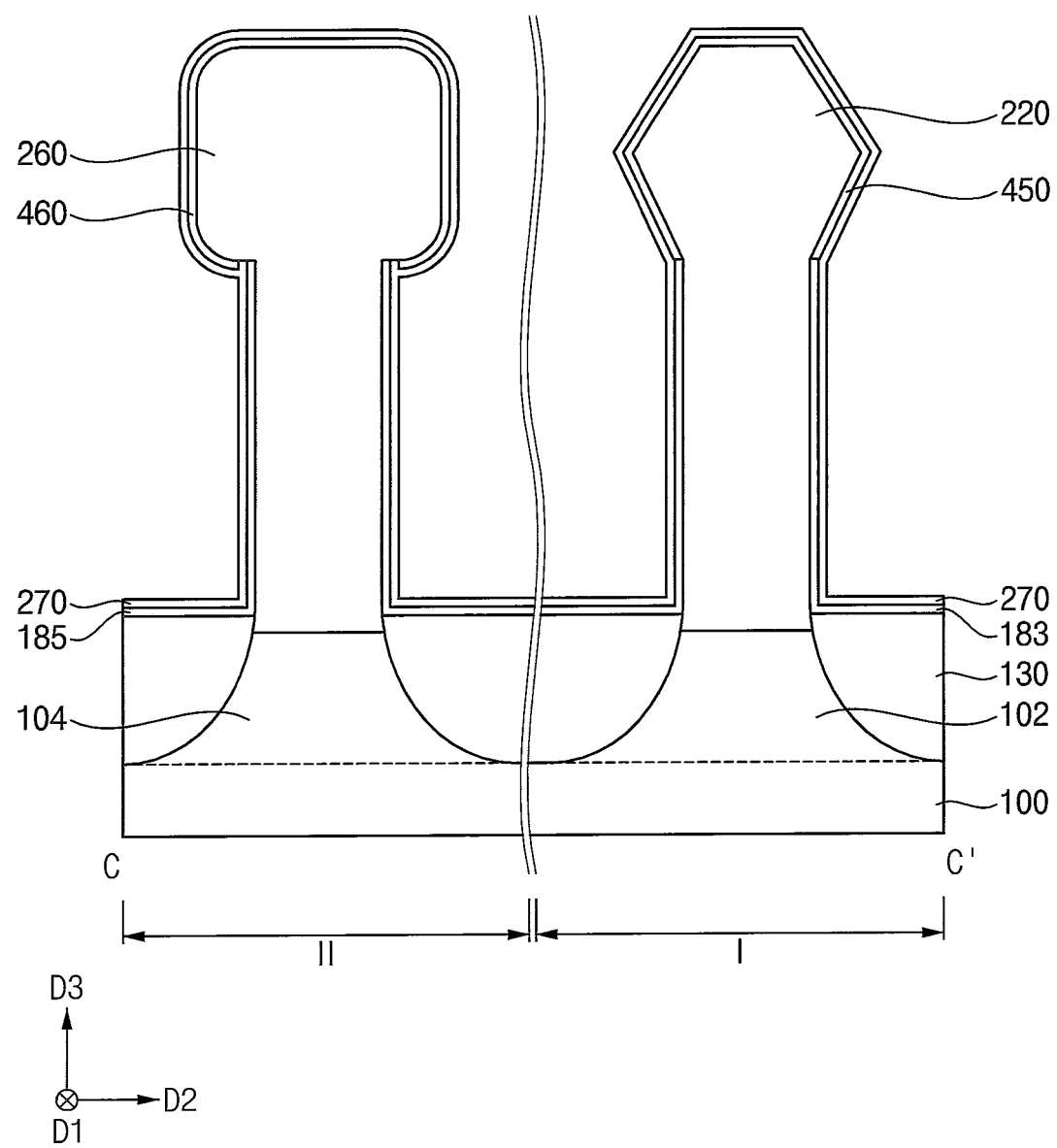
Figure 59:
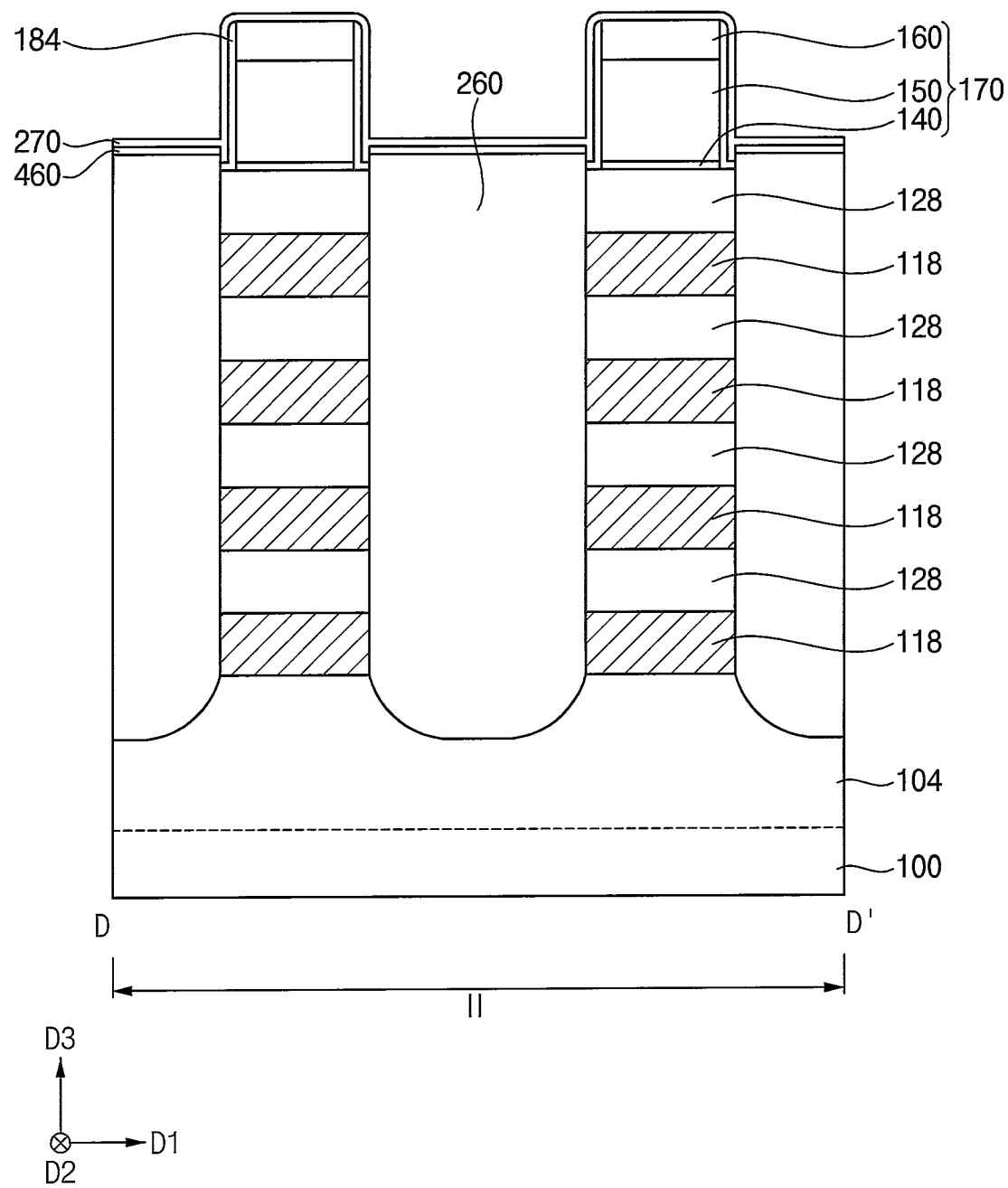

Referring to FIGS. 57 to 59, processes substantially the same as or similar to those illustrated with reference to FIGS. 21 to 23 may be performed.

The etch stop layer 270 may be formed on the dummy gate structure 170, the first gate spacer 182, the first fin spacer 183 and the first capping layer 450 on the first region I of the substrate 100 and may be formed on the dummy gate structure 170, the second gate spacer 184, the second fin spacer 185 and the second capping layer 460 on the second region II of the substrate 100.

Figure 60:
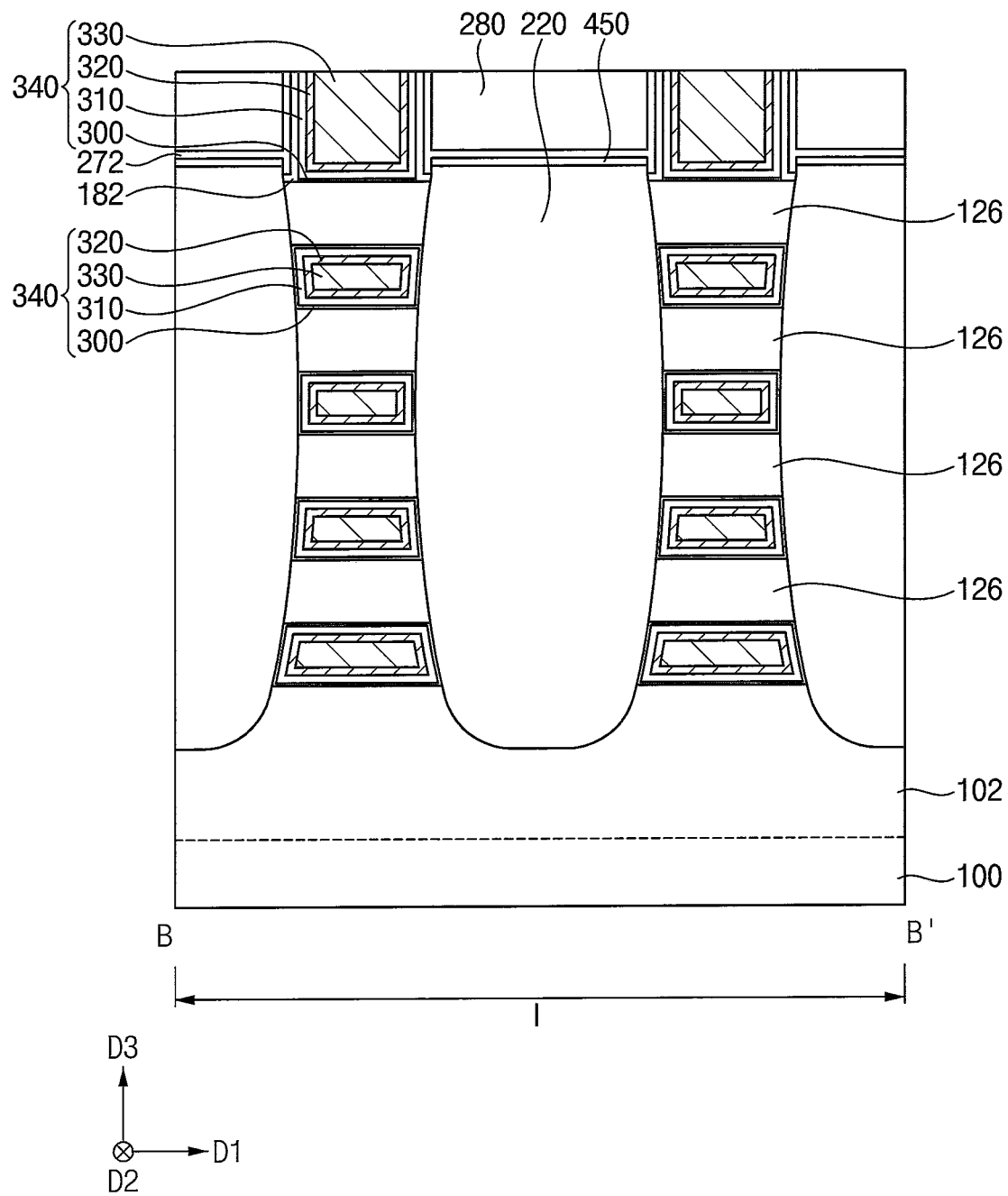
Figure 61:
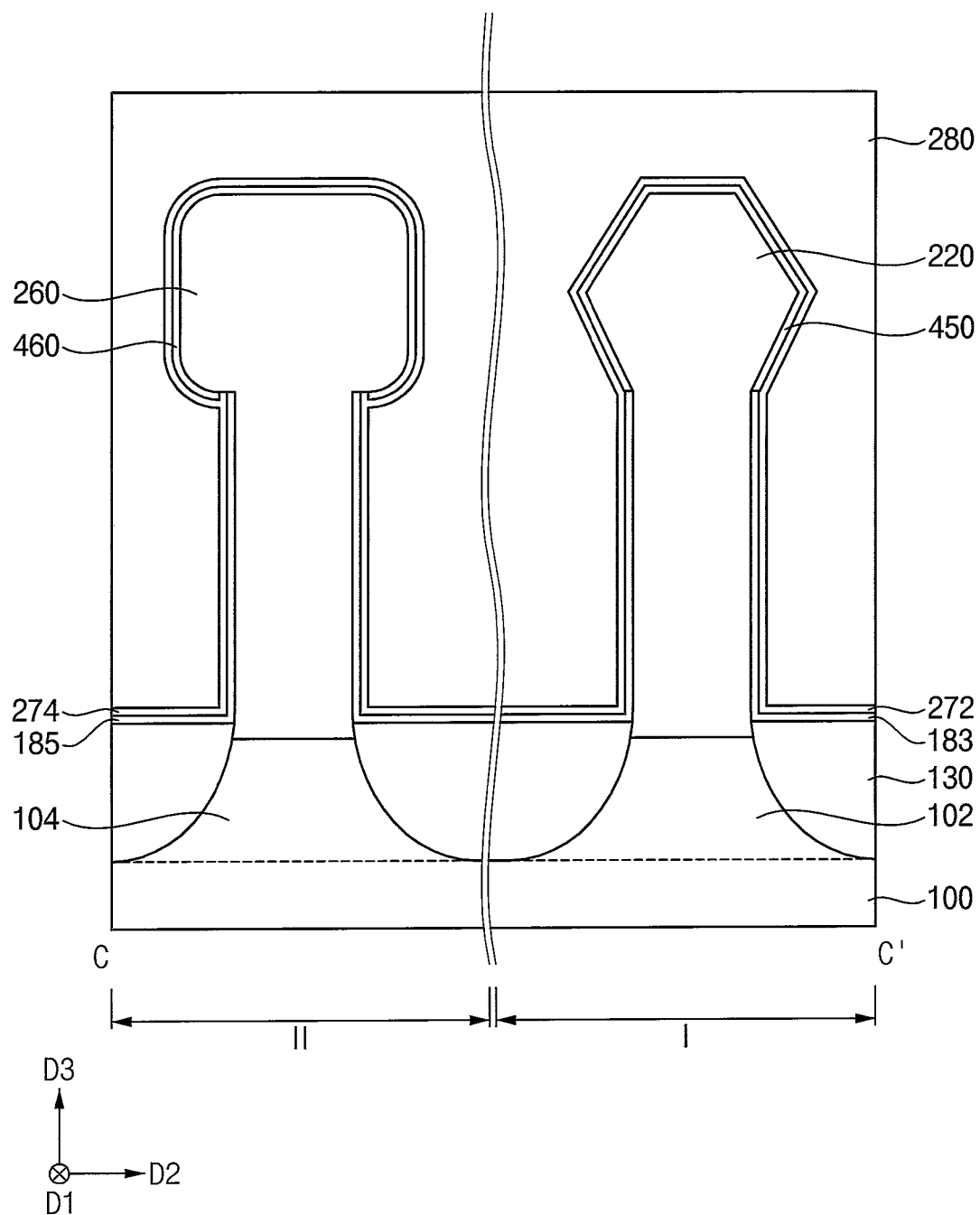
Figure 62:
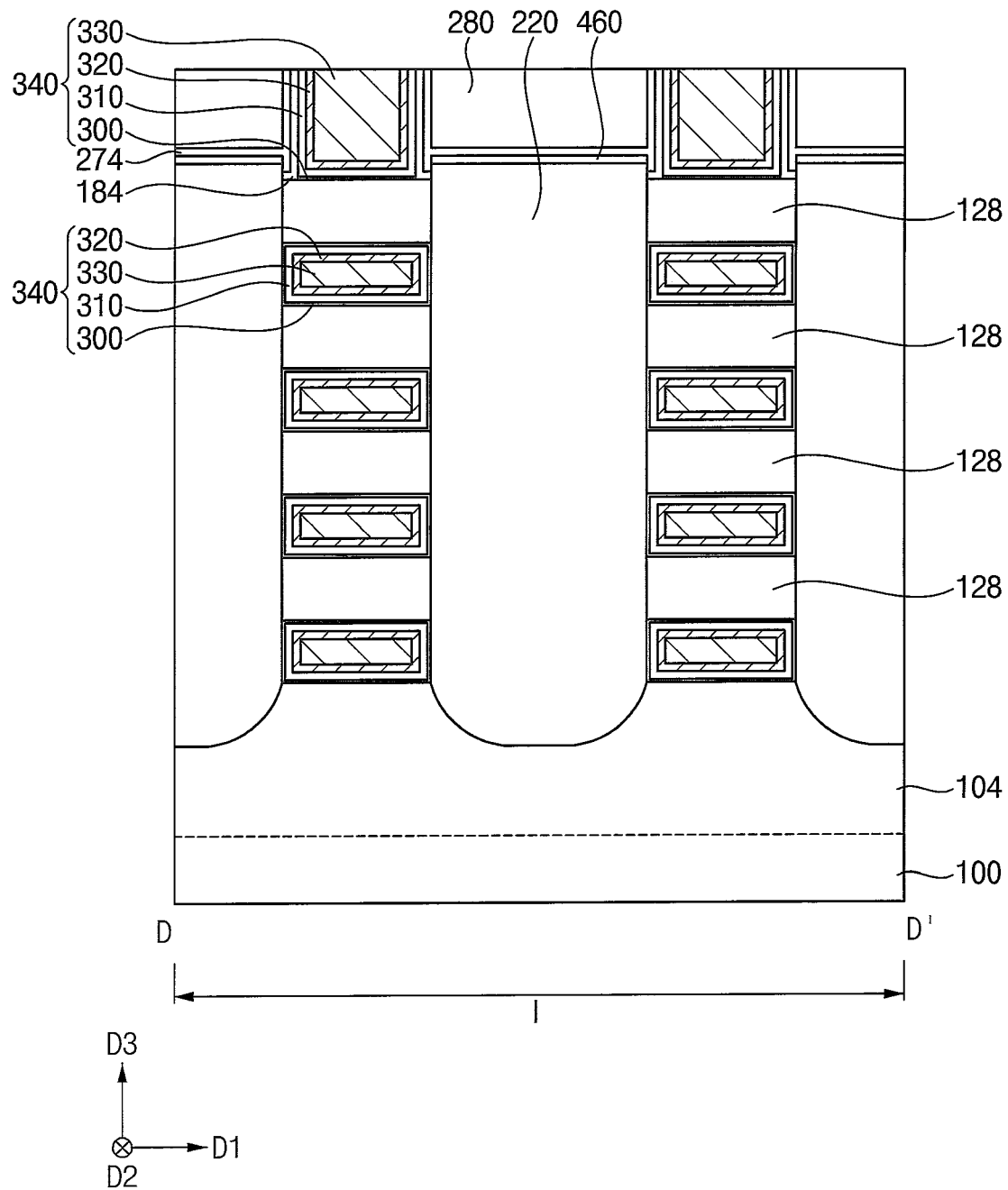

Referring to FIGS. 60 to 62, processes substantially the same as or similar to those illustrated with reference to FIGS. 24 to 29 may be performed to complete the fabrication of the semiconductor device.

As illustrated above, the first and second capping layers 450 and 460 covering the first and second source/drain layers 220 and 260 may be formed by the selective deposition processes, and thus the first and second source/drain layers 220 and 260 may be protected.

The semiconductor device manufactured by the above processes may have the following characteristics:

In example embodiments of the present disclosure, the first fin spacer 183 may contact a sidewall of a lower portion of the first source/drain layer 220, the second fin spacer 185 may contact a sidewall of a lower portion of the second source/drain layer 260, the first capping layer 450 may contact a sidewall and an upper surface of an upper portion of the first source/drain layer 220, and the second capping layer 460 may contact a sidewall and an upper surface of an upper portion of the second source/drain layer 260.

In example embodiments of the present disclosure, the first etch stop pattern 272 may be formed on the first fin spacer 183 and the first capping layer 450, and the second etch stop pattern 274 may be formed on the second fin spacer 185 and the second capping layer 460.

In example embodiments of the present disclosure, an uppermost surface of the first fin spacer 183 and an uppermost surface of the first capping layer 450 may contact each other, and the first etch stop pattern 272 might not contact the first source/drain layer 220.

In example embodiments of the present disclosure, an uppermost surface of the second fin spacer 185 and an uppermost surface of the second capping layer 460 might not contact each other, and the second etch stop pattern 274 may partially contact the second source/drain layer 260.

In example embodiments of the present disclosure, the first etch stop pattern 272 may cover a sidewall of the first gate spacer 182, and the second etch stop pattern 274 may cover a sidewall of the second gate spacer 184.

The semiconductor device may be used in various types of memory devices and/or systems including transistors having source/drain layers. For example, the semiconductor device may be applied to a logic device such as a central processing unit (CPU), an application processor (AP), etc. Alternatively, the semiconductor device may be applied to a volatile memory device such as a DRAM device, an SRAM device, etc., or to a non-volatile memory device such as a flash memory device, a PRAM device, an MRAM device, an RRAM device, etc.

The foregoing is illustrative of example embodiments of the present disclosure and is not to be construed as necessarily limiting thereof. Although a few example embodiments of the present disclosure have been described, those skilled in the art will readily appreciate that many modifications are possible without materially departing from the novel teachings and aspects of the present inventive concept. Accordingly, all such modifications are intended to be included within the scope of the present inventive concept.

What is claimed is:

1. A semiconductor device, comprising:
    a plurality of first channels disposed on a first region of a substrate, the substrate including the first region and a second region, and each of the plurality of first channels being spaced apart from each other in a vertical direction that is substantially perpendicular to an upper surface of the substrate;
    a plurality of second channels disposed on the second region of the substrate and spaced apart from each other in the vertical direction;
    a first gate structure disposed on the first region of the substrate, the first gate structure covering at least a portion of each of the plurality of first channels;
    a second gate structure disposed on the second region of the substrate, the second gate structure covering at least a portion of each of the plurality of second channels;
    a first source/drain layer disposed on a portion of the first region of the substrate that is adjacent to the first gate structure, the first source/drain layer directly contacting the plurality of first channels;
    a second source/drain layer disposed on a portion of the second region of the substrate that is adjacent to the second gate structure, the second source/drain layer directly contacting the plurality of second channels;
    a first fin spacer directly contacting a sidewall and an upper surface of the first source/drain layer;
    a second fin spacer directly contacting a sidewall and an upper surface of the second source/drain layer;
    a first etch stop pattern disposed on the first fin spacer, the first etch stop pattern not directly contacting the first source/drain layer; and
    a second etch stop pattern disposed on the second fin spacer, the second etch stop pattern not directly contacting the second source/drain layer,
    wherein an upper portion of the first source/drain layer has a first cross-section having a shape of a pentagon or a hexagon, and an upper portion of the second source/drain layer has a second cross-section having a shape of a rectangle with rounded corners, and
    wherein each of the first and second fin spacers includes a low-k dielectric material, and each of the first and second etch stop patterns includes silicon nitride.

2. The semiconductor device of claim 1, wherein each of the first and second fin spacers includes silicon oxycarbonitride, silicon oxynitride, and/or silicon carbonitride.

3. The semiconductor device of claim 1, wherein the first source/drain layer includes a semiconductor material doped with p-type impurities, and the second source/drain layer includes a semiconductor material doped with n-type impurities.

4. The semiconductor device of claim 1, further comprising:
    a first active pattern disposed on the first region of the substrate and extending in a first direction substantially parallel to the upper surface of the substrate;
    a second active pattern disposed on the second region of the substrate and extending in the first direction; and
    an isolation pattern disposed on the substrate, the isolation pattern covering sidewalls of the first and second active patterns,
    wherein each of the plurality of first channels and the first source/drain layer are formed on the first active pattern, and each of the plurality of second channels and the second source/drain layer are formed on the second active pattern.

5. The semiconductor device of claim 4, wherein the first fin spacer covers an upper surface of the first source/drain layer and opposite sidewalls of the first source/drain layer in a second direction substantially parallel to the upper surface of the substrate and crossing the first direction, and contacts an upper surface of a portion of the isolation pattern adjacent to the first source/drain layer in the second direction, and
    wherein the second fin spacer covers an upper surface of the second source/drain layer and opposite sidewalls of the second source/drain layer in the second direction, and contacts an upper surface of a portion of the isolation pattern adjacent to the second source/drain layer in the second direction.

6. The semiconductor device of claim 4, wherein the first gate structure extends on the first active pattern and the isolation pattern in a second direction substantially parallel to the upper surface of the substrate and crossing the first direction, and the second gate structure extends on the second active pattern and the isolation pattern in the second direction, and
    wherein the semiconductor device further comprises:
        a first gate spacer covering each of a pair of opposite sidewalls in the first direction of the first gate structure; and
        a second gate spacer covering each of a pair of opposite sidewalls in the first direction of the second gate structure.

7. The semiconductor device of claim 6, wherein the first gate spacer includes a same material as the first fin spacer and is connected thereto, and the second gate spacer includes a same material as the second fin spacer and is connected thereto.

8. The semiconductor device of claim 6, wherein a portion of the first gate spacer overlapping the first source/drain layer in the first direction has a lowermost surface that is lower than an uppermost surface of the first source/drain layer, and a portion of the second gate spacer overlapping the second source/drain layer in the first direction has a lowermost surface that is lower than an uppermost surface of the second source/drain layer.

9. The semiconductor device of claim 6, wherein the first etch stop pattern covers a sidewall of the first gate spacer, and the second etch stop pattern covers a sidewall of the second gate spacer.

10. The semiconductor device of claim 1, wherein the semiconductor device further comprises:
  a first gate spacer covering at least a portion of each of a pair of opposite sidewalls of the first gate structure; and
  a second gate spacer covering at least a portion of each of a pair of opposite sidewalls of the second gate structure,
  wherein the first gate spacer is integral with the first fin spacer, and the second gate spacer is integral with the second fin spacer.

* * * * *